(12) United States Patent
Kodama

(10) Patent No.: US 8,252,508 B2
(45) Date of Patent: Aug. 28, 2012

(54) POSITIVE PHOTOSENSITIVE COMPOSITION AND METHOD OF FORMING RESIST PATTERN

(75) Inventor: Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 19 days.

(21) Appl. No.: 12/819,490

(22) Filed: Jun. 21, 2010

(65) Prior Publication Data

US 2010/0261117 A1    Oct. 14, 2010

Related U.S. Application Data

(63) Continuation of application No. 10/895,824, filed on Jul. 22, 2004, now Pat. No. 7,867,697.

(30) Foreign Application Priority Data

Jul. 24, 2003    (JP) .................................. 2003-278995

(51) Int. Cl.
    *G03F 7/004* (2006.01)
(52) U.S. Cl. ...................... 430/270.1; 430/907; 430/910
(58) Field of Classification Search ............... 430/270.1, 430/907, 910
    See application file for complete search history.

(56) References Cited

U.S. PATENT DOCUMENTS

| | | | |
|---|---|---|---|
| 5,679,495 | A | 10/1997 | Yamachika et al. |
| 6,348,297 | B1 | 2/2002 | Uetani et al. |
| 6,627,382 | B2 | 9/2003 | Kim |
| 6,730,451 | B2 | 5/2004 | Hatakeyama et al. |
| 6,806,026 | B2 | 10/2004 | Allen et al. |
| 2001/0018162 | A1 | 8/2001 | Hatakeyama et al. |
| 2002/0009668 | A1 | 1/2002 | Nishimura et al. |
| 2002/0051936 | A1 | 5/2002 | Harada et al. |
| 2002/0058198 | A1 | 5/2002 | Klauck-Jacobs et al. |
| 2003/0082477 | A1 | 5/2003 | Szmanda et al. |
| 2003/0134225 | A1 | 7/2003 | Fujimori et al. |
| 2004/0009429 | A1 | 1/2004 | Sato |
| 2004/0029035 | A1 | 2/2004 | Kishimura et al. |
| 2004/0152009 | A1 | 8/2004 | Yamaguchi et al. |
| 2004/0197708 | A1 | 10/2004 | Kodanna |

FOREIGN PATENT DOCUMENTS

| | | |
|---|---|---|
| EP | 1 126 322 A2 | 8/2001 |
| EP | 1 319 981 A2 | 6/2003 |
| EP | 1324133 A1 | 7/2003 |
| EP | 1 353 225 A2 | 10/2003 |
| EP | 1 376 230 A1 | 1/2004 |
| EP | 1 376 232 A1 | 1/2004 |
| EP | 1 406 122 A2 | 4/2004 |
| EP | 1 413 927 A1 | 4/2004 |
| EP | 1 449 860 A1 | 8/2004 |
| EP | 1 462 858 A1 | 9/2004 |
| EP | 1 480 079 A2 | 11/2004 |
| JP | 2000-321774 A | 11/2000 |
| JP | 2001-296662 A | 10/2001 |
| JP | 2001-350265 | 12/2001 |
| JP | 2002-72484 A | 3/2002 |
| JP | 2002-90997 A | 3/2002 |
| JP | 2002-91001 A | 3/2002 |
| JP | 2002-525683 T | 8/2002 |
| JP | 2003-140331 A | 5/2003 |
| JP | 2003-167333 A | 6/2003 |
| WO | 00/17712 A1 | 3/2000 |
| WO | 02/073316 A1 | 9/2002 |
| WO | 03/007080 A1 | 1/2003 |
| WO | 03/031487 A1 | 4/2003 |
| WO | 2004/014964 A2 | 2/2004 |

OTHER PUBLICATIONS

Chemical Abstract DN 134:214846 for Brodsky et al., J. Vacuum Sci. Tech, B, (2000) 18 (6) 3396.
European Search Report dated Mar. 8, 2005.
Outlook for 157-nm resist design, R.R. Kunz, et al., Lincoln Laboratory, Massachusetts Institute of Technology, Part of the SPIE Conference on advances in Resist Technology and Processing XVI, Proceedings of SPIE, vol. 3678.
Design Strategies for 157 nm Single-Layer Photoresists: Lithographic Evaluation of a Poly (a-trifluoromethyl vinyl alcohol) Copolymer, Dirk Schmaljohann, et al., Department of Materials Science and Engineering, Cornell University, Advances in Resist Technology and Processing XVII, Proceedings of SPIE, vol. 3999.
New Materials for 157 nm Photoresists: Characterization and Properties, Michael K. Crawford, et al., Advances in Resist Technology and Processing XVII, Proceedings of SPIE, vol. 3999.
Polymers for 157 nm Photoresist Compositions: A Progress Report, Kyle Patterson, et al. in Advances in Resist Technology and Processing XVII, Proceedings of SPIE, vol. 3999.

*Primary Examiner* — John Chu
(74) *Attorney, Agent, or Firm* — Sughrue Mion, PLLC

(57) ABSTRACT

A positive photosensitive composition comprises: (A) 5 to 20 parts by weight of the total amount of at least one compound that generates an acid upon irradiation with an actinic ray; and (B) 100 parts by weight of the total amount of at least one fluorine atom-containing resin having a group that increases a solubility of the resin in an alkaline developer by the action of an acid.

16 Claims, 1 Drawing Sheet

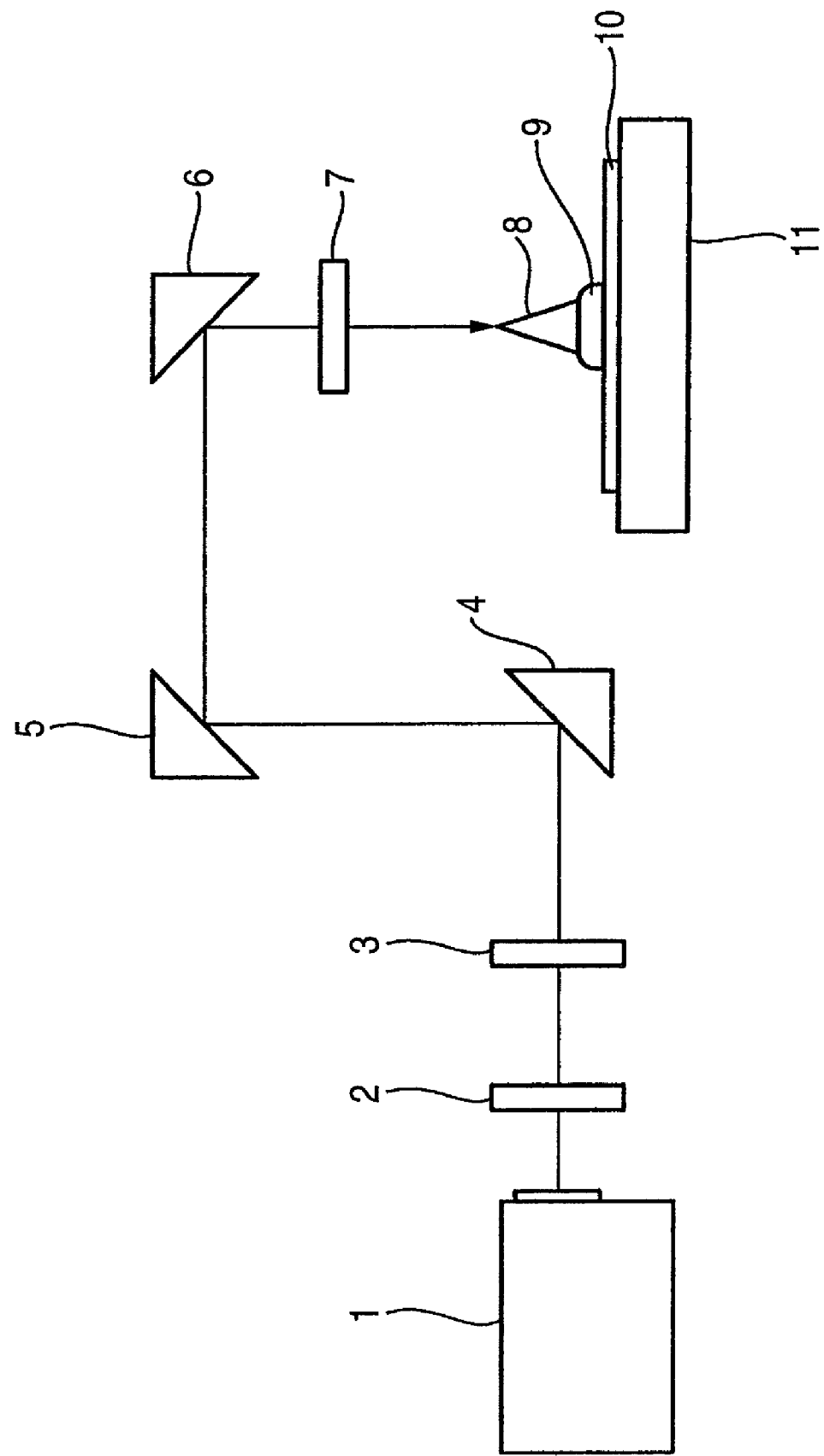

POSITIVE PHOTOSENSITIVE COMPOSITION AND METHOD OF FORMING RESIST PATTERN

This is a continuation of application Ser. No. 10/895,824 filed Jul. 22, 2004. The entire disclosure of the prior application, application Ser. No. 10/895,824, is hereby incorporated by reference.

BACKGROUND OF THE INVENTION

1. Field of the Invention

The present invention relates to a positive photosensitive composition suitable for use in microlithography processes such as the production of ULSIs or high-capacity microchips and in other photofabrication processes. More particularly, the invention relates to a positive photosensitive composition capable of forming a high-resolution pattern with a vacuum ultraviolet light having a wavelength of 193 nm or shorter.

2. Description of the Related Art

The degree of integration in integrated circuits is increasing more and more, and it has become necessary to form an ultrafine pattern having a line width of a quarter micrometer or smaller in the production of semiconductor substrates for ULSIs or the like. One of the known techniques for enhancing the fineness of such patterns is to use an exposure light having a shorter wavelength in resist pattern formation.

For example, in the production of semiconductor elements having an integration degree of up to 64 megabits, the i-line (365 nm) from a high-pressure mercury lamp has hitherto been used as an exposure light. Many compositions comprising a novolak resin and a naphthoquinonediazide compound as a photosensitive substance have been developed as positive resists for use with the exposure light, and have given sufficient results in forming patterns having line widths down to about 0.3 μm. On the other hand, in the production of semiconductor elements having an integration degree of 256 megabits or higher, KrF excimer laser light (248 nm) has been used as an exposure light in place of the i-line.

Furthermore, use of ArF excimer laser light (193 nm), which is an exposure light having an even shorter wavelength, and use of $F_2$ excimer laser light (157 nm) for forming a pattern having a line width of 0.1 μm or smaller are recently being investigated for the purpose of producing semiconductor elements having an integration degree of 1 gigabit or higher.

With the use of such exposure lights having shorter wavelengths, the components of resist materials and the structures of compounds for use therein are changing considerably. For example, the related-art resists comprising a novolak resin and a naphthoquinonediazide compound have had the following problem. Since these resists show considerable absorption in a far ultraviolet region including 248 nm, the light is less apt to sufficiently reach the resist bottom. As a result, the resists have low sensitivity and give tapered patterns only.

In order to eliminate such problems, a so-called chemical amplification type resist has been developed. This resist is a composition which comprises a combination of: a resin, as the main component, which has a poly(hydroxystyrene) backbone showing reduced absorption in a 248 nm region and is protected by acid-dissociable groups; and a compound which generates an acid upon irradiation with far ultraviolet light (photo-acid generator). The chemical amplification type resist changes in solubility in a developing solution based on a decomposition reaction catalyzed by the acid generated in exposed areas, and can hence show high sensitivity and give high-resolution patterns.

However, in the case of using ArF excimer laser light (193 nm), even the chemical amplification type resist has been unable to have sufficient performances because compounds having aromatic groups intrinsically show considerable absorption in a wavelength region including 193 nm.

An improvement in the chemical amplification type resist has been attempted in order to overcome that problem. In this improvement, an acid-decomposable resin which has, incorporated in the polymer main chain or side chains thereof, alicyclic structures showing no absorption at 193 nm is used in place of the acid-decomposable resin comprising poly(hydroxystyrene) as the backbone.

However, it has been found that when $F_2$ excimer laser light (157 nm) is used, even the alicyclic resin is insufficient in obtaining a desired pattern of 0.1 μm or finer because the resin shows considerable absorption in a 157 nm region. Under these circumstances, a resin having fluorine atoms (perfluorinated structure) incorporated therein was reported to have sufficient transparency at 157 nm, in *Proc. SPIE.*, Vol. 3678, p. 13 (1999). Effective structures of such fluororesins are proposed in *Proc. SPIE.*, Vol. 3999, p. 330 (2000), *Proc. SPIE.*, Vol. 3999, p. 357 (2000), *Proc. SPIE.*, Vol. 3999, p. 365 (2000), WO-00/17712, German Patent 1,005,466, Published U.S. Patent Application No. 2001/0,018,162 A2, etc.

However, the related-art resists containing a fluororesin have been desired to be further improved in sensitivity, line edge roughness diminution, and profile.

SUMMARY OF THE INVENTION

Accordingly, an object of the invention is to provide a positive photosensitive composition which has high sensitivity when far ultraviolet light having a wavelength of 250 nm or shorter, in particular, ArF excimer laser light or $F_2$ excimer laser light, is used as an exposure light and which is excellent in line edge roughness diminution and profile.

The invention has the following constitutions, with which that object of the invention is accomplished.

(1) A positive photosensitive composition comprising:

(A) 5 to 20 parts by weight of the total amount of at least one compound that generates an acid upon irradiation with an actinic ray; and (B) 100 parts by weight of the total amount of at least one fluorine atom-containing resin having a group that increases a solubility of the resin in an alkaline developer by the action of an acid.

(2) The positive photosensitive composition as described in (1) above, wherein the resin (B) has a main chain to which at least one fluorine atom is bonded.

Preferred embodiments of the invention are further shown below.

(3) The positive photosensitive composition as described in (1) above, wherein the resin (B) has a repeating unit having from 1 to 3 groups represented by formula (A-1):

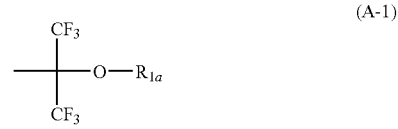

wherein $R_{1a}$ represents a hydrogen atom, an alkyl group, a cycloalkyl group, an acyl group, an alkoxycarbonyl group, or a group which dissociates by the action of an acid.

(4) The positive photosensitive composition as described in (1) above, wherein the resin (B) has a fluorine atom-containing repeating unit and a repeating unit with no fluorine atom.

(5) The positive photosensitive composition as described in (4) above, wherein the repeating unit with no fluorine atom is at least one repeating unit selected from (a) to (c):
  (a) monocyclic or polycyclic, alicyclic hydrocarbon structure-having, acid-dissociating repeating unit;
  (b) lactone structure-having repeating unit;
  (c) monocyclic or polycyclic, alicyclic hydrocarbon structure and hydroxyl group-having repeating unit.

(6) The positive photosensitive composition as described in any of (1) to (5) above, wherein the compound (A) is a sulfonium salt.

(7) The positive photosensitive composition as described in any of (1) to (5) above, wherein the compound (A) is a sulfonium salt of a fluorine-substituted aliphatic sulfonic acid having 4 to 8 carbon atoms.

(8) A method of forming a resist pattern comprising: coating the positive photosensitive composition described in any of (1) to (7) above on a substrate, to form a resultant coating; irradiating the resultant coating with an actinic ray, to form an irradiated coating; and developing the irradiated coating.

BRIEF DESCRIPTION OF THE DRAWINGS

FIG. 1 is a schematic view showing a two-beam interference exposure experimental apparatus.

DETAILED DESCRIPTION OF THE INVENTION

The invention will be explained below in detail.

With respect to expressions of groups (atomic groups) in this specification, the expressions which include no statement as to whether the groups are substituted or unsubstituted imply both of groups having no substituents and groups having one or more substituents. For example, the term "alkyl group" implies not only an alkyl group having no substituents (unsubstituted alkyl group) but also an alkyl group having one or more substituents (substituted alkyl group).

The positive photosensitive composition of the invention comprises (A) 5 to 20 parts by weight of the total amount of at least one compound that generates an acid upon irradiation with an actinic ray; and (B) 100 parts by weight of the total amount of at least one fluorine atom-containing resin having a group that increases a solubility of the resin in an alkaline developer by the action of an acid (a group that dissociate by the action of an acid to enhance solubility in an alkaline developer).

[1] (A) Compound Generating Acid Upon Irradiation with Actinic Ray

The compound which generates an acid upon irradiation with an actinic ray (photo-acid generator) to be used in the invention can be one suitably selected from photoinitiators for cationic photopolymerization, photoinitiators for radical photopolymerization, photodecolorants or optical color changers for dyes, known compounds used in microresist formation or the like which generate an acid upon irradiation with an actinic ray, e.g., a radiation, or far ultraviolet light having a wavelength of preferably 250 nm or shorter, more preferably 220 nm or shorter, such as KrF, ArF, or $F_2$ excimer laser light, X-rays, or electron beams, and mixtures of two or more thereof.

Examples thereof include diazonium salts, phosphonium salts, sulfonium salts, iodonium salts, imidesulfonates, oximesulfonates, diazodisulfones, disulfones, and o-nitrobenzyl sulfonates.

Also usable are compounds obtained by incorporating any of those groups or compounds which generate an acid upon irradiation with an actinic ray into the main chain or side chains of a polymer. Examples thereof are given in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are those compounds generating an acid by the action of light which are described in U.S. Pat. No. 3,779,778 and European Patent 126,712.

Preferred examples of the compound which generates an acid upon irradiation with an actinic ray include compounds represented by the following general formulae (ZI), (ZII), and (ZIII).

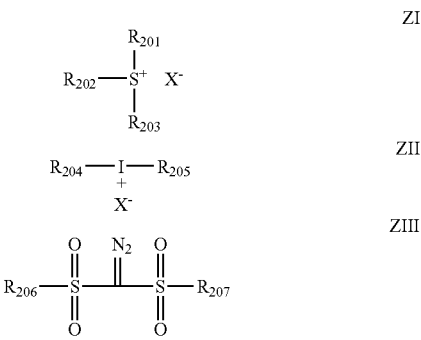

In general formula (ZI), $R_{201}$, $R_{202}$, and $R_{203}$ each independently represent an organic group.

$X^-$ represents a non-nucleophilic anion.

The organic groups represented by $R_{201}$, $R_{202}$, and $R_{203}$ each have generally 1 to 30, preferably 1 to 20 carbon atoms.

Two of $R_{201}$ to $R_{203}$ may be bonded to each other to form a ring structure, which may contain an oxygen atom, sulfur atom, ester bond, amide bond, or carbonyl group therein.

Examples of the group formed by the bonding of two of $R_{201}$ to $R_{203}$ include alkylene groups (e.g., butylene and pentylene).

Specific examples of the organic groups represented by $R_{201}$, $R_{202}$, and $R_{203}$ include the corresponding groups in the compounds (Z1-1), (Z1-2), and (Z1-3) which will be described later.

A compound having two or more structures represented by general formula (ZI) may also be used. For example, use may be made of a compound having a structure in which at least one of the $R_{201}$ to $R_{203}$ of a compound represented by general formula (ZI) is bonded to at least one of the $R_{201}$ to $R_{203}$ of another compound represented by general formula (ZI).

More preferred examples of ingredient (ZI) include the compounds (Z1-1), (Z1-2), and (Z1-3) which will be explained below.

Compound (Z1-1) is an arylsulfonium compound represented by general formula (ZI) wherein at least one of $R_{201}$ to $R_{203}$ is an aryl group, i.e., a compound including an arylsulfonium as a cation.

The arylsulfonium compound may be one in which all of $R_{201}$ to $R_{203}$ are aryl groups, or may be one in which part of $R_{201}$ to $R_{203}$ is an aryl group and the remainder is an alkyl or cycloalkyl group.

Examples of the arylsulfonium compound include triarylsulfonium compounds, diarylalkyl- or diarylcycloalkylsulfonium compounds, and aryldialkyl- or aryldicycloalkylsulfonium compounds.

The aryl group of the arylsulfonium compound preferably is phenyl or naphthyl, and more preferably is phenyl. In the case where the arylsulfonium compound has two or more aryl groups, these aryl groups may be the same or different.

The alkyl group which is optionally possessed by the arylsulfonium compound preferably is a linear or branched alkyl group having 1 to 15 carbon atoms. Examples thereof include methyl, ethyl, propyl, n-butyl, sec-butyl, and t-butyl.

The cycloalkyl group which is optionally possessed by the arylsulfonium compound preferably is a cycloalkyl group having 3 to 15 carbon atoms. Examples thereof include cyclopropyl, cyclobutyl, and cyclohexyl.

The aryl, alkyl, and cycloalkyl groups represented by $R_{201}$ to $R_{203}$ may have substituents selected from alkyl groups (e.g., ones having 1 to 15 carbon atoms), cycloalkyl groups (e.g., ones having 3 to 15 carbon atoms), aryl groups (e.g., ones having 6 to 14 carbon atoms), alkoxy groups (e.g., ones having 1 to 15 carbon atoms), halogen atoms, hydroxyl, and phenylthio. Preferred examples of the substituents are alkyl groups having 1 to 12 carbon atoms, cycloalkyl groups having 3 to 12 carbon atoms, and alkoxy groups having 1 to 12 carbon atoms. Most preferred are alkyl groups having 1 to 4 carbon atoms and alkoxy groups having 1 to 4 carbon atoms. One or more of such substituents may be bonded to any one of $R_{201}$ to $R_{203}$ or to each of $R_{201}$ to $R_{203}$. In the case where $R_{201}$ to $R_{203}$ are aryl groups, it is preferred that a substituent be bonded to the p-position in each aryl group.

Examples of the non-nucleophilic anion represented by $X^-$ include a sulfonic acid anion, carboxylic acid anion, sulfonylimide anion, bis(alkylsulfonyl)imide anion, and tris(alkylsulfonyl)methyl anion.

A non-nucleophilic anion is an anion the ability of which to cause a nucleophilic reaction is exceedingly low and which can be inhibited from being decomposed by an intramolecular nucleophilic reaction with the lapse of time. This anion improves the long-term stability of resists.

Examples of the sulfonic acid anion include aliphatic sulfonic acid anions, aromatic sulfonic acid anions, and a camphorsulfonic acid anion.

Examples of the carboxylic acid anion include aliphatic carboxylic acid anions, aromatic carboxylic acid anions, and aralkylcarboxylic acid anions.

Examples of the aliphatic hydrocarbon groups in the aliphatic sulfonic acid anions include alkyl groups preferably having 1 to 30 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl, and cycloalkyl groups preferably having 3 to 30 carbon atoms, such as cyclopropyl, cyclopentyl, cyclohexyl, adamantyl, norbornyl, and bornyl.

Examples of the aromatic groups in the aromatic sulfonic acid anions include aryl groups preferably having 6 to 14 carbon atoms, such as phenyl, tolyl, and naphthyl.

The alkyl, cycloalkyl, and aryl groups in the aliphatic sulfonic acid anions and aromatic sulfonic acid anions may have substituents.

Examples of the substituents include halogen atoms, alkyl groups, alkoxy groups, and alkylthio groups.

Examples of the halogen atoms include chlorine, bromine, fluorine, and iodine atoms.

Examples of the alkyl groups include alkyl groups preferably having 1 to 15 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl.

Examples of the alkoxy groups include alkoxy groups preferably having 1 to 5 carbon atoms, such as methoxy, ethoxy, propoxy, and butoxy.

Examples of the alkylthio groups include alkylthio groups preferably having 1 to 15 carbon atoms, such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecyltio, hexadecylthio, heptadecylthio, octadecylthio, nonadecylthio, and eicosylthio. The alkyl, alkoxy, and alkylthio groups may be further substituted with halogen atoms (preferably fluorine atoms).

Examples of the aliphatic hydrocarbon groups in the aliphatic carboxylic acid anions include the same aliphatic hydrocarbon groups as in the aliphatic sulfonic acid anions.

Examples of the aromatic groups in the aromatic carboxylic acid anions include the same aromatic groups as in the aromatic sulfonic acid anions.

Examples of the aralkyl groups in the aralkylcarboxylic acid anions include aralkyl groups preferably having 6 to 12 carbon atoms, such as benzyl, phenethyl, naphthylmethyl, naphthylethyl, and naphthylbutyl.

The alkyl, cycloalkyl, aryl, and aralkyl groups in the aliphatic carboxylic acid anions, aromatic carboxylic acid anions, and aralkylcarboxylic acid anions may have substituents. Examples of the substituents include the same halogen atoms, alkyl groups, alkoxy groups, and alkylthio groups as in the aliphatic sulfonic acid anions and aromatic sulfonic acid anions.

Examples of the sulfonylimide anion include a saccharin anion.

The alkyl groups in the bis(alkylsulfonyl)imide anion and tris(alkylsulfonyl)methyl anion preferably are alkyl groups having 1 to 5 carbon atoms. Examples thereof include methyl, ethyl, propyl, isopropyl, n-butyl, isobutyl, sec-butyl, pentyl, and neopentyl. These alkyl groups may have substituents. Examples of the substituents include halogen atoms, alkyl groups substituted with one or more halogen atoms, alkoxy groups, and alkylthio groups. Preferred are alkyl groups substituted with one or more fluorine atoms.

Other examples of the non-nucleophilic anion include phosphorus fluoride, boron fluoride, and antimony fluoride.

The non-nucleophilic anion represented by $X^-$ preferably is an aliphatic sulfonic acid anion substituted with one or more fluorine atoms, an aromatic sulfonic acid anion substituted with one or more fluorine atoms or fluorinated groups, a bis(alkylsulfonyl)imide anion in which the alkyl groups are substituted with one or more fluorine atoms, or a tris(alkylsulfonyl)methyl anion in which the alkyl groups are substituted with one or more fluorine atoms. The non-nucleophilic anion represented by $X^-$ more preferably is a fluorine-substituted aliphatic sulfonic acid anion having 4 to 8 carbon atoms, and especially preferably is a nonafluorobutanesulfonic acid anion or perfluorooctanesulfonic acid anion.

Next, compound (Z1-2) will be explained.

Compound (Z1-2) is a compound represented by formula (ZI) wherein $R_{201}$ to $R_{203}$ each independently represent an organic group containing no aromatic ring. The term aromatic ring herein implies any of aromatic rings including ones containing one or more heteroatoms.

The organic groups containing no aromatic ring which are represented by $R_{201}$ to $R_{203}$ each have generally 1 to 30, preferably 1 to 20 carbon atoms.

Preferably, $R_{201}$ to $R_{203}$ each independently are an aliphatic hydrocarbon group. $R_{201}$ to $R_{203}$ each more preferably are a linear, branched, or cyclic 2-oxoalkyl group or an alkoxycarbonylmethyl group, and most preferably are a linear or branched 2-oxoalkyl group.

The aliphatic hydrocarbon groups represented by $R_{201}$ to $R_{203}$ may be any of linear or branched alkyl groups and cycloalkyl groups. Preferred examples thereof include linear or branched alkyl groups having 1 to 10 carbon atoms (e.g., methyl, ethyl, propyl, butyl, and pentyl) and cycloalkyl groups having 3 to 10 carbon atoms (e.g., cyclopentyl, cyclohexyl, and norbornyl). More preferred aliphatic hydrocarbon groups are 2-oxoalkyl groups and alkoxycarbonylmethyl groups.

The 2-oxoalkyl groups may be either linear or branched or cyclic. Preferred examples thereof include the alkyl and cycloalkyl groups enumerated above which each have >C=O in the 2-position.

Examples of the alkoxy groups in the alkoxycarbonylmethyl groups include alkoxy groups preferably having 1 to 5 carbon atoms (methoxy, ethoxy, propoxy, butoxy, and pentoxy).

$R_{201}$ to $R_{203}$ may be further substituted with substituents selected from halogen atoms, alkoxy groups (e.g., ones having 1 to 5 carbon atoms), hydroxyl, cyano, and nitro.

Two of $R_{201}$ to $R_{203}$ may be bonded to each other to form a ring structure, which may contain an oxygen atom, sulfur atom, ester bond, amide bond, or carbonyl group therein. Examples of the group formed by the bonding of two of $R_{201}$ to $R_{203}$ include alkylene groups (e.g., butylene and pentylene).

Compound (Z1-3) is a compound represented by the following general formula (Z1-3). Namely, it is a compound having a phenacylsulfonium salt structure.

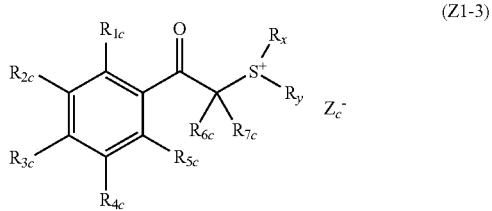

(Z1-3)

$R_{1C}$ to $R_{5C}$ each independently represent a hydrogen atom, alkyl group, cycloalkyl group, alkoxy group, or halogen atom.

$R_{6C}$ to $R_{7C}$ each represent a hydrogen atom, alkyl group, or cycloalkyl group.

$R_x$ and $R_y$ each independently represent an alkyl group, cycloalkyl group, allyl, or vinyl.

Two or more of $R_{1C}$ to $R_{5C}$ may be bonded to each other to form a ring structure, and $R_x$ and $R_y$ may be bonded to each other to form a ring structure. These ring structures may contain an oxygen atom, sulfur atom, ester bond, or amide bond.

$Zc^-$ represents a non-nucleophilic anion, which is the same as the non-nucleophilic anion $X^-$ in general formula (ZI).

The alkyl groups represented by $R_{1C}$ to $R_{7C}$ may be either linear or branched. Examples thereof include linear or branched alkyl groups having 1 to 20 carbon atoms. Preferred examples thereof include linear or branched alkyl groups having 1 to 12 carbon atoms (e.g., methyl, ethyl, linear or branched propyl, linear or branched butyl, and linear or branched pentyl).

Examples of the cycloalkyl groups represented by $R_{1C}$ to $R_{7C}$ include cycloalkyl groups having 3 to 20 carbon atoms. Preferred examples thereof include cycloalkyl groups having 3 to 8 carbon atoms (e.g., cyclopentyl and cyclohexyl).

The alkoxy groups represented by $R_{1C}$ to $R_{5C}$ may be either linear or branched or cyclic. Examples thereof include alkoxy groups having 1 to 10 carbon atoms. Preferred examples thereof include linear or branched alkoxy groups having 1 to 5 carbon atoms (e.g., methoxy, ethoxy, linear or branched propoxy, linear or branched butoxy, and linear or branched pentoxy) and cyclic alkoxy groups having 3 to 8 carbon atoms (e.g., cyclopentyloxy and cyclohexyloxy).

It is preferred that any of $R_{1C}$ to $R_{5C}$ be a linear or branched alkyl group, cycloalkyl group, or linear, branched, or cyclic alkoxy group. It is more preferred that the total number of carbon atoms in $R_{1C}$ to $R_{5C}$ be from 2 to 15. This compound has further improved solubility in solvents and is inhibited from generating particles during storage.

Examples of the alkyl groups and cycloalkyl groups represented by $R_x$ and $R_y$ include the same groups as those enumerated above as examples of the alkyl groups and cycloalkyl groups represented by $R_{1C}$ to $R_{5C}$. Preferred are 2-oxoalkyl groups and alkoxycarbonylmethyl groups.

Examples of the 2-oxoalkyl groups include those alkyl and cycloalkyl groups represented by $R_{1C}$ to $R_{7C}$ which each have >C=O in the 2-position.

Examples of the alkoxy groups in the alkoxycarbonylmethyl groups include the same groups as those enumerated above as examples of the alkoxy groups represented by $R_{1C}$ to $R_{5C}$.

Examples of the group formed by the bonding of $R_x$ and $R_y$ include butylene and pentylene.

$R_x$ and $R_y$ each preferably are an alkyl group having 4 or more carbon atoms or a cycloalkyl group, and more preferably are an alkyl group having 6 or more, especially preferably 8 or more carbon atoms or a cycloalkyl group.

In general formulae (ZII) and (ZIII), $R_{204}$ to $R_{207}$ each independently represent an aryl group, alkyl group, or cycloalkyl group.

The aryl groups represented by $R_{204}$ to $R_{207}$ preferably are phenyl or naphthyl, and more preferably are phenyl.

The alkyl groups represented by $R_{204}$ to $R_{207}$ may be either linear or branched. Preferred examples thereof include linear or branched alkyl groups having 1 to 10 carbon atoms (e.g., methyl, ethyl, propyl, butyl, and pentyl).

Preferred examples of the cycloalkyl groups represented by $R_{204}$ to $R_{207}$ include cycloalkyl groups having 3 to 10 carbon atoms (e.g., cyclopentyl, cyclohexyl, and norbornyl).

The aryl, alkyl, and cycloalkyl groups represented by $R_{204}$ to $R_{207}$ may have substituents. Examples of the substituents which may be possessed by the aryl, alkyl, and cycloalkyl groups represented by $R_{204}$ to $R_{207}$ include alkyl groups (e.g., ones having 1 to 15 carbon atoms), cycloalkyl groups (e.g., ones having 3 to 15 carbon atoms), aryl groups (e.g., ones having 6 to 15 carbon atoms), alkoxy groups (e.g., ones having 1 to 15 carbon atoms), halogen atoms, hydroxyl, and phenylthio.

$X^-$ represents a non-nucleophilic anion, which is the same as the non-nucleophilic anion $X^-$ in general formula (ZI).

Other especially effective examples of the compound to be used in the invention which decomposes upon irradiation of an actinic ray to generate an acid include compounds represented by the following formulae (ZIV) to (ZVII).

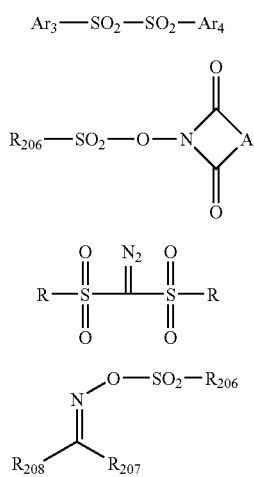

(ZIV)

(ZV)

(ZVI)

(ZVII)

In general formulae (ZIV) to (ZVII), $Ar_3$ and $Ar_4$ each independently represent an aryl group.

$R_{206}$ represents an alkyl group, cycloalkyl group, or aryl group.

Symbol A represents an alkylene group, alkenylene group, or arylene group.

R represents an alkyl group, cycloalkyl group, or aryl group.

$R_{207}$ represents an electron-attracting group, and preferably represents a cyano or fluoroalkyl group.

$R_{208}$ represents an alkyl group, cycloalkyl group, or aryl group.

More preferred of those compounds which generate an acid upon irradiation with an actinic ray are the compounds represented by general formulae (ZI) to (ZIII).

Even more preferred of the compounds which generate an acid upon irradiation with an actinic ray are the sulfonium salts represented by general formula (ZI). Especially preferred are the sulfonium salts having one or more carbonyl groups. Most preferred are the compounds (Z1-2) having a 2-oxoalkyl group as any of $R_{201}$ to $R_{203}$ or the compounds represented by general formula (Z1-3). Use of such a compound having a carbonyl group improves, in particular, sensitivity.

Examples of the especially preferred compounds which generate an acid upon irradiation with an actinic ray are shown below.

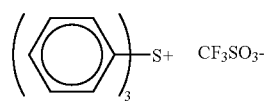

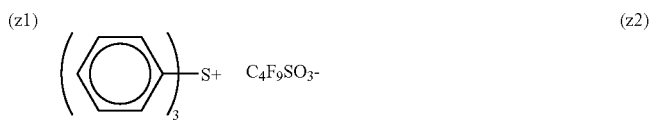

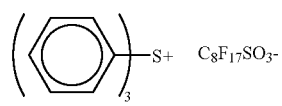

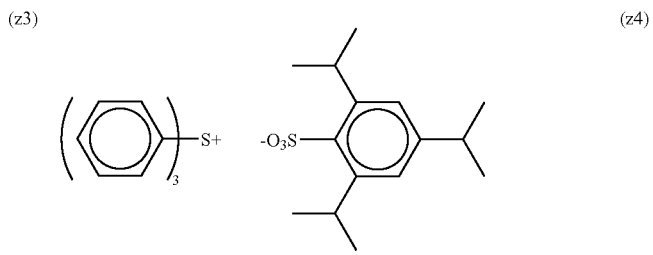

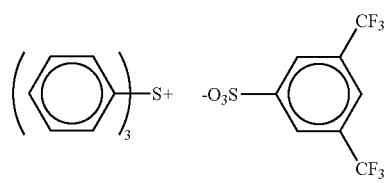

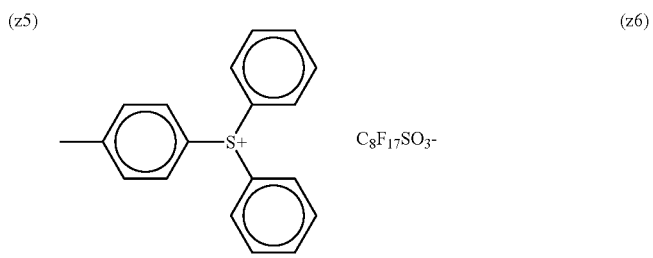

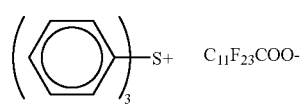

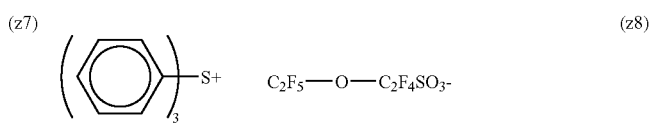

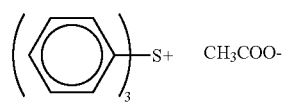

-continued
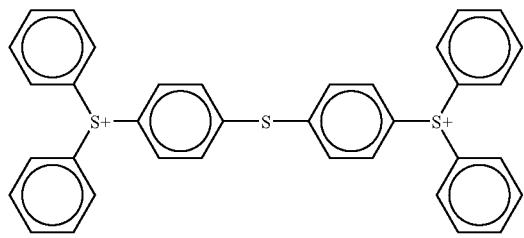 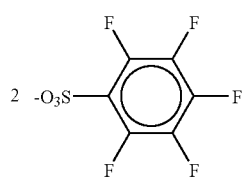
(z10)
(z11) 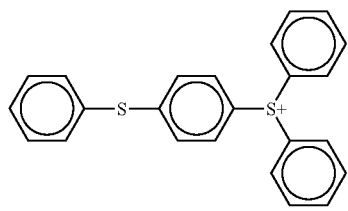 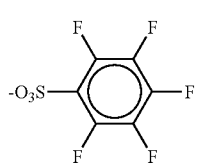
(z12) 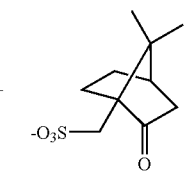
(z13) 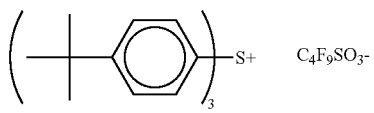
(z14) 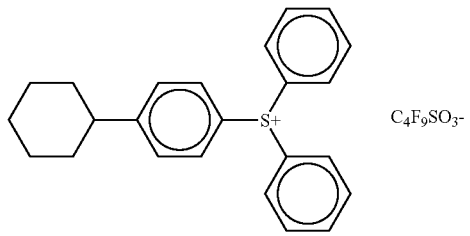
(z15) 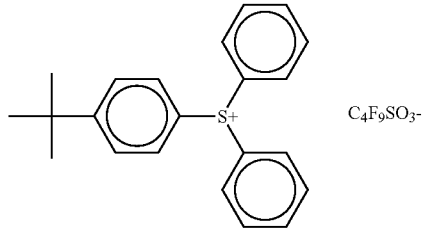
(z16) 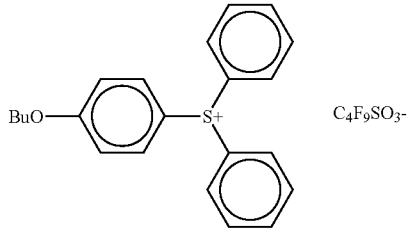
(z17) 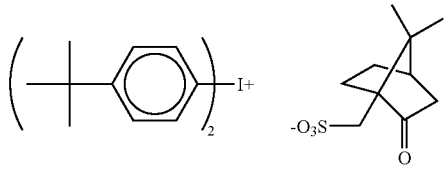
(z18) 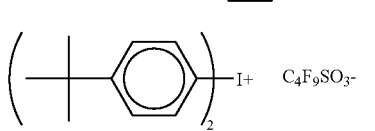
(z19) 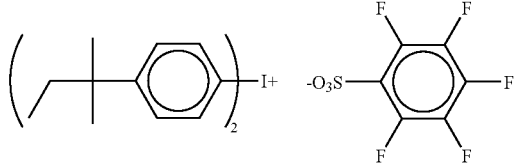
(z20) 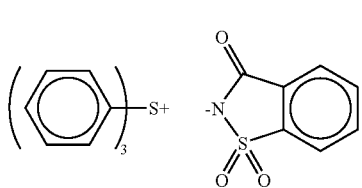
(z21) 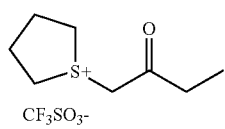
(z22) 
CF$_3$SO$_3$-
C$_4$F$_9$SO$_3$-
(z23) 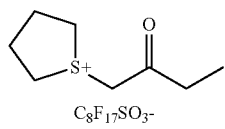
(z24) 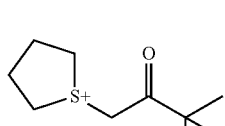
C$_8$F$_{17}$SO$_3$-
CF$_3$SO$_3$-

(z25)
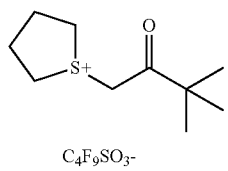
(z26)
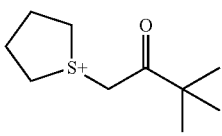
(z27)
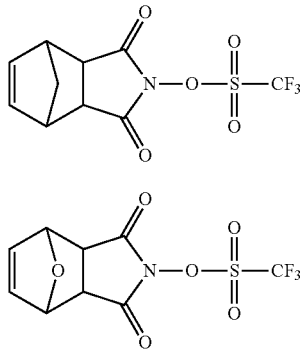
(z28)
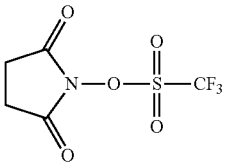
(z29)
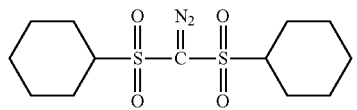
(z30)
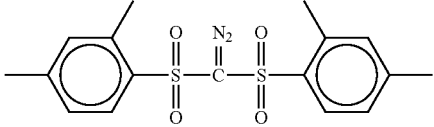
(z31)
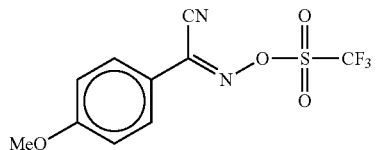
(z32)
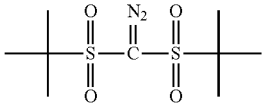
(z33)
(z34)
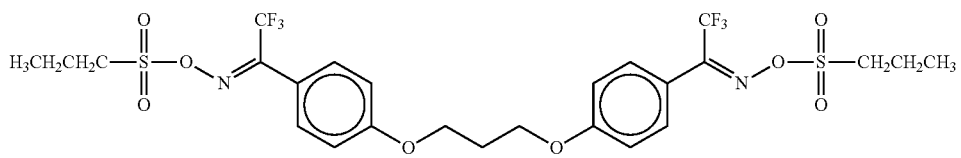
(z35)
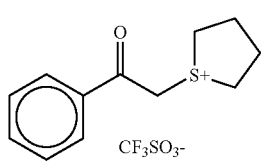
(z36)
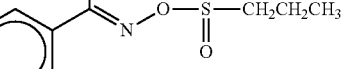
(z37)
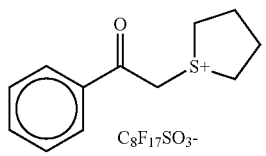
(z-38)
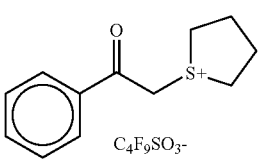
(z39)
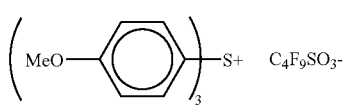
(z40)
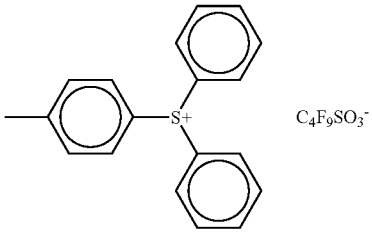
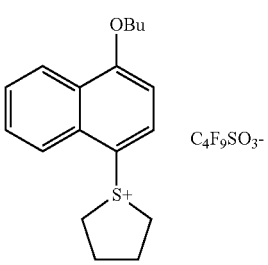

-continued
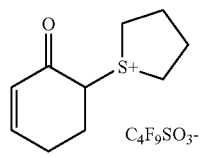
(z41)
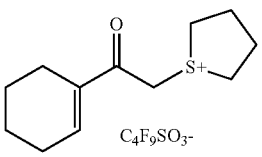
(z42)
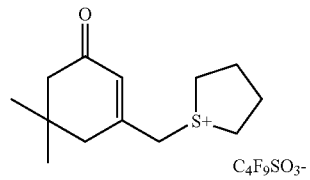
(z43)
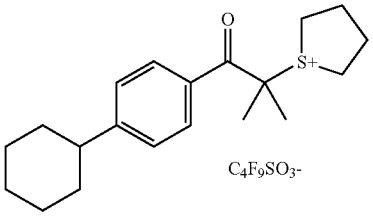
(z44)
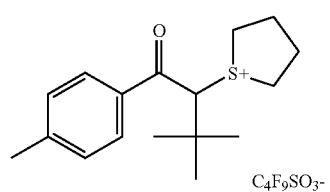
(z45)
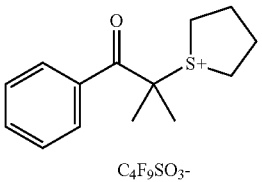
(z46)
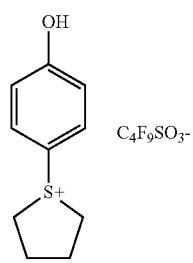
(z47)
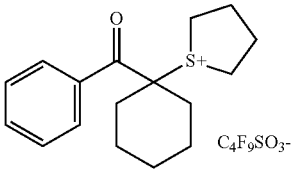
(z48)
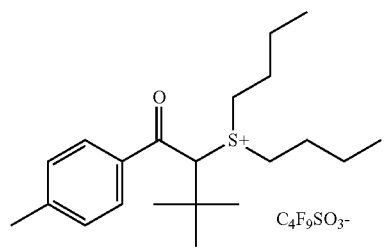
(z49)
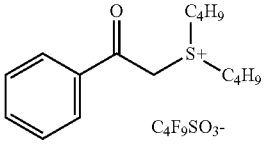
(z50)
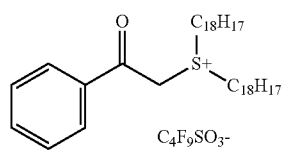
(z51)
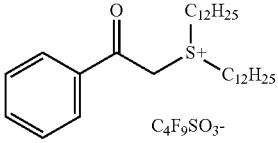
(z52)
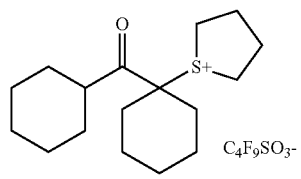
(z53)
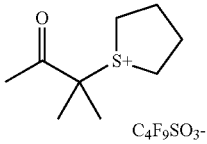
(z54)
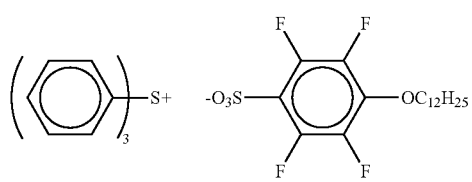
(z55)
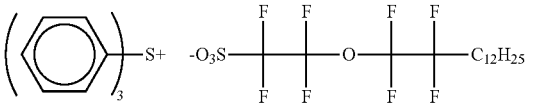
(z56)

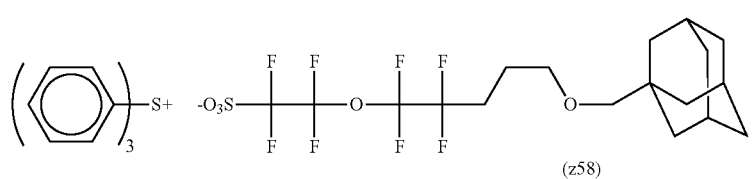
(z57)

(z58) (z59)

[2] (B) Resin Having Fluorine Atom and Having Group that Increases Solubility of the Resin in Alkaline Developer by the Action of Acid The positive photosensitive composition of the invention contains a fluorine atom-containing resin having a group that increases a solubility of the resin in an alkaline developer by the action of an acid (a fluorine atom-containing resin having a groups which dissociate by the action of an acid to enhance solubility in an alkaline developer) (hereinafter referred to also as "fluorine atom-containing resin").

The fluorine atom-containing resin is a resin which has at least one fluorine atom bonded to the main chain and/or side chains thereof. Examples thereof include resins having repeating units represented by any of the following general formulae (I) to (X).

The fluorine atom-containing resin preferably is a resin having at least one fluorine atom bonded to the main chain thereof. For example, a resin having at least one repeating unit represented by any of the following general formulae (I) to (III) and further having at least one repeating unit represented by any of the following general formulae (IV) to (X) is preferred.

Preferably, the fluorine atom-containing resin has a repeating unit having from 1 to 3 groups represented by formula (A-1):

(A-1)

wherein $R_{1a}$ represents a hydrogen atom, an alkyl group, a cycloalkyl group, an acyl group, an alkoxycarbonyl group, or a group which dissociates by the action of an acid. Preferably, $R_{1a}$ represents a hydrogen atom Examples of the repeating unit having from 1 to 3 groups represented by formula (A-1) are those represented by formulae (IV) to (VII):

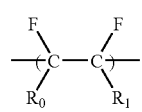
(I)

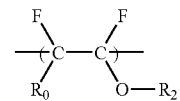
(II)

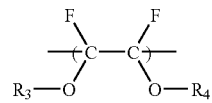
(III)

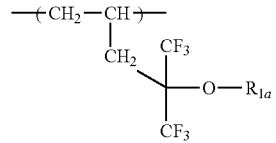
(IV)

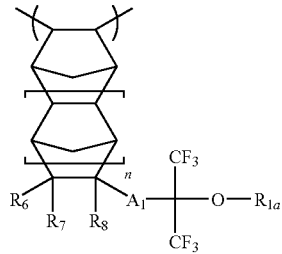
(V)

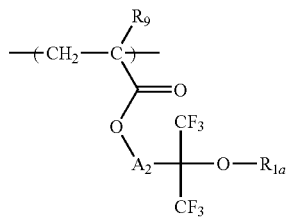
(VI)

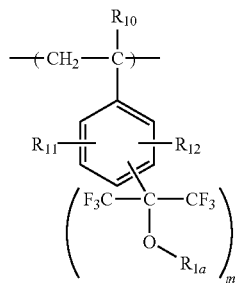
(VII)

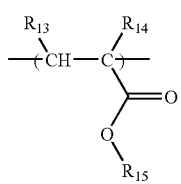

(VIII)

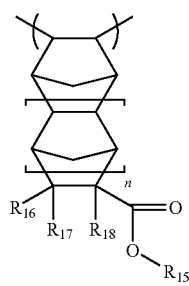

(IX)

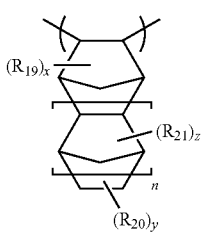

(X)

In general formulae (I) to (X), $R_0$ and $R_1$ may be the same or different and each represent a hydrogen atom, fluorine atom, alkyl group, cycloalkyl group, or aryl group.

$R_2$ to $R_4$ may be the same or different and each represent an alkyl group, cycloalkyl group, or aryl group.

$R_0$ and $R_1$, $R_0$ and $R_2$, or $R_3$ and $R_4$ may be bonded to each other to form a ring.

$R_{1a}$ represents a hydrogen atom, an alkyl group, a cycloalkyl group, an acyl group, an alkoxycarbonyl group, or a group which dissociates by the action of an acid.

$R_6$, $R_7$, and $R_8$ may be the same or different and each represent a hydrogen atom, halogen atom, alkyl group, or alkoxy group.

$R_9$ and $R_{10}$ each represent a hydrogen atom, halogen atom, cyano, or alkyl group.

$R_{11}$ and $R_{12}$ may be the same or different and each represent a hydrogen atom, hydroxyl, halogen atom, cyano, alkoxy group, acyl group, alkyl group, cycloalkyl group, alkenyl group, aralkyl group, or aryl group.

$R_{13}$ and $R_{14}$ may be the same or different and each represent a hydrogen atom, halogen atom, cyano, or alkyl group.

$R_{15}$ represents a hydrogen atom, hydroxyalkyl group, alkyl group having one or more fluorine atoms, cycloalkyl group having one or more fluorine atoms, alkenyl group having one or more fluorine atoms, aralkyl group having one or more fluorine atoms, aryl group having one or more fluorine atoms, —C($R_{36}$)($R_{37}$)($R_{38}$), —C($R_{36}$)($R_{37}$)(O$R_{39}$), or a group represented by the following general formula (XI).

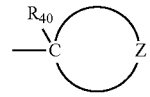

(XI)

$R_{36}$, $R_{37}$, $R_{38}$, and $R_{39}$ may be the same or different and each represent an alkyl group, cycloalkyl group, alkenyl group, aralkyl group, or aryl group. Two of $R_{36}$, $R_{37}$, and $R_{38}$ or two of $R_{36}$, $R_{37}$, and $R_{39}$ may be bonded to each other to form a ring.

$R_{40}$ represents an alkyl group, cycloalkyl group, alkenyl group, alkynyl group, aralkyl group, or aryl group.

Z represents an atomic group which constitutes a mono- or polycyclic alicyclic group in cooperation with the carbon atom.

$R_{16}$, $R_{17}$, and $R_{18}$ may be the same or different and each represent a hydrogen atom, halogen atom, cyano, alkyl group, alkoxy group, or —CO—O—$R_{15}$.

$R_{19}$, $R_{20}$, and $R_{21}$ may be the same or different and each represent a hydrogen atom, fluorine atom, alkyl group having one or more fluorine atoms, cycloalkyl group having one or more fluorine atoms, alkenyl group having one or more fluorine atoms, aralkyl group having one or more fluorine atoms, aryl group having one or more fluorine atoms, alkoxy group having one or more fluorine atoms, or hydroxyalkyl group.

$A_1$ and $A_2$ each represent a single bond, alkylene group, alkenylene group, cycloalkylene group, arylene group, bivalent alicyclic group, or bivalent connecting group formed by combining two or more of these, or represent —O—CO—$R_{22}$—, —CO—O—$R_{23}$—, or —CO—N($R_{24}$)—$R_{25}$—.

$R_{22}$, $R_{23}$, and $R_{25}$ each represent a single bond or a bivalent alkylene, alkenylene, cycloalkylene, or arylene group which may have an ether, ester, amide, urethane, or ureido group.

$R_{24}$ represents a hydrogen atom, alkyl group, cycloalkyl group, aralkyl group, or aryl group.

Symbol n represents 0 or 1; x, y, and z each represent an integer of 0 to 4; and m represents 1 or 2.

In general formulae (I) to (XI), examples of the alkyl groups include alkyl groups having 1 to 8 carbon atoms. Preferred examples thereof include methyl, ethyl, propyl, n-butyl, sec-butyl, t-butyl, hexyl, 2-ethylhexyl, and octyl.

The cycloalkyl groups may be monocyclic or polycyclic. The monocyclic groups may be ones having 3 to 8 carbon atoms, and preferred examples thereof include cyclopropyl, cyclopentyl, cyclohexyl, cycloheptyl, and cyclooctyl. The polycyclic groups may be ones having 6 to 20 carbon atoms, and preferred examples thereof include adamantyl, norbornyl, isobornyl, camphanyl, dicyclopentyl, α-pinenyl, tricyclodecanyl, tetracyclododecyl, and androstanyl. In each of those monocyclic or polycyclic alkyl groups, one or more of the carbon atoms may have been replaced by a heteroatom, e.g., an oxygen atom.

Examples of the aryl groups include aryl groups having 6 to 15 carbon atoms. Preferred examples thereof include phenyl, tolyl, dimethylphenyl, 2,4,6-trimethylphenyl, naphthyl, anthryl, and 9,10-dimethoxyanthryl.

Examples of the aralkyl groups include aralkyl groups having 7 to 12 carbon atoms. Preferred examples thereof include benzyl, phenethyl, and naphthylmethyl.

Examples of the alkenyl groups include alkenyl groups having 2 to 8 carbon atoms. Preferred examples thereof include vinyl, allyl, butenyl, and cyclohexenyl.

Examples of the alkoxy groups include alkoxy groups having 1 to 8 carbon atoms. Preferred examples thereof include methoxy, ethoxy, n-propoxy, isopropoxy, butoxy, pentoxy, allyloxy, and octoxy.

Examples of the acyl groups include acyl groups having 1 to 10 carbon atoms. Preferred examples thereof include formyl, acetyl, propanoyl, butanoyl, pivaloyl, octanoyl, and benzoyl.

Preferred examples of the alkynyl groups include alkynyl groups having 2 to 5 carbon atoms, such as ethynyl, propynyl, and butynyl.

Examples of the alkoxycarbonyl groups include isopropoxycarbonyl, t-butoxycarbonyl, t-amyloxycarbonyl, and 1-methyl-1-cyclohexyloxycarbonyl. Preferred examples thereof include secondary alkoxycarbonyl groups. More preferred examples thereof include tertiary alkoxycarbonyl groups.

Examples of the halogen atoms include fluorine, chlorine, bromine, and iodine atoms.

Preferred examples of the alkylene groups include ones having 1 to 8 carbon atoms, such as methylene, ethylene, propylene, butylene, hexylene, and octylene, which may have one or more substituents.

Preferred examples of the alkenylene groups include ones having 2 to 6 carbon atoms, such as ethenylene, propenylene, and butenylene, which may have one or more substituents.

Preferred examples of the cycloalkylene groups include ones having 5 to 8 carbon atoms, such as cyclopentylene and cyclohexylene, which may have one or more substituents.

Preferred examples of the arylene groups include ones having 6 to 15 carbon atoms, such as phenylene, tolylene, and naphthylene, which may have one or more substituents.

The bivalent alicyclic groups may have any polycyclic structure selected from bicyclic, tricyclic, and tetracyclic structures and the like. The number of carbon atoms in each bivalent alicyclic group is preferably from 6 to 30, more preferably from 7 to 25. Preferred examples of the bivalent alicyclic groups include an adamantane residue (a residue formed by removing two hydrogen atoms from adamantane; the same applies hereinafter), noradamantane residue, decalin residue, tricyclodecane residue, tetracyclododecane residue, and norbornane residue. More preferred examples of the bivalent alicyclic groups include an adamantane residue and a norbornane residue.

The ring formed by the bonding of $R_0$ and $R_1$, $R_0$ and $R_2$, or $R_3$ and $R_4$ is, for example, a 5- to 7-membered ring. Examples thereof include a fluorine-substituted pentane ring, hexane ring, furan ring, dioxole ring, and 1,3-dioxolane ring.

The ring formed by the bonding of two of $R_{36}$ to $R_{38}$ or two of $R_{36}$ to $R_{37}$ and $R_{39}$ is, for example, a 3- to 8-membered ring. Preferred examples thereof include a cyclopropane ring, cyclopentane ring, cyclohexane ring, furan ring, and pyran ring.

Z represents an atomic group constituting a mono- or polycyclic alicyclic group. Examples of the alicyclic group formed are as follows. The monocyclic group may be one having 3 to 8 carbon atoms, and preferred examples thereof include cyclopropyl, cyclopentyl, cyclohexyl, cycloheptyl, and cyclooctyl. The polycyclic group may be one having 6 to 20 carbon atoms, and preferred examples thereof include adamantyl, norbornyl, isobornyl, camphanyl, dicyclopentyl, α-pinenyl, tricyclodecanyl, tetracyclododecyl, and androstanyl.

The alkyl, cycloalkyl, aryl, aralkyl, alkenyl, alkoxy, acyl, alkynyl, alkoxycarbonyl, alkylene, alkenylene, cycloalkylene, arylene, and other groups described above may have no substituent or may have substituents. Examples of substituents which may be possessed by the alkyl, cycloalkyl, aryl, aralkyl, alkenyl, alkoxy, acyl, alkynyl, alkoxycarbonyl, alkylene, alkenylene, cycloalkylene, arylene, and other groups include alkyl groups, cycloalkyl groups, aryl groups, groups having active hydrogen, such as amino, amide, ureido, urethane, hydroxyl, and carboxyl groups, halogen atoms (fluorine, chlorine, bromine, and iodine atoms), alkoxy groups (e.g., methoxy, ethoxy, propoxy, and butoxy), thioether groups, acyl groups (e.g., acetyl, propanoyl, and benzoyl), acyloxy groups (e.g., acetoxy, propanoyloxy, and benzoyloxy), alkoxycarbonyl groups (e.g., methoxycarbonyl, ethoxycarbonyl, and propoxycarbonyl), cyano, and nitro.

Examples of the alkyl groups, cycloalkyl groups, and aryl groups include those shown above. The alkyl groups may be further substituted with one or more fluorine atoms or cycloalkyl groups.

Examples of the groups which are contained in the fluorine atom-containing resin and dissociate by the action of an acid to enhance solubility in an alkaline developer (hereinafter referred to also as "acid-dissociable groups") include —O—C($R_{36}$)($R_{37}$)($R_{38}$), —O—C($R_{01}$)($R_{02}$)(OR$_{39}$), —O—C($R_{36}$)($R_{37}$)(OR$_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)(OR$_{39}$).

$R_{36}$ to $R_{39}$ have the same meanings as the $R_{36}$ to $R_{39}$ in $R_{15}$ in general formulae (VIII) and (IX). $R_{01}$ and $R_{02}$ each represent a hydrogen atom or an alkyl, cycloalkyl, alkenyl, aralkyl, or aryl group which may have one or more of the substituents shown above.

Preferred examples thereof include ether or ester groups of a tertiary alkyl group such as t-butyl, t-amyl, 1-alkyl-1-cyclohexyl, 2-alkyl-2-adamantyl, 2-adamantyl-2-propyl, or 2-(4-methylcyclohexyl)-2-propyl; acetal or acetal ester groups of 1-alkoxy-1-ethoxy, tetrahydropyranyl, or the like; t-alkyl carbonate groups; and t-alkylcarbonylmethoxy groups.

The groups which dissociate by the action of an acid to enhance solubility in an alkaline developer can be formed, for example, as —OR$_{1a}$ groups in repeating units represented by any of general formulae (IV) to (VII) or as —COOR$_{15}$ groups in repeating units represented by any of general formulae (VIII) to (IX).

Specific examples of the repeating structural units represented by general formulae (I) to (X) are shown below, but the repeating units in the invention should not be construed as being limited to these examples.

(F-1)

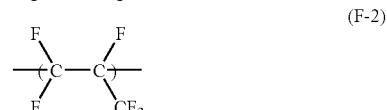

(F-2)

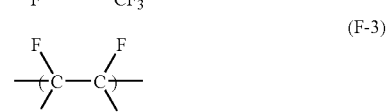

(F-3)

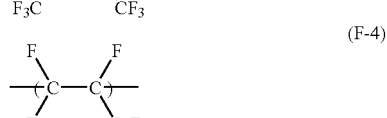

(F-4)

-continued
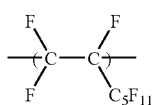 (F-5)
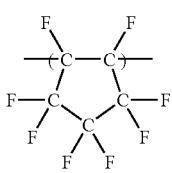 (F-6)
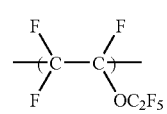 (F-7)
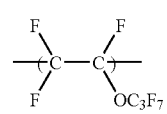 (F-8)
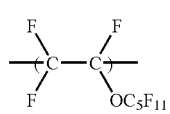 (F-9)
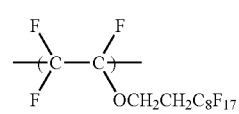 (F-10)
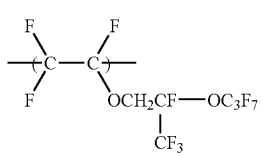 (F-11)
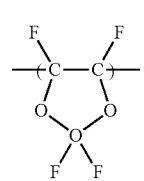 (F-12)
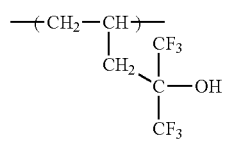 (F-13)
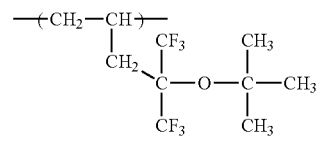 (F-14)
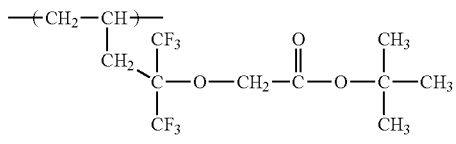 (F-15)
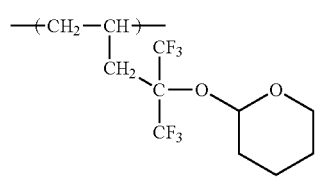 (F-16)
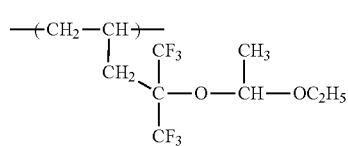 (F-17)
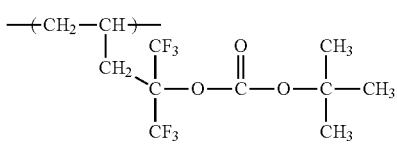 (F-18)
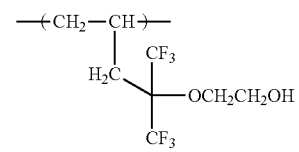 (F-19)
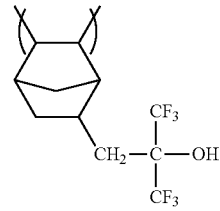 (F-20)
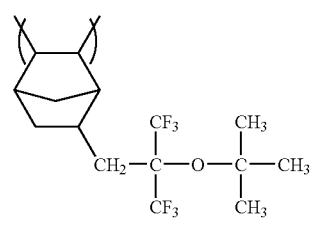 (F-21)
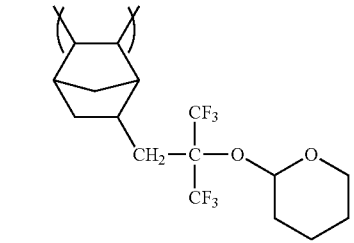 (F-22)
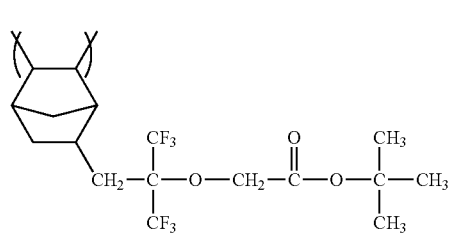 (F-23)

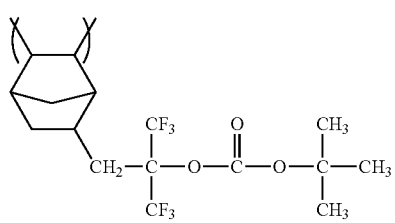
(F-24)
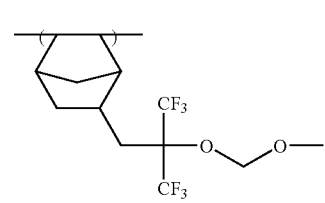
(F-25)
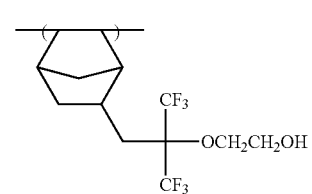
(F-26)
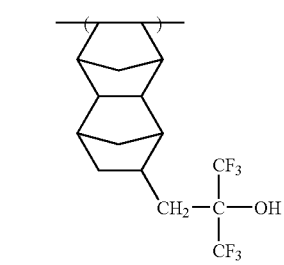
(F-27)
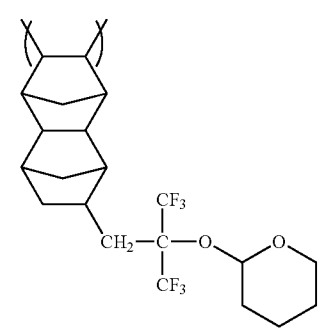
(F-28)
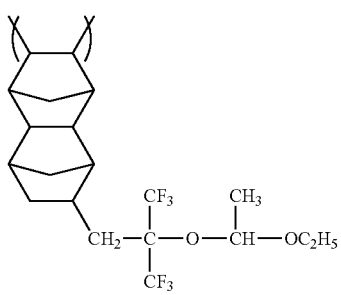
(F-29)
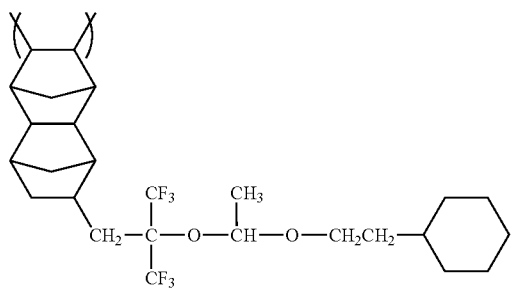
(F-30)
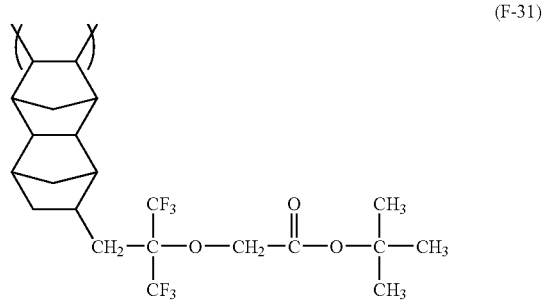
(F-31)
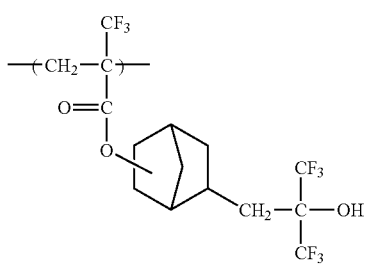
(F-32)
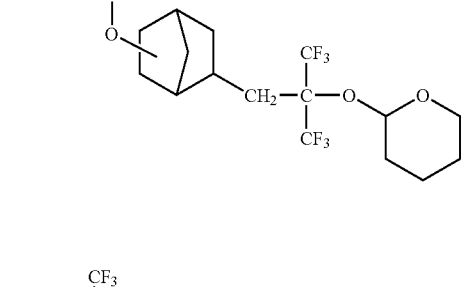
(F-33)
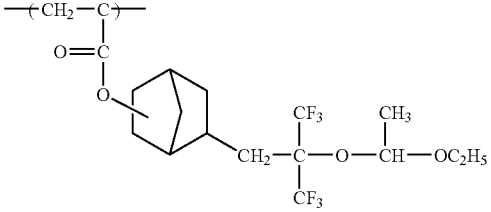
(F-34)

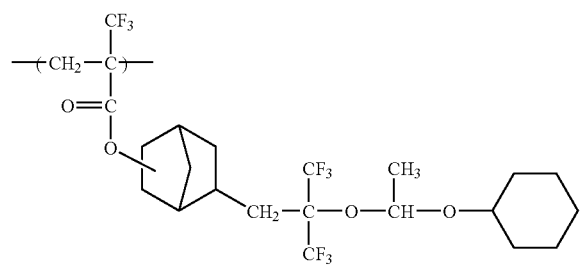
(F-35)
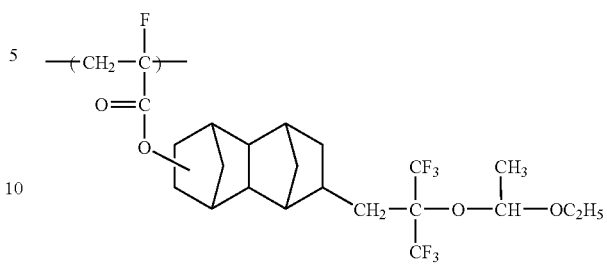
(F-40)
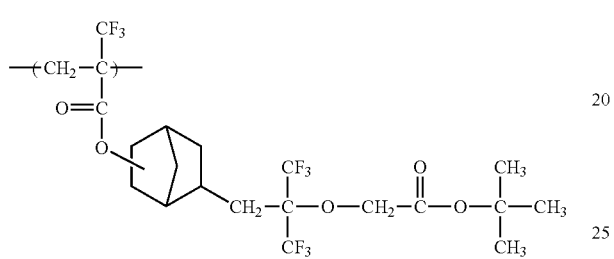
(F-36)
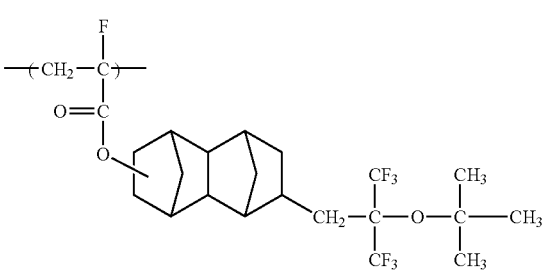
(F-41)
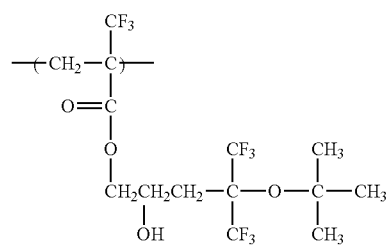
(F-37)
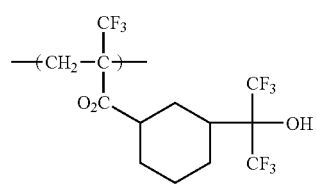
(F-42)
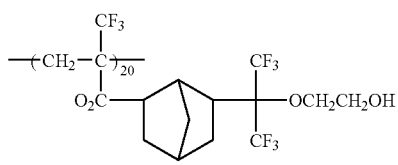
(F-43)
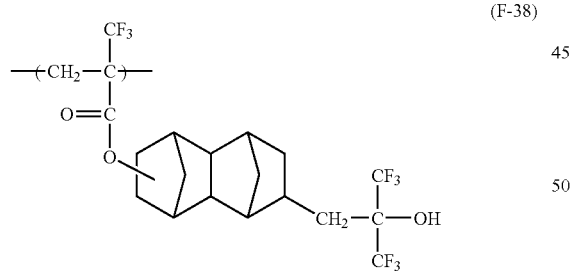
(F-38)
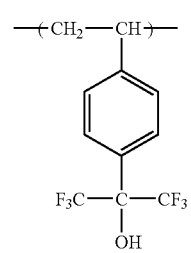
(F-44)
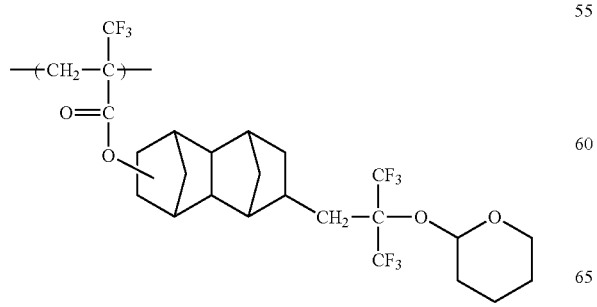
(F-39)
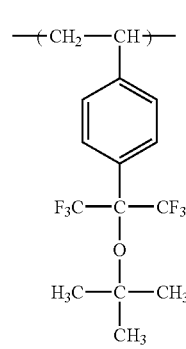
(F-45)

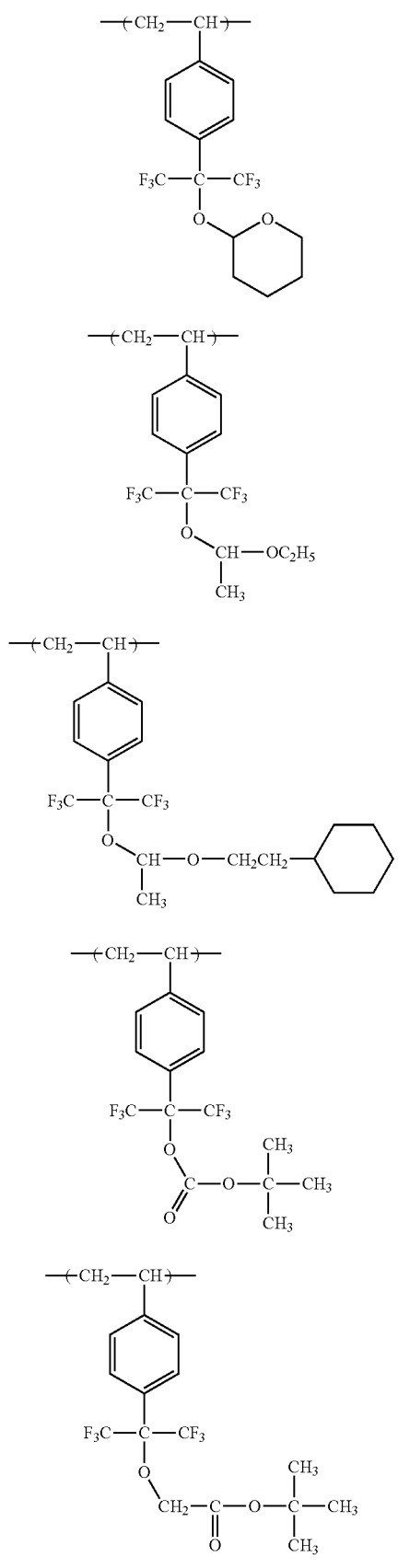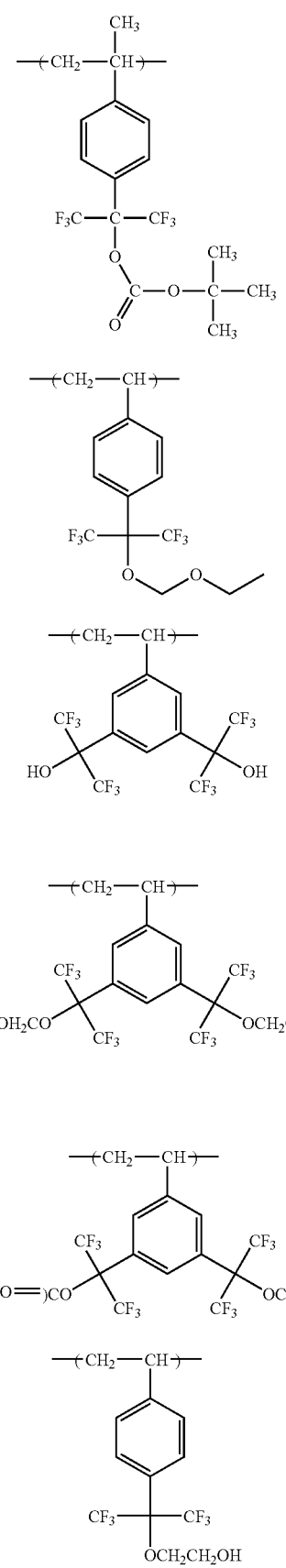

(F-57) 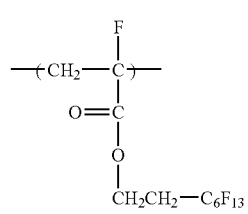
(F-58) 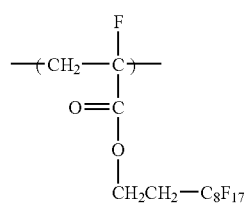
(F-59) 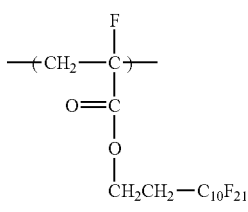
(F-60) 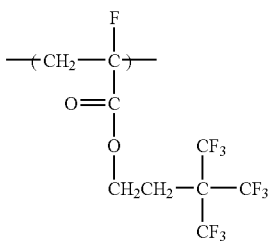
(F-61) 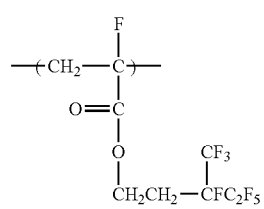
(F-62) 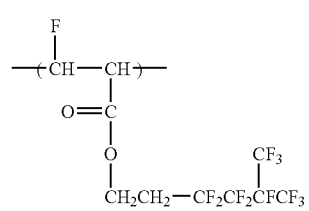
(F-63) 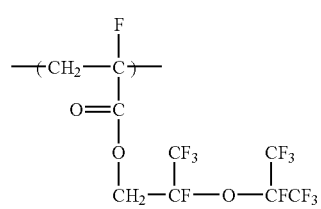
(F-64) 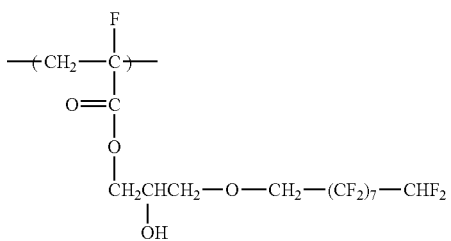
(F-65) 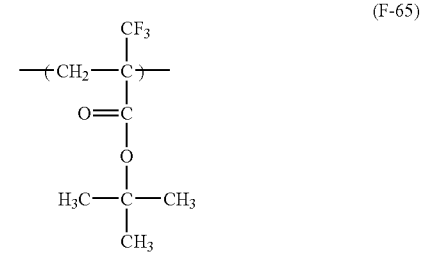
(F-66) 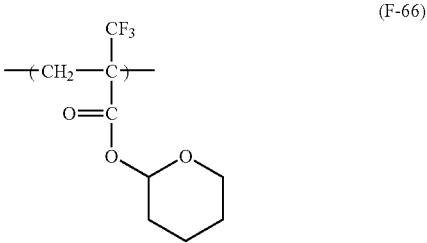
(F-67) 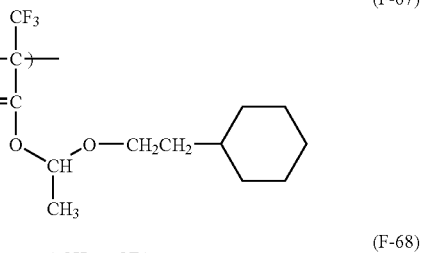
(F-68) 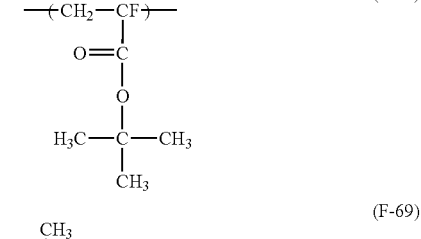
(F-69) 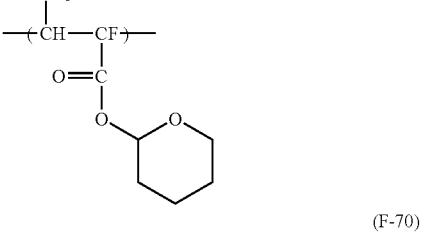
(F-70) 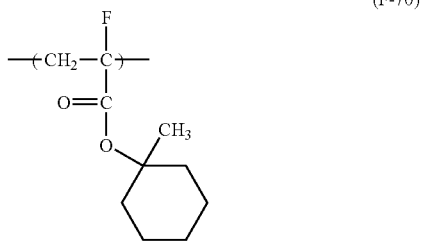

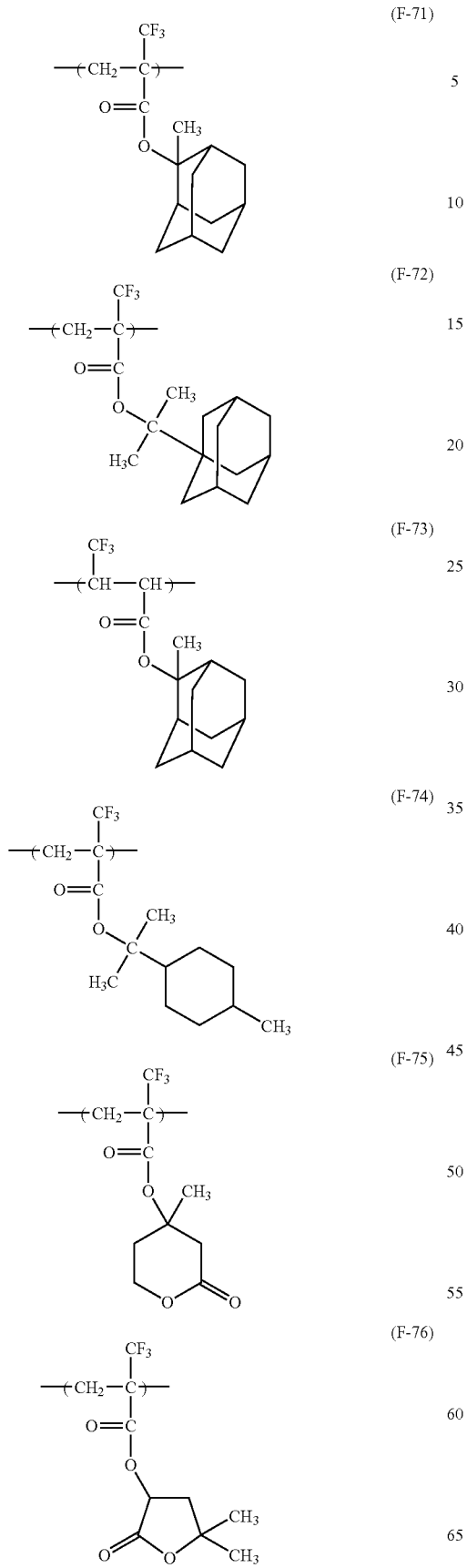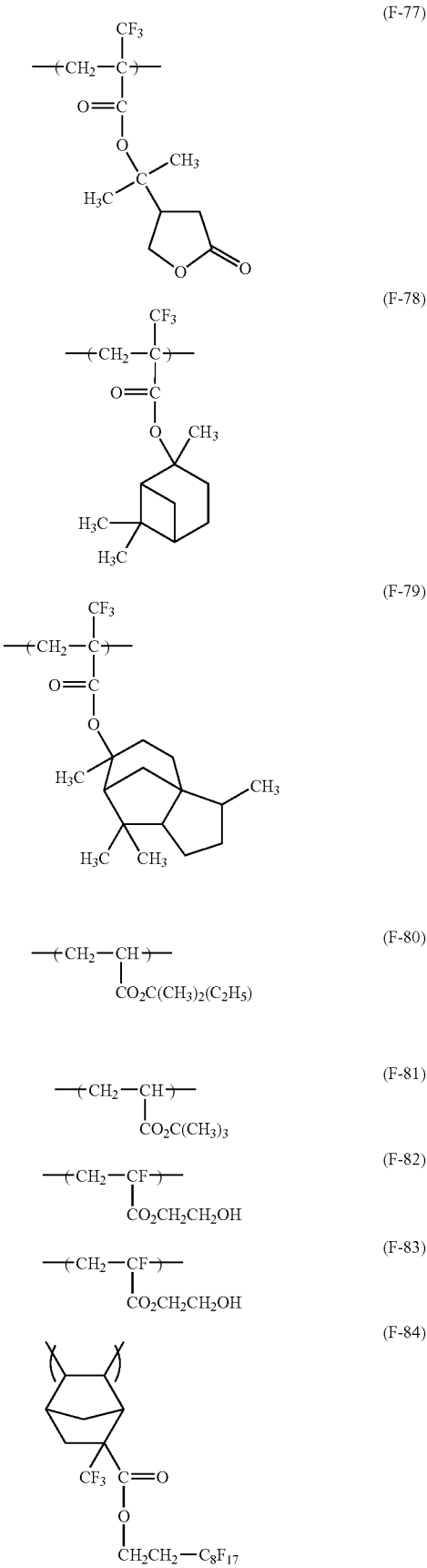

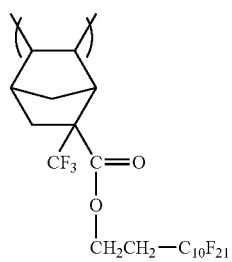
(F-85)
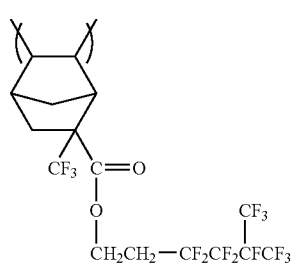
(F-86)
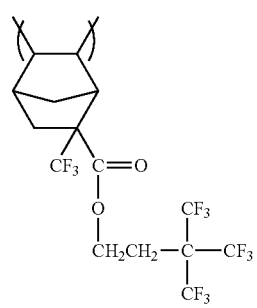
(F-87)
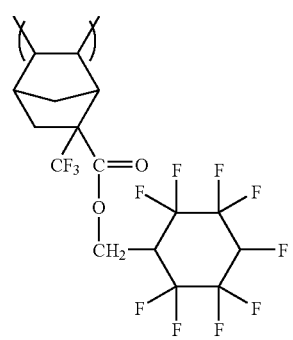
(F-88)
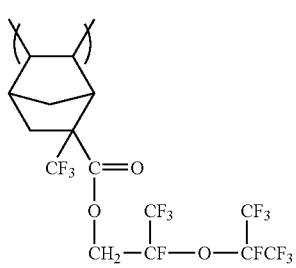
(F-89)
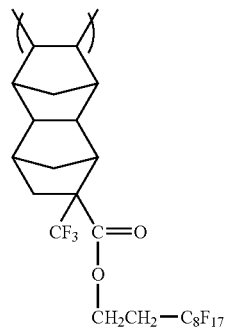
(F-90)
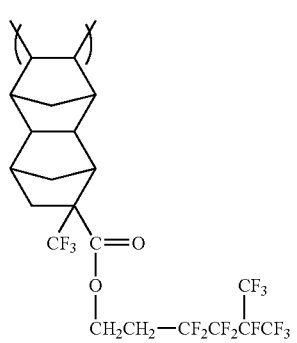
(F-91)
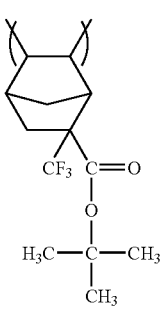
(F-92)
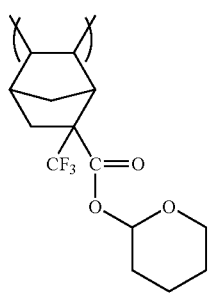
(F-93)
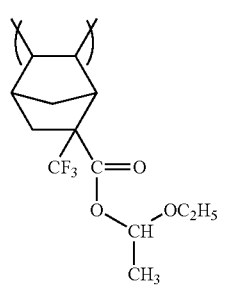
(F-94)

(F-95) 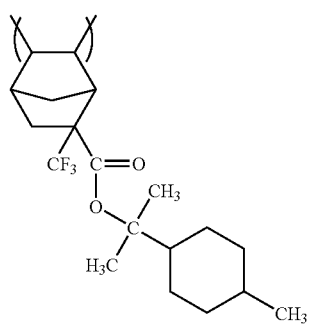
(F-96) 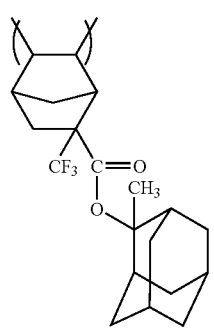
(F-97) 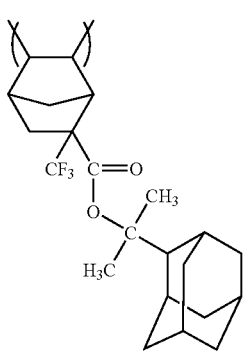
(F-98) 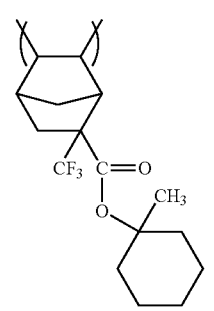
(F-99) 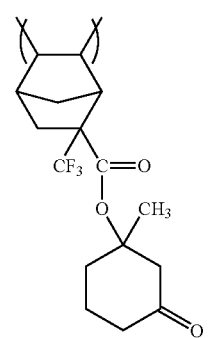
(F-100) 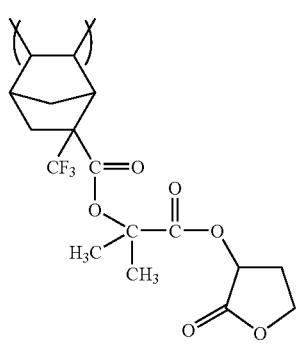
(F-101) 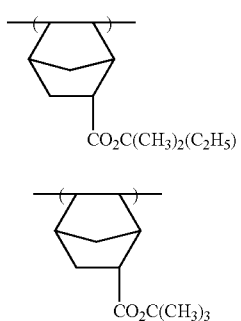
(F-102) 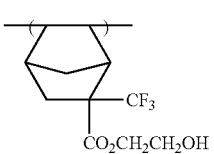
(F-103) 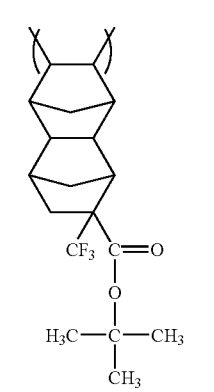
(F-104) 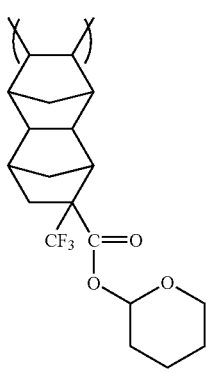
(F-105)

(F-106) 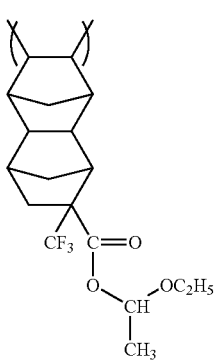

(F-107) 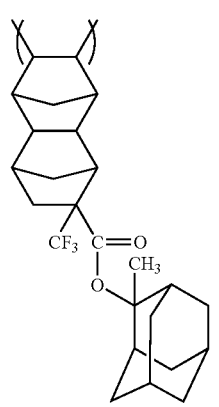

(F-108) 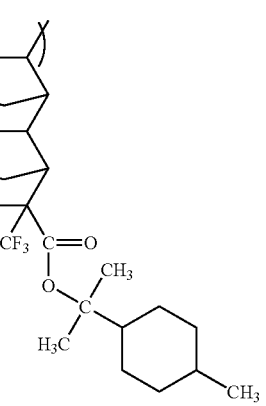

(F-109)

(F-110) 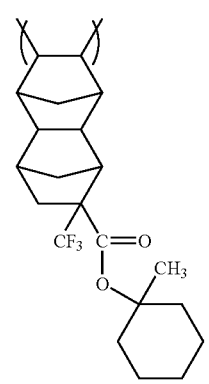

(F-111) 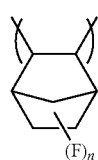

(F-112) 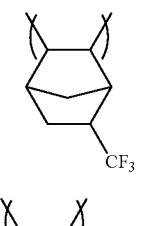

(F-113) 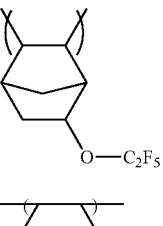

(F-114) 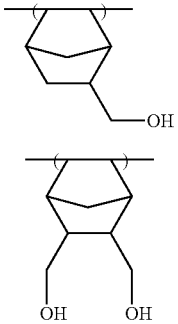

(F-115) 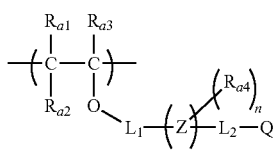

n = 8

The fluorine atom-containing resin preferably further has repeating units represented by the following general formula (XII).

(XII)

$$\left(\begin{array}{c}R_{a1}\\|\\C\\|\\R_{a2}\end{array}-\begin{array}{c}R_{a3}\\|\\C\\|\\O\end{array}\right)-L_1\left(Z\begin{array}{c}R_{a4}\\\\\end{array}\right)_n L_2-Q$$

In general formula (XII), $R_{a1}$ to $R_{a3}$ each independently represent a hydrogen atom, halogen atom, cyano, or alkyl group. $R_{a4}$ represents a hydrogen atom, halogen atom, hydroxyl, cyano, alkyl group, aryl group, alkoxy group, or aralkyl group. Symbol n represents an integer of 1 to 5. When n is 2 or larger, the two or more $R_{a4}$'s may be the same or different. (Z) represents an alicyclic hydrocarbon group. Q represents hydroxyl or an acid-dissociable group. $L_1$ and $L_2$ each independently represent a single bond or a bivalent connecting group.

In general formula (XII), examples of the halogen atoms represented by $R_{a1}$ to $R_{a3}$ and $R_{a4}$ include fluorine, chlorine, bromine, and iodine atoms.

The alkyl groups represented by $R_{a1}$ to $R_{a3}$ and $R_{a4}$ and the alkyl group in the alkoxy group represented by $R_{a4}$ preferably are alkyl groups having 1 to 5 carbon atoms. Examples thereof include methyl, ethyl, and propyl.

The aryl group represented by $R_{a4}$ preferably is an aryl group having 6 to 10 carbon atoms. Examples thereof include phenyl, tolyl, and naphthyl.

The aralkyl group represented by $R_{a4}$ preferably is an aralkyl group having 7 to 12 carbon atoms. Examples thereof include benzyl, phenethyl, naphthylmethyl, and naphthylethyl.

The alkyl, alkoxy, aryl, aralkyl, and other groups represented by $R_{a1}$ to $R_{a3}$ and $R_{a4}$ may have no substituent or may have substituents.

Examples of substituents which may be possessed by the alkyl, alkoxy, aryl, aralkyl, and other groups represented by $R_{a1}$ to $R_{a3}$ and $R_{a4}$ include halogen atoms, e.g., chlorine, hydroxyl, alkoxy groups (preferably having 1 to 3 carbon atoms), and cyano.

$R_{a4}$ preferably is a hydrogen atom, fluorine atom, trifluoromethyl, hydroxyl, cyano, methyl, or ethyl.

Examples of the alicyclic hydrocarbon group represented by (Z) include ones generally having 7 to 30 carbon atoms, preferably having 7 to 20 carbon atoms, more preferably having 7 to 15 carbon atoms. The alicyclic hydrocarbon group may be monocyclic or polycyclic. Specific examples thereof include a cycloheptane residue, cyclooctane residue, norbornane residue, adamantane residue, tricyclodecane residue, and tetracyclododecane residue. Preferred examples thereof include a norbornane residue, adamantane residue, tricyclodecane residue, and tetracyclododecane residue.

Examples of the acid-dissociable group represented by Q include the acid-dissociable groups enumerated above.

Examples of the bivalent connecting groups represented by $L_1$ and $L_2$ include alkylene groups, cycloalkylene groups, alkenylene groups, arylene groups, —O—$R_{22a}$—, —O—CO—$R_{22b}$—, —CO—O—$R_{22c}$—, and —CO—N($R_{22d}$)—$R_{22e}$—, which each may have one or more substituents. $R_{22a}$, $R_{22b}$, $R_{22c}$, and $R_{22e}$ each represent a single bond or a bivalent alkylene, cycloalkylene, alkenylene, or arylene group which may have an ether, ester, amide, urethane, or ureido group. $R_{22d}$ represents a hydrogen atom or an alkyl, cycloalkyl, aralkyl, or aryl group which may have one or more substituents.

Examples of the alkylene group include linear and branched alkylene groups. Specific examples thereof include ones having 1 to 8 carbon atoms, such as methylene, ethylene, propylene, butylene, hexylene, and octylene.

Examples of the cycloalkylene group include monocyclic residues such as cyclopentylene and cyclohexylene and polycyclic residues such as a norbornane framework and adamantane framework (each having 5 to 12 carbon atoms).

Preferred examples of the alkenylene group include ones having 2 to 6 carbon atoms, such as ethenylene, propenylene, and butenylene, which may have one or more substituents.

Examples of the arylene group include ones having 6 to 15 carbon atoms, such as phenylene, tolylene, and naphthylene, which may have one or more substituents.

Examples of substituents which may be possessed by the bivalent connecting groups represented by $L_1$ and $L_2$ include halogen atoms such as fluorine and chlorine atoms and cyano. Fluorine atoms are preferred.

Specific examples of the repeating structural units represented by general formula (XII) are shown below, but the repeating units in the invention should not be construed as being limited to these examples.

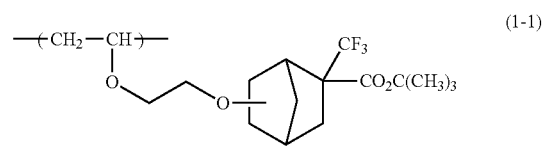

(1-1)

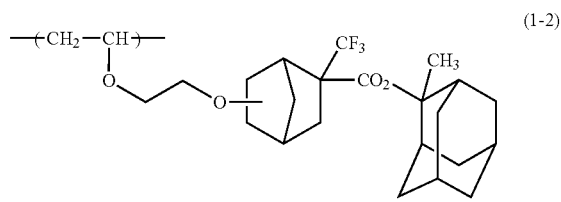

(1-2)

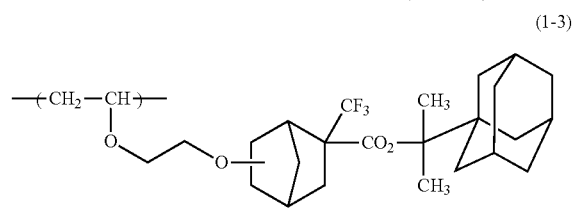

(1-3)

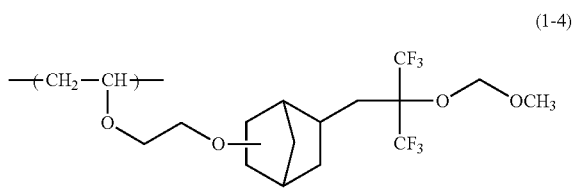

(1-4)

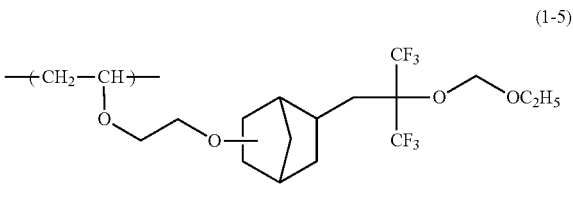

(1-5)

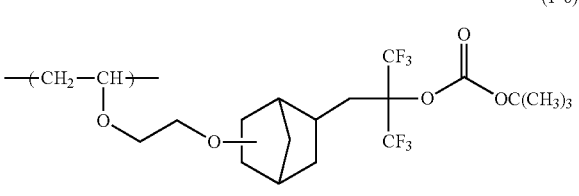

(1-6)

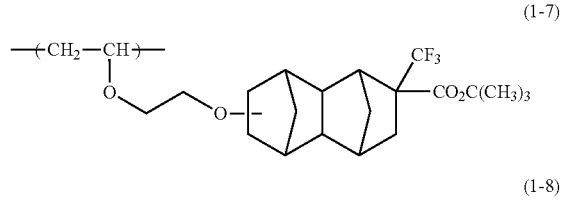

(1-7)

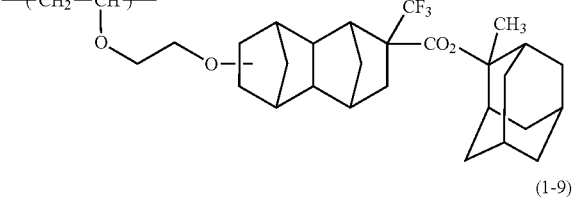

(1-8)

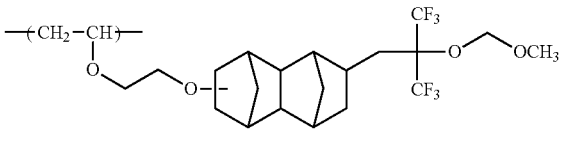

(1-9)

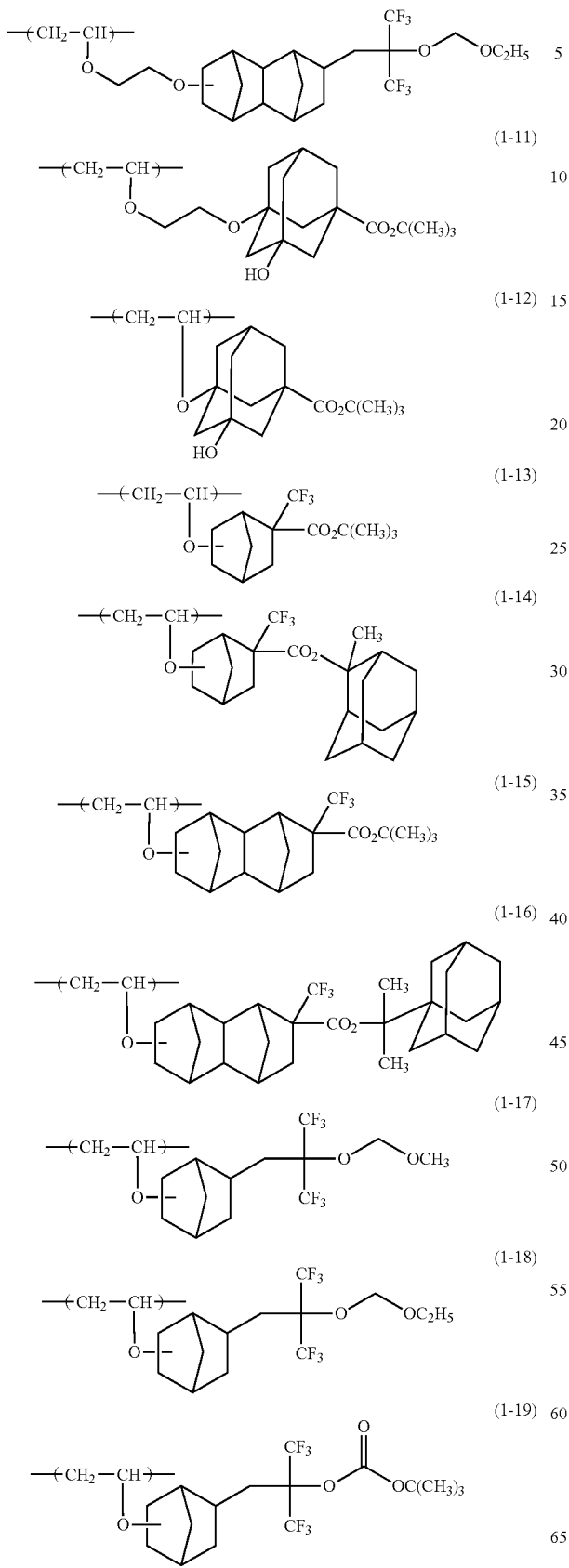
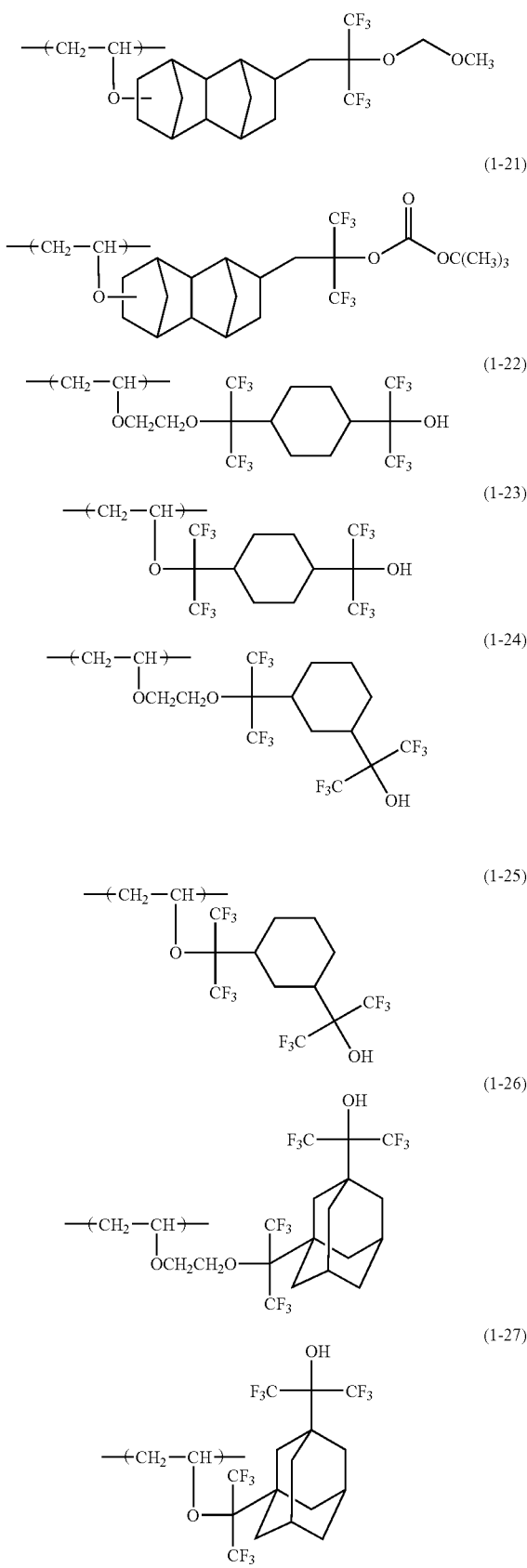

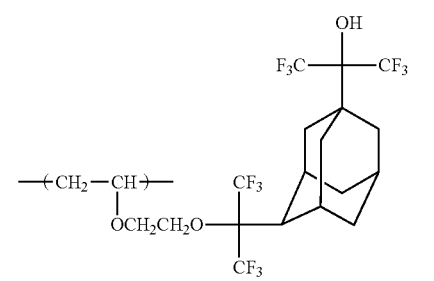 (1-28)
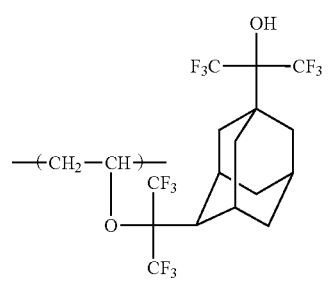 (1-29)
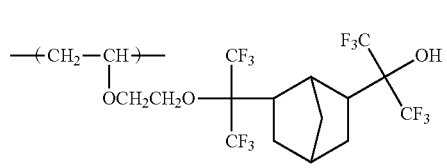 (1-30)
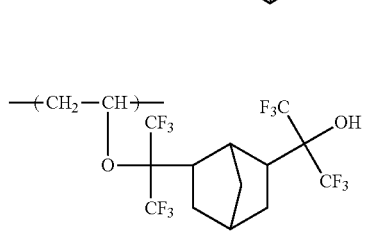 (1-31)
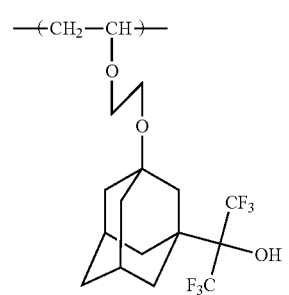 (1-32)
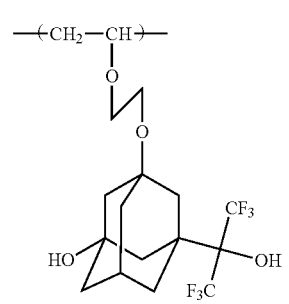 (1-33)
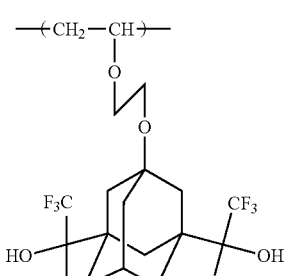 (1-34)
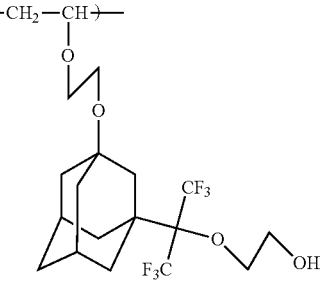 (1-35)
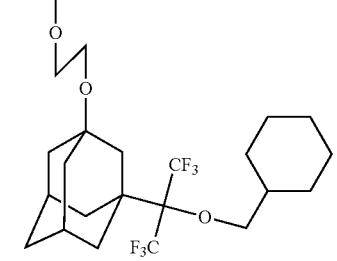 (1-36)
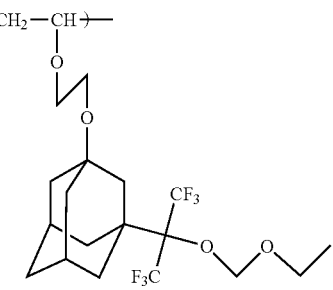 (1-37)
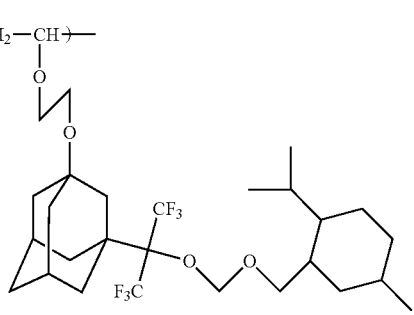 (1-38)

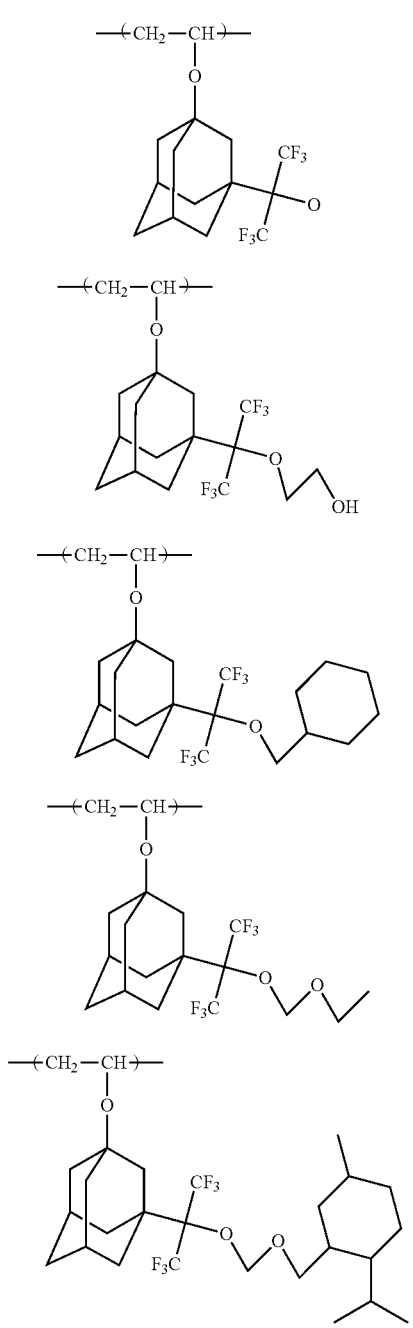

The fluorine atom-containing resin may further have at least one repeating unit represented by the following general formulae (XIII) to (XV).

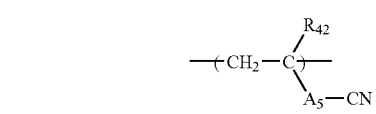

In the formulae, $R_{41}$ represents an alkyl group, cycloalkyl group, aralkyl group, or aryl group.

$R_{42}$ represents a hydrogen atom, halogen atom, cyano, or alkyl group.

$A_5$ represents a single bond, a bivalent alkylene, alkenylene, cycloalkylene, or arylene group, or a group represented by —O—CO—$R_{22}$—, —CO—O—$R_{23}$—, or —CO—N($R_{24}$)—$R_{25}$—.

$R_{22}$, $R_{23}$, and $R_{25}$ may be the same or different, and each represent a single bond or a bivalent alkylene, alkenylene, cycloalkylene, or arylene group which may have an ether, ester, amide, urethane, or ureido group.

$R_{24}$ represents a hydrogen atom or an alkyl, cycloalkyl, aralkyl, or aryl group which may have one or more substituents.

Specific examples of the repeating structural units represented by general formula (XIII) to (XV) are shown below, but the repeating units in the invention should not be construed as being limited to these examples.

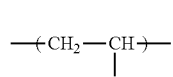

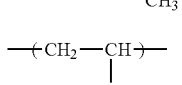

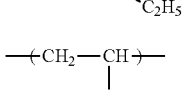

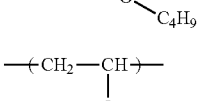

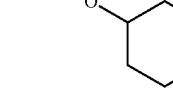

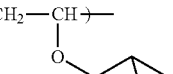

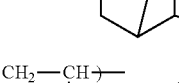

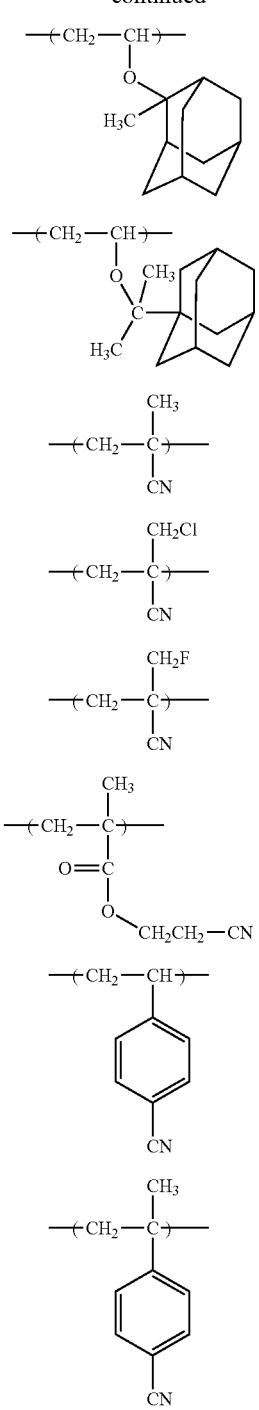

Besides monomers for forming the repeating structural units shown above, other polymerizable monomers may be copolymerized in producing the fluorine atom-containing resin.

When the fluorine atom-containing resin is used for exposure to ArF excimer laser, then the resin preferably has a fluorine atom-containing repeating unit and a repeating unit with no fluorine atom.

Examples of the fluorine atom-containing repeating unit those represented by formulae (I) to (VII) mentioned above. The repeating units of formulae (IV) to (VII) are preferred.

Examples of the repeating unit with no fluorine atom are those of the following (a) to (c):
  (a) monocyclic or polycyclic, alicyclic hydrocarbon structure-having, acid-dissociating repeating unit;
  (b) lactone structure-having repeating unit;
  (c) monocyclic or polycyclic, alicyclic hydrocarbon structure and hydroxyl group-having repeating unit.

(a) Monocyclic or Polycyclic, Alicyclic Hydrocarbon Structure-Having, Acid-Dissociating Repeating Unit:

Preferably, the monocyclic or polycyclic, alicyclic hydrocarbon structure-having, acid-dissociating repeating unit is an acid-dissociating repeating unit having an alicyclic hydrocarbon structure represented by any of the following general formulae (pI) to (pVI):

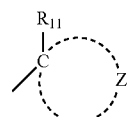 (pI)

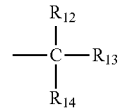 (pII)

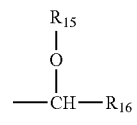 (pIII)

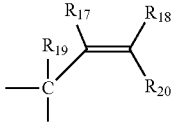 (pIV)

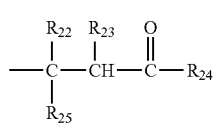 (pV)

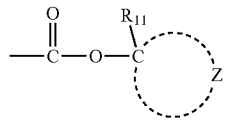 (pVI)

In formulae (pI) to (pVI), $R_{11}$ represents a methyl group, an ethyl group, an n-propyl group, an isopropyl group, an n-butyl group, an isobutyl group, or a sec-butyl group; Z represents an atomic group necessary for forming a cycloalkyl group along with the carbon atom in the formula;

$R_{12}$ to $R_{16}$ each independently represents a linear or branched alkyl group having from 1 to 4 carbon atoms, or a cycloalkyl group, provided that at least one of $R_{12}$ to $R_{14}$ or any of $R_{15}$ or $R_{16}$ is a cycloalkyl group;

$R_{17}$ to $R_{21}$ each independently represents a hydrogen atom, a linear or branched alkyl group having from 1 to 4 carbon atoms, or a cycloalkyl group, provided that at least one of $R_{17}$ to $R_{21}$ is a cycloalkyl group, and any of $R_{19}$ or $R_{21}$ is a linear or branched alkyl group having from 1 to 4 carbon atoms, or a cycloalkyl group;

$R_{22}$ to $R_{25}$ each independently represents a hydrogen atom, a linear or branched alkyl group having from 1 to 4 carbon atoms, or a cycloalkyl group, provided that at least one of $R_{22}$ to $R_{25}$ is a cycloalkyl group, and $R_{23}$ and $R_{24}$ may bond to each other to form a ring.

In formulae (pI) to (pVI), the alkyl group for $R_{12}$ to $R_{25}$ is a linear or branched alkyl group having from 1 to 4 carbon atoms. It includes, for example, methyl, ethyl, n-propyl, isopropyl, n-butyl, isobutyl, sec-butyl, and t-butyl.

The alkyl group may be substituted, and the substituent for it includes an alkoxy group having from 1 to 4 carbon atoms, a halogen atom (fluorine, chlorine, bromine, iodine), an acyl group, an acyloxy group, a cyano group, a hydroxyl group, a carboxyl group, an alkoxycarbonyl group, and a nitro group.

The cycloalkyl group for $R_{11}$ to $R_{25}$, and the cycloalkyl group which Z forms together with the carbon atom in the formulae may be monocyclic or polycyclic. Concretely, it includes monocyclo, bicyclo, tricyclo and tetracyclo structures having 5 or more carbon atoms. The number of the carbon atoms constituting the group is preferably from 6 to 30, more preferably from 7 to 25. The cycloalkyl group may be substituted.

Preferred examples of the cycloalkyl group are adamantyl, noradamantyl, decalyl, tricyclodecanyl, tetracyclododecanyl, norbornyl, cedrolyl, cyclohexyl, cycloheptyl, cyclooctyl, cyclodecanyl, and cyclododecanyl. More preferred are adamantyl, decalyl, norbornyl, cedrolyl, cyclohexyl, cycloheptyl, cyclooctyl, cyclodecanyl, and cyclododecanyl.

The substituent for the cycloalkyl group includes an alkyl group, a halogen atom, a hydroxyl group, an alkoxy group, a carboxyl group, and an alkoxycarbonyl group. The alkyl group is preferably a lower alkyl group such as methyl, ethyl, propyl, isopropyl, and butyl. More preferably, it is selected from methyl, ethyl, propyl, and isopropyl. The alkoxy group may have from 1 to 4 carbon atoms, including methoxy, ethoxy, propoxy, and butoxy. The substituent for the alkyl, alkoxy and alkoxycarbonyl groups that may be optionally substituted includes a hydroxyl group, a halogen atom, and an alkoxy group.

The acid-dissociable repeating unit having the alicyclic hydrocarbon structure represented any of formulae (pI) to (pVI) is preferably one represented by the following general formula (pA):

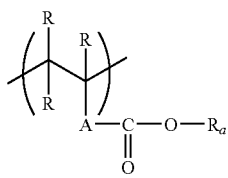

(pA)

In the formula, R represents a hydrogen atom, a halogen atom, or a linear or branched alkyl group having from 1 to 4 carbon atoms; multiple Rs may be the same or different;

A represents a single bond, an alkylene group, an ether group, a thioether group, a carbonyl group, an ester group, an amido group, a sulfonamido group, an urethane group, or an urea group, or a combination of two or more of them;

Ra represents a group of formulae (pI) to (pVI).

The acid-dissociable repeating unit having the monocyclic or polycyclic alicyclic hydrocarbon structure is most preferably a repeating unit of 2-alkyl-2-adamantyl(meth)acrylate or dialkyl(1-adamantyl)methyl(meth)acrylate.

Specific examples of the acid-dissociable repeating unit having the monocyclic or polycyclic alicyclic hydrocarbon structure are mentioned below.

(In the following formulae, Rx represents H or $CH_3$.)

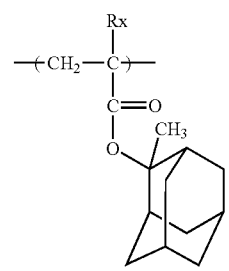

1

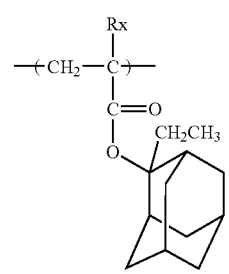

2

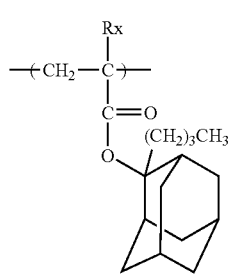

3

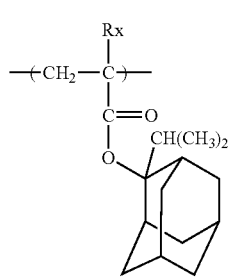

4

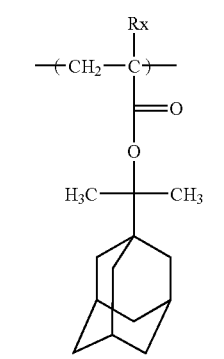

5

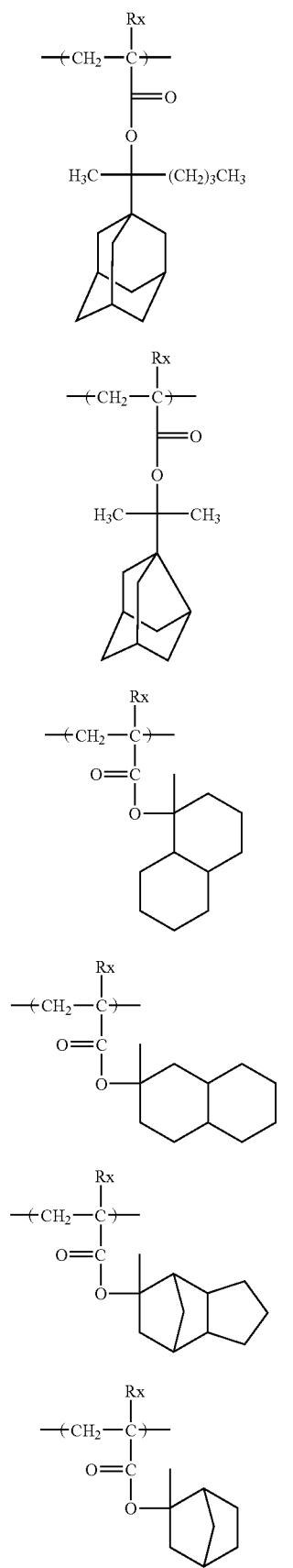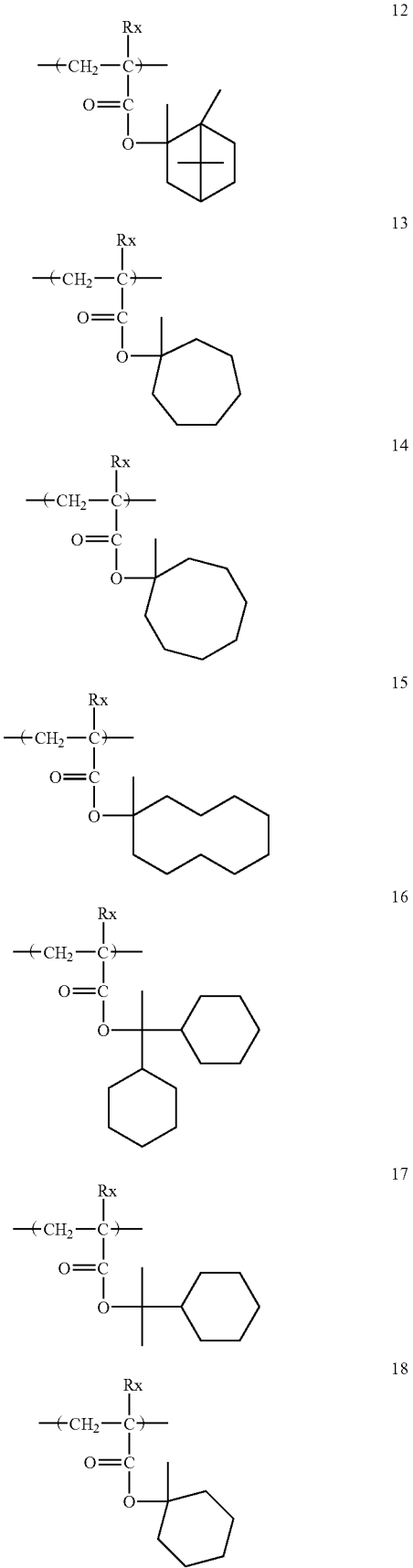

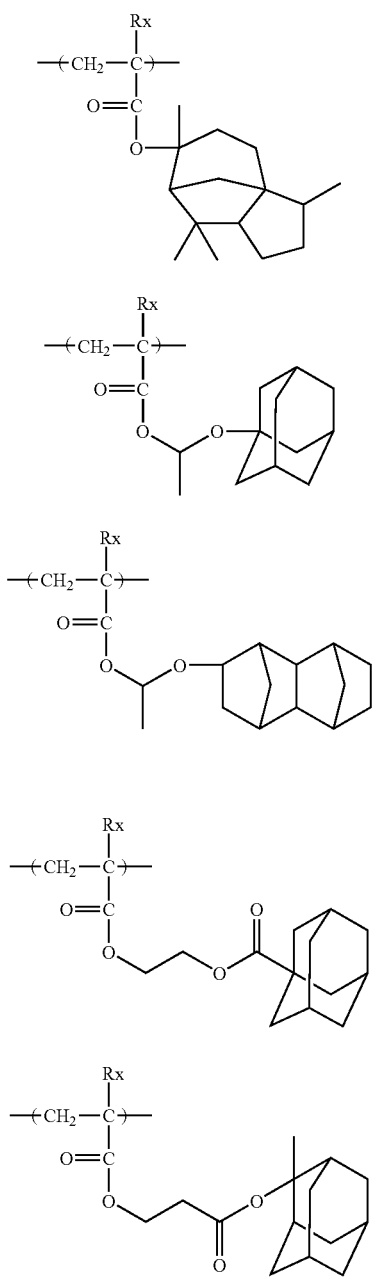

(b) Lactone Structure-Having Repeating Unit:

The lactone structure-having repeating unit is, for example, a unit having a lactone structure represented by any of the following general formula (Lc) or the following general formulae (V-1) to (V-5):

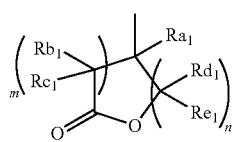

(Lc)

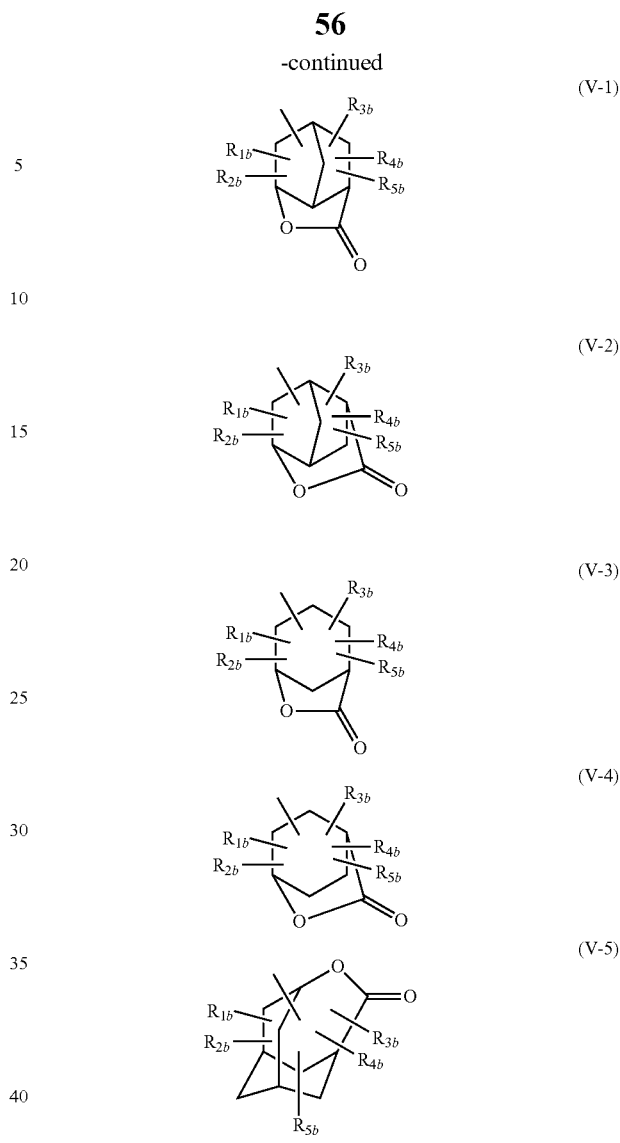

In formula (Lc), $Ra_1$, $Rb_1$, $Rc_1$, $Rd_1$ and $Re_1$ each independently represents a hydrogen atom or an alkyl group. m and n each independently represents an integer of from 0 to 3; and m+n is from 2 to 6.

In formulae (V-1) to (V-5), $R_{1b}$ to $R_{5b}$ each independently represents a hydrogen atom, an alkyl group, a cycloalkyl group, an alkoxy group, an alkoxycarbonyl group, an alkylsulfonylimino group, or an alkenyl group. Two of $R_{1b}$ to $R_{5b}$ may bond to each other to form a ring.

The alkyl group for $Ra_1$ to $Re_1$ in formula (Lc), and the alkyl group and the alkyl moiety of the alkoxy group, the alkoxycarbonyl group and the alkylsulfonylimino group for $R_{1b}$ to $R_{5b}$ in formulae (V-1) to (V-5) may be a linear or branched alkyl group, and may be substituted. Preferred examples of the substituent for the group are a hydroxyl group, a halogen atom, a carboxyl group, an alkoxy group, an acyl group, a cyano group, an acyloxy group, and a cycloalkyl group.

The repeating unit having the lactone structure-having group of any of formula (Lc) or formulae (V-1) to (V-5) is, for example, a unit represented by the following general formula (AI):

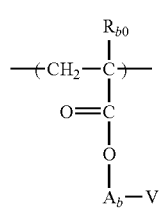

(AI)

In formula (AI), $R_{b0}$ represents a hydrogen atom, a halogen atom, or an alkyl group having from 1 to 4 carbon atoms. The alkyl group for $R_{b0}$ may be substituted. For preferred examples of the substituent for the alkyl group for $R_{b0}$, referred to are those mentioned hereinabove for the preferred examples of the substituent for the optionally-substituted alkyl group for $R_{1b}$ in formulae (V-1) to (V-5).

The halogen atom for $R_{b0}$ may includes fluorine, chlorine, bromine and iodine. $R_{b0}$ is preferably a hydrogen atom.

$A_b$ represents a single bond, or a divalent group of an ether group, an ester group, a carbonyl group, an alkylene group, or their combination.

V represents a group of formula (Lc) or formulae (V-1) to (V-5).

Specific examples of the lactone structure-having repeating unit are mentioned below, to which, however, the invention should not be limited.

(In the formulae, Rx represents H or $CH_3$.)

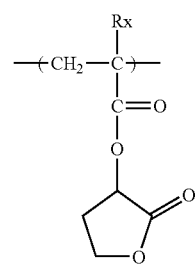
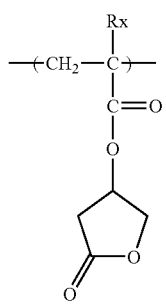
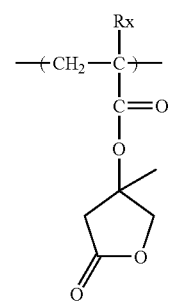
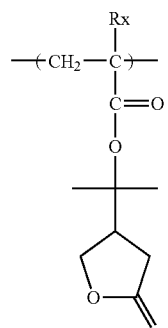
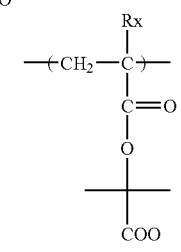
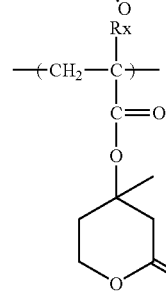
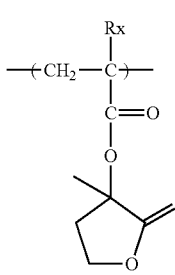

-continued

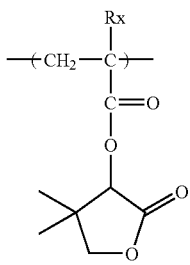
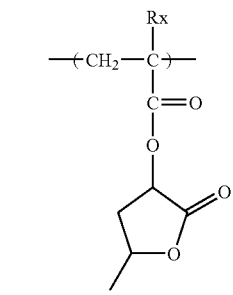
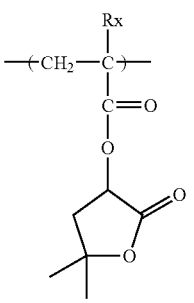
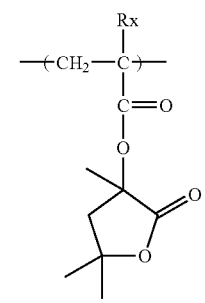
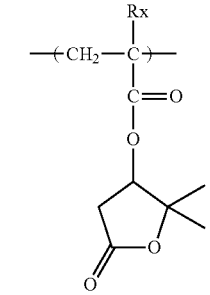
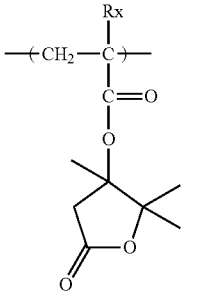
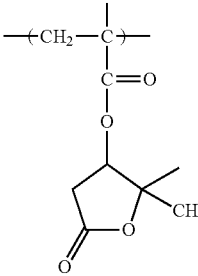
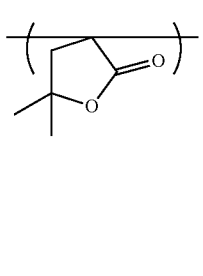
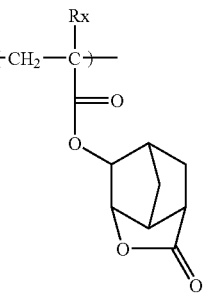
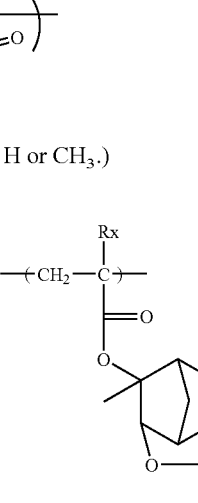

(In the formulae, Rx represents H or $CH_3$.)

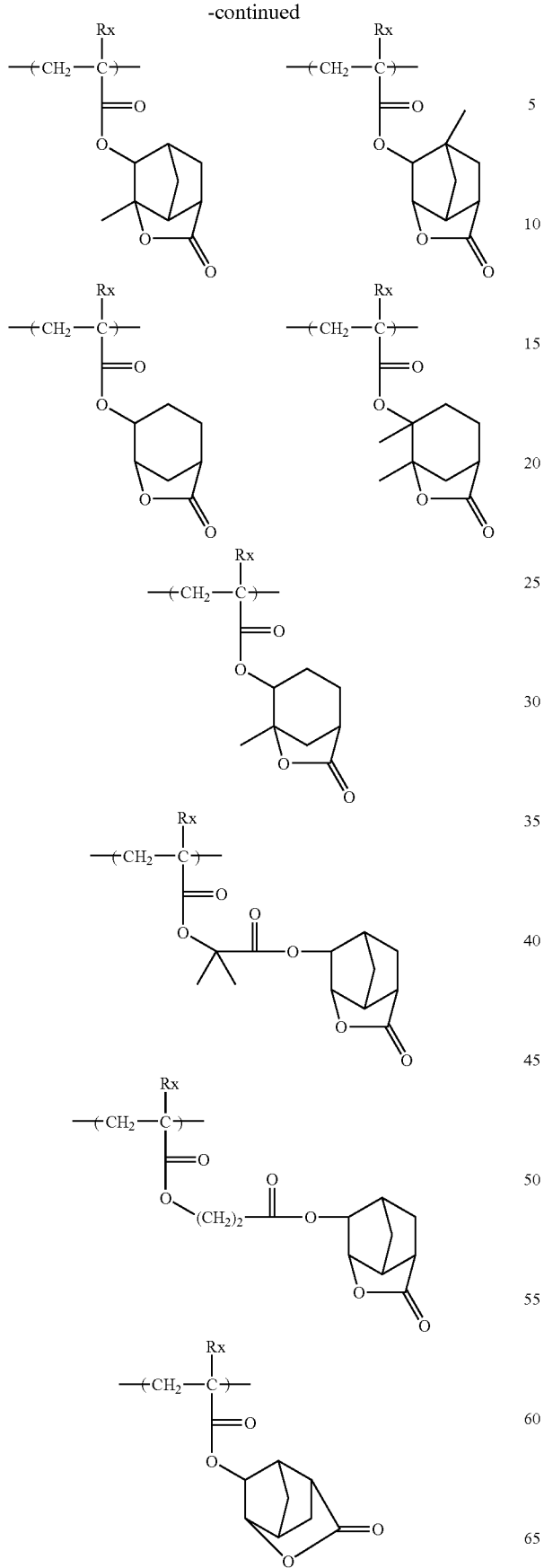
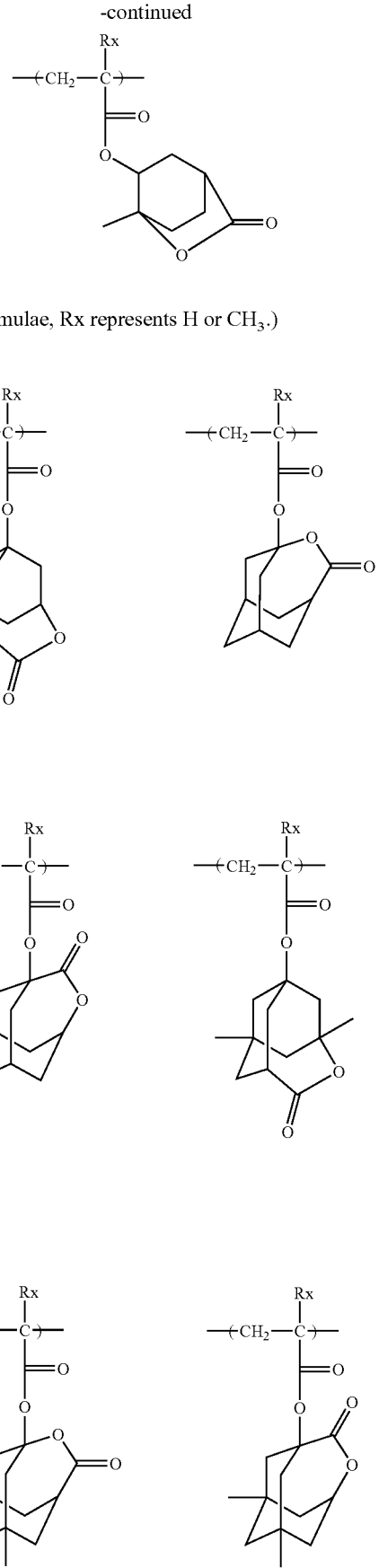
(In the formulae, Rx represents H or CH$_3$.)

-continued

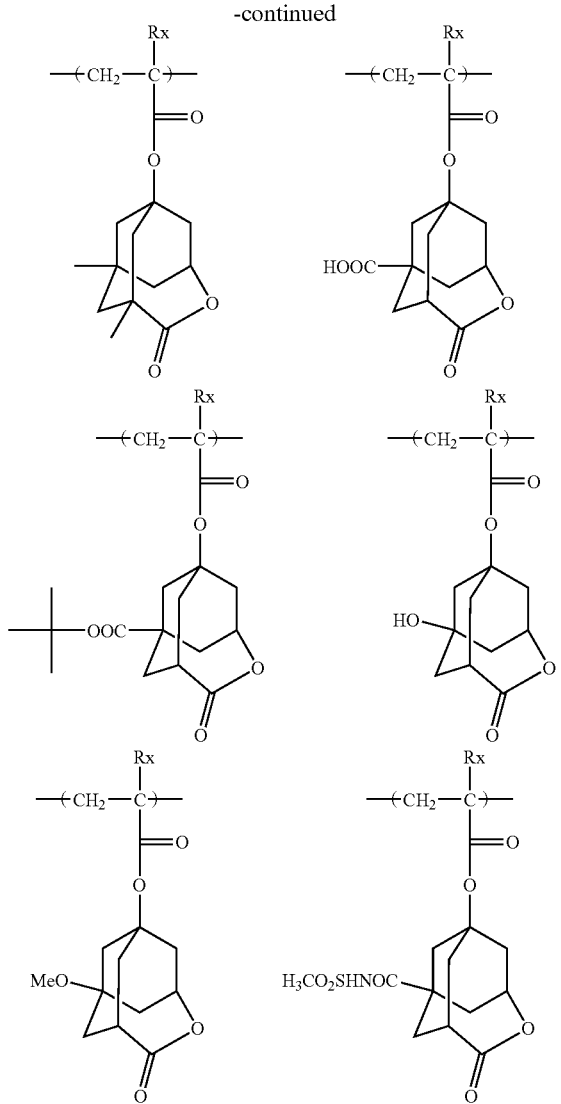

(c) Monocyclic or Polycyclic, Alicyclic Hydrocarbon Structure and Hydroxyl Group-Having Repeating Unit:

The monocyclic or polycyclic, alicyclic hydrocarbon structure and hydroxyl group-having group is, for example, adamantane skeleton-having group represented by the following general formula (VII):

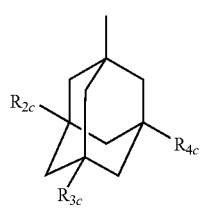

(VII)

In formula (VII), $R_{2c}$ to $R_{4c}$ each independently represents a hydrogen atom or a hydroxyl group, provided that at least one of $R_{2c}$ to $R_{4c}$ is a hydroxyl group.

The groups of formula (VII) are preferably dihydroxy or monohydroxy groups, more preferably monohydroxy groups.

Repeating unit having the group of formula (VII) is, for example, one of the following general formula (AII):

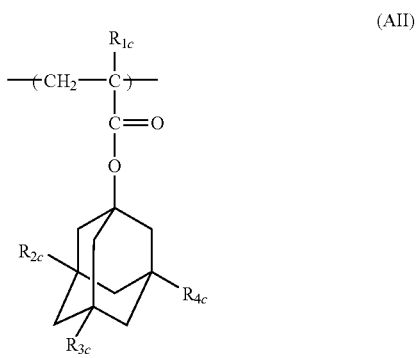

(AII)

In formula (AII), $R_{1c}$ represents a hydrogen atom or a methyl group.

$R_{2c}$ to $R_{4c}$ each independently represents a hydrogen atom or a hydroxyl group, provided that at least one of $R_{2c}$ to $R_{4c}$ is a hydroxyl group. Preferably, two of $R_{2c}$ to $R_{4c}$ are hydroxyl groups.

Specific examples of the monocyclic or polycyclic, alicyclic hydrocarbon structure and hydroxyl group-having repeating unit are mentioned below, to which, however, the invention should not be limited.

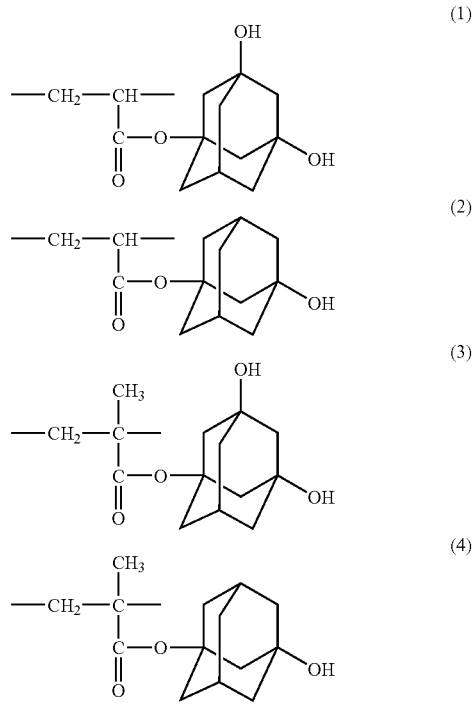

The fluorine atom-containing resin that has fluorine an atom-containing repeating unit and has a repeating unit with no fluorine atom may be copolymerized with any other comonomer in addition to the above-mentioned repeating units.

In the fluorine atom-containing resin, the total content of repeating units represented by general formulae (I) to (X) is generally from 2 to 80% by mole, preferably from 5 to 70% by mole, more preferably from 10 to 60% by mole, based on the whole polymer composition.

In the case where the fluorine atom-containing resin has repeating units represented by general formulae (I) to (III) and repeating units represented by general formulae (IV) to (X), the content of the repeating units represented by general formulae (I) to (III) is generally from 10 to 70% by mole, preferably from 20 to 60% by mole, more preferably from 30 to 50% by mole, based on the whole polymer composition.

In the case where the fluorine atom-containing resin has repeating units represented by general formulae (I) to (III) and repeating units represented by general formulae (IV) to (X), the content of the repeating units represented by general formulae (IV) to (X) is generally from 10 to 65% by mole, preferably from 15 to 60% by mole, more preferably from 20 to 40% by mole, based on the whole polymer composition.

The content of repeating units represented by general formula (XII) in the fluorine atom-containing resin is generally from 20 to 80% by mole, preferably from 30 to 70% by mole.

The content of repeating units represented by general formulae (XIII) to (XV) in the fluorine atom-containing resin is generally from 0 to 70% by mole, preferably from 10 to 60% by mole, more preferably from 20 to 50% by mole.

When the fluorine atom-containing resin has repeating units having the group of formula (A-1), then the content of the repeating units having the group of formula (A-1) in the resin may be generally from 5 to 70 mol %, but preferably from 10 to 50 mol %.

When the fluorine atom-containing resin has fluorine atom-containing repeating units and has repeating units with no fluorine atom, then the content of the fluorine atom-containing repeating units in the resin may be generally from 5 to 70 mol %, preferably from 10 to 50 mol %, more preferably from 10 to 30 mol % of the total polymer composition.

When the fluorine atom-containing resin has fluorine atom-containing repeating units and has repeating units with no fluorine atom, then the content of the repeating units with no fluorine atom in the resin may be generally from 5 to 70 mol %, preferably from 10 to 50 mol %, more preferably from 10 to 30 mol % of the total polymer composition.

In the fluorine atom-containing resin, the content of repeating units having a group which dissociates by the action of an acid to enhance solubility in an alkaline developer is generally from 5 to 70% by mole, preferably from 10 to 65% by mole, more preferably from 15 to 50% by mole, based on the whole polymer composition.

The repeating structural units examples of which were shown above each may be used alone, i.e., as the only one kind of repeating units, or may be used as a mixture of two or more thereof.

The molecular weight of the fluorine atom-containing resin to be used is in the range of preferably from 1,000 to 200,000, more preferably from 3,000 to 20,000, in terms of weight-average molecular weight. The molecular-weight distribution thereof is in the range of generally from 1 to 10, preferably from 1 to 3, more preferably from 1 to 2. The narrower the molecular-weight distribution, the better the resolution, resist shape, resist pattern side-wall smoothness, and roughness diminution.

From the standpoint of further diminishing development defects, the content of components having a molecular weight of 1,000 or lower in the fluorine atom-containing resin is preferably reduced to 15% by weight or lower, preferably 10% by weight or lower, more preferably 8% by weight or lower.

The diminution of low-molecular components can be accomplished by a fractional treatment in which a resin obtained by a polymerization reaction is dissolved in a good solvent and a poor solvent is added to the solution to precipitate high-molecular components.

The amount of the fluorine atom-containing resin to be added is in the range of generally from 50 to 100% by weight, preferably from 60 to 98% by weight, more preferably from 65 to 95% by weight, based on all solid components of the composition.

In the invention, the compound which generates an acid upon irradiation with an actinic ray is incorporated in an amount of from 5 to 20 parts by weight per 100 parts by weight of the fluorine atom-containing resin. The amount of the compound per 100 parts by weight of the fluorine atom-containing resin is more preferably from 5 to 16 parts by weight, even more preferably from 6 to 15 parts by weight, most preferably from 7 to 12 parts by weight. By incorporating the compound generating an acid upon irradiation with an actinic ray in an amount of from 5 to 20 parts by weight per 100 parts by weight of the fluorine atom-containing resin, line edge roughness can be diminished while attaining high sensitivity and a rectangular pattern profile can be obtained.

[3] (C) Fluorochemical and/or Silicone Surfactant

The positive photosensitive composition of the invention preferably further contains (C) any one of or two or more of fluorochemical and/or silicone surfactants (fluorochemical surfactants, silicone surfactants, and surfactants containing both fluorine atoms and silicon atoms).

When the positive photosensitive composition of the invention contains the surfactant (C), it can show satisfactory sensitivity and resolution when irradiated with an exposure light having a wavelength of 250 nm or shorter, especially 220 nm or shorter, and give a resist pattern having satisfactory adhesion and reduced in development defects.

Examples of those surfactants (C) include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene)acrylate (or methacrylate), a copolymer of an acrylate (or methacrylate) having a $C_6F_{13}$ group with poly(oxyethylene)acrylate (or methacrylate) and poly(oxypropylene)acrylate (or methacrylate), a copolymer of an acrylate (or methacrylate) having a $C_8F_{17}$ group with a poly(oxyalkylene)acrylate (or methacrylate), and a copolymer of an acrylate (or methacrylate) having a $C_8F_{17}$ group with poly(oxyethylene)acrylate (or methacrylate) and poly(oxypropylene)acrylate (or methacrylate).

The amount of the surfactant (C) to be used is preferably from 0.0001 to 2% by weight, more preferably from 0.001 to 1% by weight, based on the total amount of the positive photosensitive composition (excluding the solvent).

[4] (D) Basic Compound

The positive photosensitive composition of the invention preferably contains a basic composition (D) for the purpose of diminishing performance changes with the lapse of time from exposure to heating.

Preferred examples thereof include structures represented by the following formulae (A) to (E).

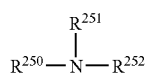
(A)

In formula (A), $R^{250}$, $R^{251}$, and $R^{252}$ each independently are a hydrogen atom, an alkyl group having 1 to 20 carbon atoms, a cycloalkyl group having 3 to 20 carbon atoms, or an aryl group having 6 to 20 carbon atoms, provided that $R^{250}$ and $R^{251}$ may be bonded to each other to form a ring. The alkyl, cycloalkyl, and aryl groups may be unsubstituted or may have one or more substituents. The alkyl or cycloalkyl group having one or more substituents preferably is an aminoalkyl group having 1 to 20 carbon atoms, aminocycloalkyl group having 3 to 20 carbon atoms, hydroxyalkyl group having 1 to 20 carbon atoms, or hydroxycycloalkyl group having 3 to 20 carbon atoms.

Those alkyl groups each may contain an oxygen, sulfur, or nitrogen atom in the alkyl chain.

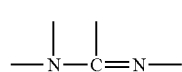
(B)

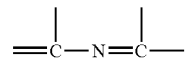
(C)

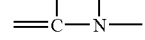
(D)

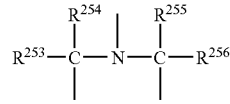
(E)

(In the formulae, $R^{253}$, $R^{254}$, $R^{255}$, and $R^{256}$ each independently represent an alkyl group having 1 to 6 carbon atoms.)

Preferred compounds include substituted or unsubstituted guanidine, substituted or unsubstituted aminopyrrolidine, substituted or unsubstituted pyrazole, substituted or unsubstituted pyrazoline, substituted or unsubstituted piperazine, substituted or unsubstituted aminomorpholine, substituted or unsubstituted aminoalkylmorpholines, and substituted or unsubstituted piperidine. More preferred compounds include compounds having an imidazole structure, diazabicyclo structure, onium hydroxide structure, onium carboxylate structure, trialkylamine structure, aniline structure, or pyridine structure, alkylamine derivatives having a hydroxyl group and/or ether bond, and aniline derivatives having a hydroxyl group and/or ether bond.

Examples of the compounds having an imidazole structure include imidazole, 2,4,5-triphenylimidazole, and benzimidazole. Examples of the compounds having a diazabicyclo structure include 1,4-diazabicyclo[2.2.2]octane, 1,5-diazabicyclo[4.3.0]non-5-ene, and 1,8-diazabicyclo[5.4.0]undec-7-ene. Examples of the compounds having an onium hydroxide structure include triarylsulfonium hydroxides, phenacylsulfonium hydroxide, and sulfonium hydroxides having a 2-oxoalkyl group, and specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compounds having an onium carboxylate structure are those compounds having an onium hydroxide structure in which the anion part has been replaced by a carboxylate, and examples thereof include acetates, adamantane-1-carboxylates, and perfluoroalkylcarboxylates. Examples of the compounds having a trialkylamine structure include tri(n-butyl)amine and tri(n-octyl)amine. Examples of the aniline compounds include 2,6-diisopropylaniline and N,N-dimethylaniline. Examples of the alkylamine derivatives having a hydroxyl group and/or ether bond include ethanolamine, diethanolamine, triethanolamine, and tris(methoxyethoxyethyl)amine. Examples of the aniline derivatives having a hydroxyl group and/or ether bond include N,N-bis(hydroxyethyl)aniline.

Those basic compounds may be used alone or in combination of two or more thereof. The amount of the basic compounds to be used is generally from 0.001 to 10% by weight, preferably from 0.01 to 5% by weight, based on the solid components of the positive photosensitive composition. From the standpoint of sufficiently obtaining the effect of the addition, the amount of the compounds is preferably 0.001% by weight or larger. From the standpoints of sensitivity and the developability of unexposed areas, the amount of the compounds is preferably 10% by weight or smaller.

[5] Organic Solvent

The positive photosensitive composition of the invention to be used is prepared by dissolving the ingredients described above in a given organic solvent.

Examples of usable organic solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the invention, such organic solvents may be used alone or as a mixture of two or more thereof. It is, however, preferred to use a mixed solvent prepared by mixing at least one solvent containing one or more hydroxyl groups in the structure with at least one solvent containing no hydroxyl group. Use of this mixed solvent is effective in diminishing particle generation during resist fluid storage.

Examples of the solvent containing one or more hydroxyl groups include ethylene glycol, ethylene glycol monomethyl ether, ethylene glycol monoethyl ether, propylene glycol, propylene glycol monomethyl ether, propylene glycol monoethyl ether, and ethyl lactate. Especially preferred of these are propylene glycol monomethyl ether and ethyl lactate.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Especially preferred of these are propylene glycol monomethyl ether acetate, ethyl ethoxypropionate, 2-heptanone, γ-butyrolactone, cyclohexanone, and butyl acetate. Most preferred are propylene glycol monomethyl ether acetate, ethyl ethoxypropionate, and 2-heptanone.

The proportion (by weight) of the solvent containing one or more hydroxyl groups to the solvent containing no hydroxyl group is generally from 1/99 to 99/1, preferably from 10/90 to 90/10, more preferably from 20/80 to 60/40. A mixed solvent in which the content of the solvent containing no hydroxyl group is 50% by weight or higher is especially preferred from the standpoint of evenness of application.

In the production of precision integrated-circuit elements or in similar processes, the step of resist pattern formation on a substrate can be conducted in the following manner. The positive photosensitive composition of the invention is applied to a substrate (e.g., a silicon substrate coated with silicon dioxide or a transparent substrate such as a glass substrate or ITO substrate). The resultant coating is irradiated with an actinic ray using a drawing apparatus and then subjected to heating, development, rinsing, and drying. Thus, a satisfactory resist pattern can be formed.

The thickness of the resist film to be formed by applying the positive photosensitive composition of the invention on a substrate and drying the coating is preferably from 50 to 200 nm. The resist film regulated so as to have a thickness of from 50 to 200 nm can have improved dry-etching resistance and pattern profile and have a heightened transmittance.

The thickness of a resist film can be regulated by changing the solid concentration in the composition, i.e., the concentration of the ingredients other than the solvent. The solid concentration in the composition is preferably from 5 to 18% by weight, more preferably from 7 to 15% by weight, especially preferably from 9 to 14% by weight.

As an alkaline developer for the positive photosensitive composition of the invention can be used an aqueous solution of an alkali such as an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide, or choline, or a cyclic amine, e.g., pyrrole or piperidine. It is also possible to use a developing solution prepared by adding an appropriate amount of an alcohol, e.g., isopropyl alcohol, or a surfactant, e.g., a nonionic one, to an aqueous solution of any of those alkalis.

Preferred of those alkaline developers are aqueous solutions of quaternary ammonium salts. More preferred is an aqueous solution of tetramethyl ammonium hydroxide or choline.

The alkali concentration of the alkaline developer is generally from 0.1 to 20% by weight.

The pH of the alkaline developer is generally from 10.0 to 15.0.

EXAMPLES

The invention will be explained below in greater detail by reference to Examples, but the contents of the invention should not be construed as being limited by these Examples.

<Fluorine Atom-Containing Resins>

The structures of the fluorine atom-containing resins (FII-1) to (FII-40) used in the Examples are shown below.

The weight-average molecular weights and other properties of the fluorine atom-containing resins (FII-1) to (FII-40) are shown in Tables 1 and 2.

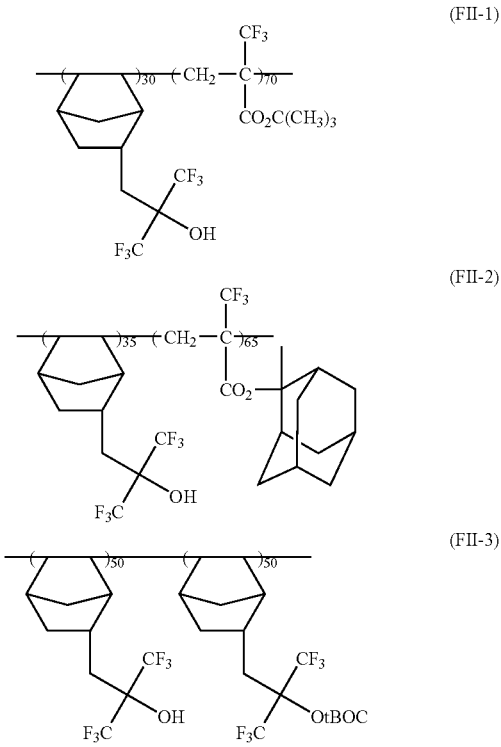

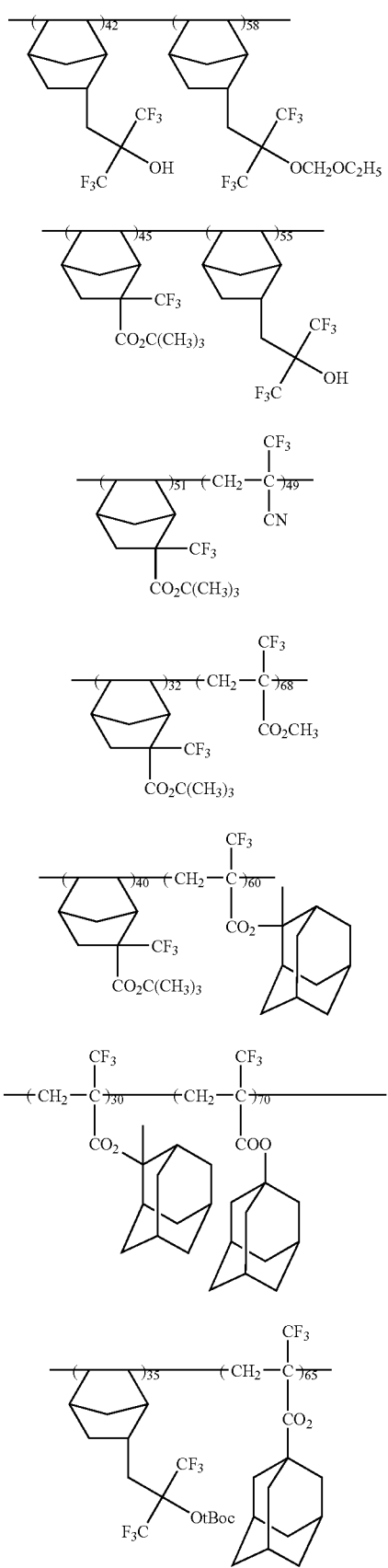
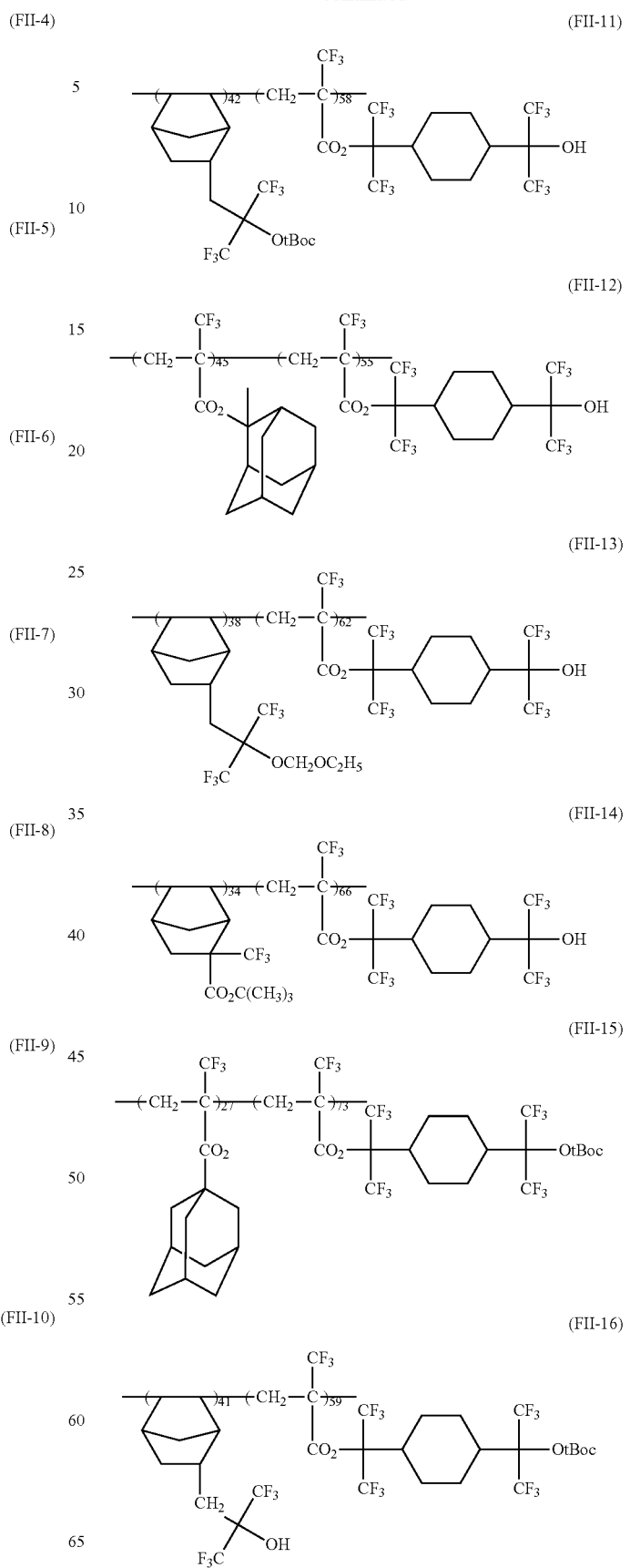

-continued
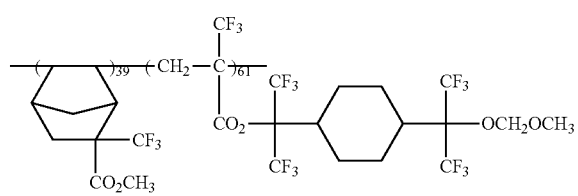 (FII-17)
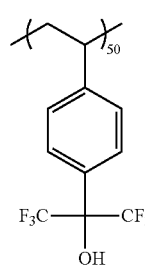 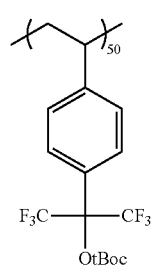 (FII-18)
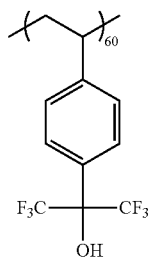 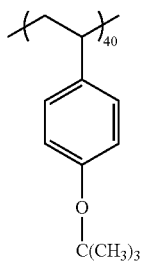 (FII-19)
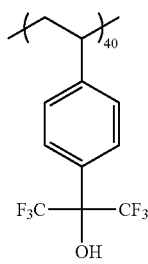 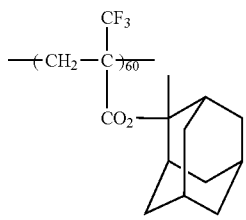 (FII-20)
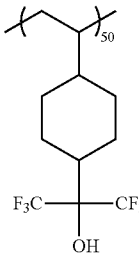 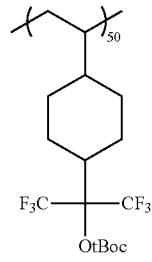 (FII-21)
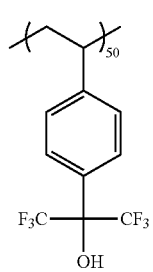 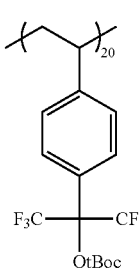 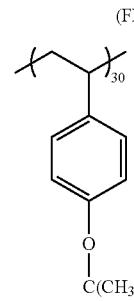 (FII-22)
-continued
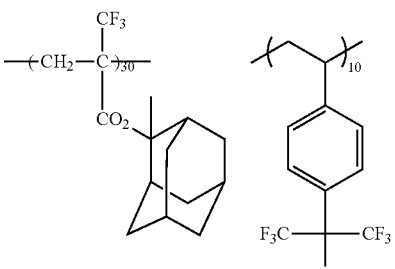 (FII-23)
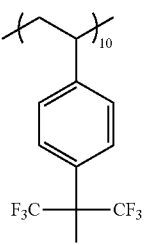 (FII-24)
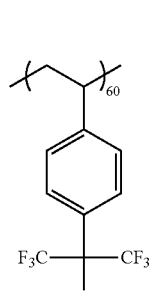 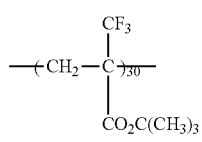 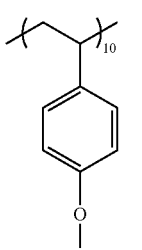 (FII-25)
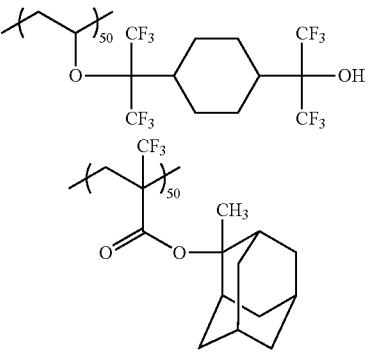 (FII-26)
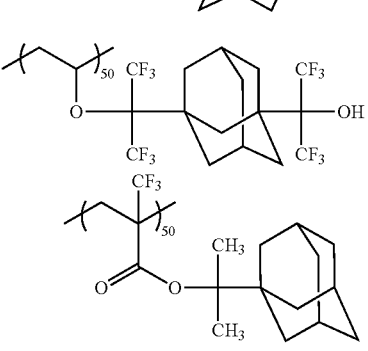 (FII-27)
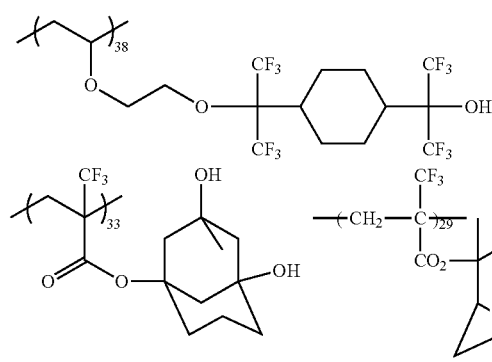

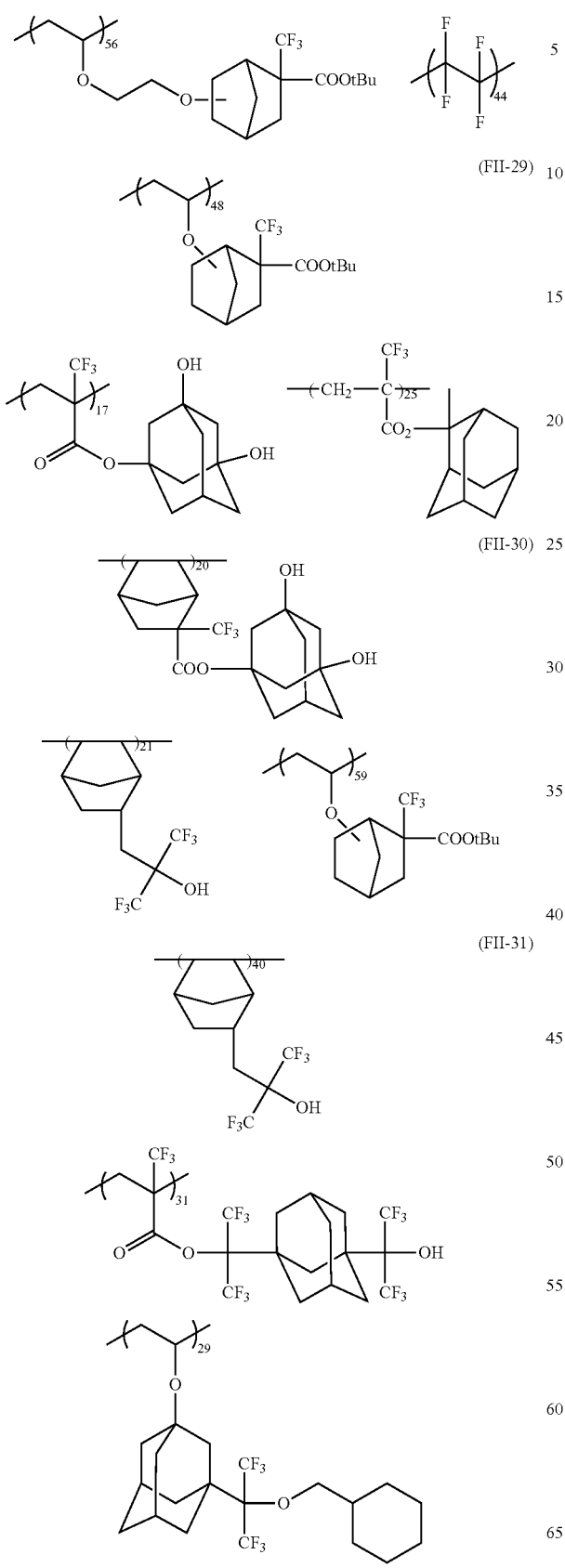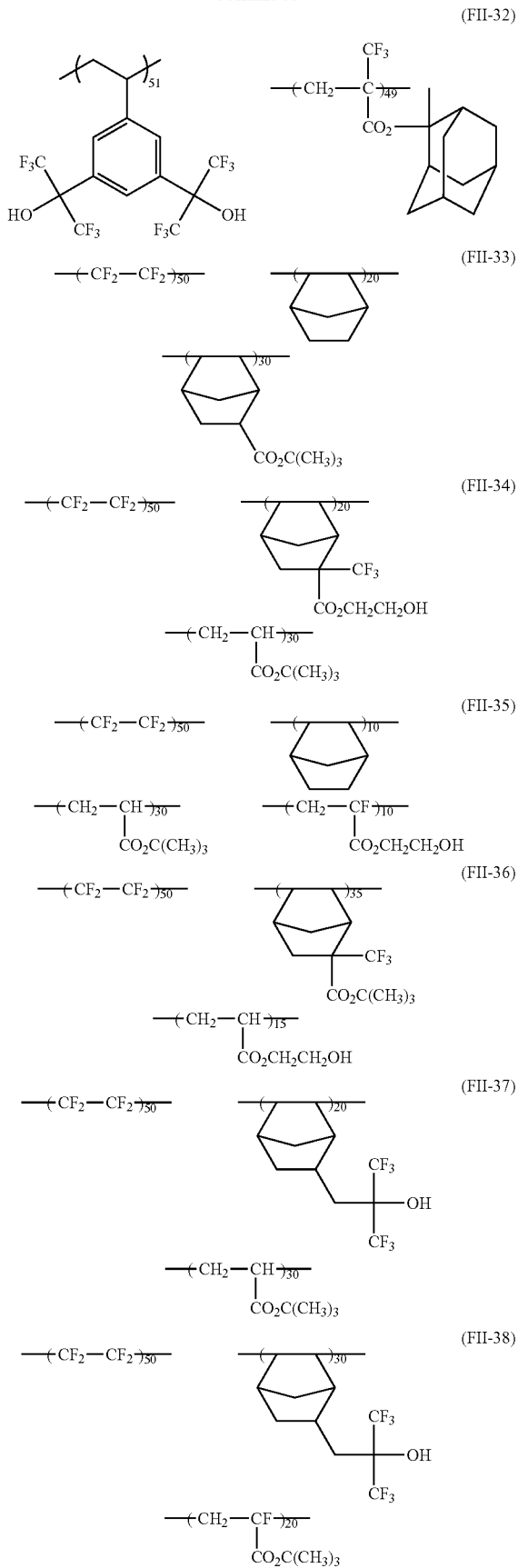

-continued

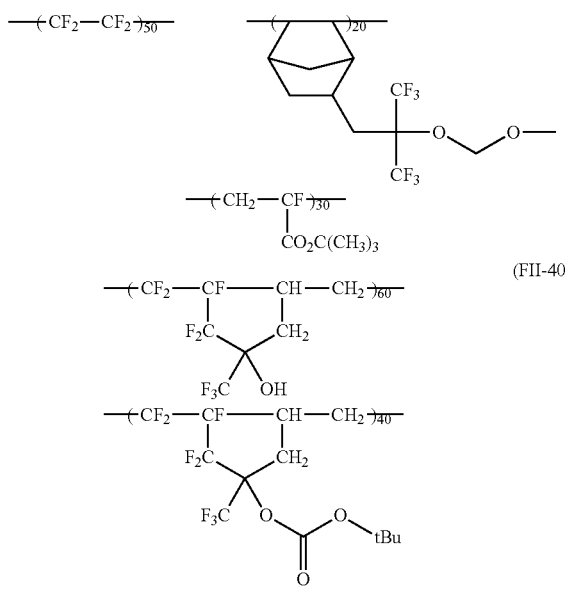

TABLE 1

| Resin | Weight-average molecular weight Mw | Dispersity ratio | Content of oligomers having molecular weight of 1,000 or lower |
|---|---|---|---|
| (FII-1) | 15200 | 1.45 | 5 |
| (FII-2) | 24000 | 1.75 | 8 |
| (FII-3) | 18200 | 1.85 | 7 |
| (FII-4) | 16500 | 1.46 | 6 |
| (FII-5) | 9500 | 1.58 | 8 |
| (FII-6) | 19500 | 2.02 | 8 |
| (FII-7) | 6500 | 1.85 | 7 |
| (FII-8) | 28400 | 1.68 | 9 |
| (FII-9) | 28600 | 1.44 | 5 |
| (FII-10) | 12800 | 1.65 | 8 |
| (FII-11) | 16800 | 1.68 | 9 |
| (FII-12) | 28400 | 1.58 | 6 |
| (FII-13) | 19800 | 1.69 | 8 |
| (FII-14) | 8700 | 1.95 | 8 |
| (FII-15) | 15200 | 1.46 | 7 |
| (FII-16) | 19500 | 1.65 | 4 |
| (FII-17) | 16900 | 1.42 | 8 |
| (FII-18) | 15900 | 1.85 | 9 |
| (FII-19) | 15000 | 1.55 | 4 |
| (FII-20) | 12500 | 1.88 | 8 |
| (FII-21) | 25000 | 1.68 | 9 |
| (FII-22) | 16000 | 1.54 | 7 |
| (FII-23) | 14600 | 1.95 | 5 |
| (FII-24) | 17500 | 1.48 | 5 |
| (FII-25) | 16500 | 1.52 | 6 |
| (FII-26) | 14600 | 1.63 | 5 |

TABLE 2

| Resin | Weight-average molecular weight Mw | Dispersity ratio |
|---|---|---|
| (FII-27) | 8300 | 1.55 |
| (FII-28) | 8300 | 1.62 |
| (FII-29) | 8000 | 1.52 |
| (FII-30) | 9200 | 1.71 |
| (FII-31) | 10200 | 1.47 |
| (FII-32) | 7900 | 1.35 |
| (FII-33) | 6800 | 1.60 |
| (FII-34) | 7400 | 1.59 |
| (FII-35) | 8300 | 1.70 |
| (FII-36) | 4800 | 1.55 |
| (FII-37) | 4700 | 1.51 |
| (FII-38) | 6400 | 1.69 |
| (FII-39) | 9600 | 1.70 |
| (FII-40) | 4600 | 1.68 |

Examples 1 to 20 and Comparative Examples 1 and 2

Resist Preparation

The ingredients shown in Table 3 were dissolved in a solvent to prepare a solution having a solid concentration of 12% by weight. This solution was filtered through a 0.1-μm polytetrafluoroethylene filter to prepare a positive resist solution.

TABLE 3

| | Ingredient A (g) | Ingredient B (g) | Basic compound (g) | Surfactant (0.03 g) | Solvent (weight ratio) | Sensitivity (mJ/cm²) | Line edge roughness (nm) | Profile |
|---|---|---|---|---|---|---|---|---|
| Ex. 1 | z38 (0.5) | FII-1 (10) | DIA (0.05) | W-1 | A1 (100) | 5.2 | 8.6 | rectangular |
| Ex. 2 | z6 (0.3) z21 (0.3) | FII-2 (10) | TPI (0.04) | W-1 | A1/B2 (70/30) | 2.8 | 9.0 | rectangular |
| Ex. 3 | z15 (0.1) z40 (0.4) | FII-8 (5) FII-33 (5) | TOA (0.04) | W-2 | A1/A3 (95/5) | 6.5 | 7.8 | rectangular |
| Ex. 4 | z38 (0.4) z52 (0.4) | FII-11 (5) FII-34 (5) | HEP (0.06) | W-2 | A1/B3 (70/30) | 3.2 | 7.3 | rectangular |
| Ex. 5 | z54 (0.7) | FII-12 (3) FII-35 (7) | DBN (0.05) | W-3 | A1/B2 (60/40) | 3.0 | 8.0 | rectangular |

TABLE 3-continued

| | Ingredient A (g) | Ingredient B (g) | Basic compound (g) | Surfactant (0.03 g) | Solvent (weight ratio) | Sensitivity (mJ/cm$^2$) | Line edge roughness (nm) | Profile |
|---|---|---|---|---|---|---|---|---|
| Ex. 6 | z44 (0.6) | FII-13 (10) | DIA (0.04) PEA (0.04) | W-1 | A1/B1 (55/45) | 3.8 | 8.7 | rectangular |
| Ex. 7 | z14 (0.2) z51 (0.5) | FII-14 (7) FII-39 (3) | TPA (0.04) | W-2 | A1/B2 (60/40) | 2.9 | 8.2 | rectangular |
| Ex. 8 | z46 (0.5) z34 (0.5) | FII-16 (10) | TPSA (0.1) | W-4 | A1/B2 (65/35) | 2.1 | 9.2 | rectangular |
| Ex. 9 | z13 (0.6) Z27 (0.6) | FII-18 (5) FII-1 (5) | TBAH (0.03) | W-1 | A1/B2 (70/30) | 4.8 | 9.1 | rectangular |
| Ex. 10 | Z1 (0.2) Z37 (0.4) | FII-20 (5) FII-5 (5) | TMEA (0.05) | W-4 | A1/B1 (55/45) | 3.7 | 8.8 | rectangular |
| Ex. 11 | Z49 (0.8) | FII-27 (8) FII-32 (2) | HAP (0.05) | W-1 | A1 (100) | 2.6 | 8.9 | rectangular |
| Ex. 12 | Z18 (0.5) Z31 (0.5) | FII-28 (3) FII-27 (7) | DBN (0.04) | W-2 | A2/B4 (45/55) | 7.5 | 7.9 | rectangular |
| Ex. 13 | Z38 (0.4) Z41 (0.8) | FII-29 (5) FII-3 (5) | DIA (0.01) PEA (0.01) | W-1 | A1/B2 (70/30) | 2.2 | 9.0 | rectangular |
| Ex. 14 | Z5 (0.6) Z38 (0.6) | FII-30 (8) FII-31 (2) | PEA (0.05) | W-1 | A1/B1 (60/40) | 7.7 | 8.6 | rectangular |
| Ex. 15 | Z6 (0.7) Z21 (0.7) | FII-38 (10) | TPI (0.04) | W-1 | A1/B2 (70/30) | 2.4 | 7.0 | rectangular |
| Ex. 16 | Z15 (0.3) Z40 (0.4) | FII-40 (8) FII-1 (2) | TOA (0.04) | W-2 | A1/A3 (95/5) | 7.8 | 7.6 | rectangular |
| Ex. 17 | Z38 (0.4) Z52 (0.4) | FII-19 (3) FII-28 (7) | HEP (0.06) | W-2 | A1/B3 (80/20) | 2.8 | 8.0 | rectangular |
| Ex. 18 | Z54 (0.7) | FII-11 (5) FII-3 (5) | DBN (0.03) | W-3 | A1/B2 (70/30) | 3.0 | 8.7 | rectangular |
| Ex. 19 | Z44 (0.8) | FII-32 (5) FII-30 (5) | DIA (0.04) PEA (0.04) | W-1 | A1/B1 (60/40) | 3.1 | 9.1 | rectangular |
| Ex. 20 | Z14 (0.3) Z51 (0.4) | FII-5 (5) FII-28 (5) | TPA (0.04) | W-2 | A1/B2 (60/40) | 3.7 | 7.4 | rectangular |
| Comp. Ex. 1 | Z38 (0.4) | FII-1 (10) | DIA (0.05) | W-1 | A1 (100) | 8.5 | 13.4 | rectangular |
| Comp. Ex. 2 | Z38 (2.2) | FII-1 (10) | DIA (0.05) | W-1 | A1 (100) | 2.1 | 11.2 | tapered, film thickness loss |

The abbreviations used in Table 3 are as follows.
DBN: 1,5-diazabicyclo[4.3.0]non-5-ene
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripentylamine
TOA: tri-n-octylamine
HAP: hydroxyantipyrine
TBAH: tetrabutylammonium hydroxide
TMEA: tris(methoxyethoxyethyl)amine
PEA: N-phenyldiethanolamine W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
W-3: polysiloxane polymer KP-341 (manufactured by Shin-Etsu Chemical Co., Ltd.) (silicone)
W-4: Troysol S-366 (manufactured by Troy Chemical Co., Ltd.)
A1: propylene glycol monomethyl ether acetate
A2: ethyl ethoxypropionate
A3: γ-butyrolactone
B1: propylene glycol monomethyl ether
B2: cyclohexanone
B3: 2-heptanone
B4: ethyl lactate <Resist Evaluation>

Each positive resist solution was applied with a spin coater to a silicon wafer treated with hexamethyldisilazane. The coating was dried by heating at 120° C. for 90 seconds with a vacuum contact type hot plate to obtain a resist film having a thickness of 100 nm.

The resist film obtained was pattern-wise exposed with an illuminator having a wavelength of 157 nm. Immediately after the exposure, the resist film was heated on a hot plate at 120° C. for 90 seconds. This resist film was developed with a 2.38% by weight aqueous solution of tetramethylammonium hydroxide for 60 seconds and then rinsed with pure water. The pattern obtained was evaluated by the following methods.

[Profile/Sensitivity]

The shapes of sections of the pattern obtained were examined with a scanning electron microscope. The minimum energy required for forming 0.1-μm lines (line/space=1/1) with satisfactory resolution was taken as sensitivity.

[Line Edge Roughness]

In the line pattern (line width, 100 nm; line/space=1/1), length-direction edges in an area of 5 μm were examined with a length-measuring SEM (S-8840, manufactured by Hitachi, Ltd.) to measure the distance from the standard line where each edge was to be present. This measurement was made on 50 points. A standard deviation was determined and 3σ was calculated. The smaller the value thereof, the better the performance.

The results of the evaluations are shown in Table 3.

It is apparent from Table 3 that the positive photosensitive compositions of the invention have high sensitivity and are satisfactory in line edge roughness diminution and profile.

Examples 21 to 30, and Comparative Example 3

Resist Preparation

The ingredients shown in Table 4 were dissolved in a solvent to prepare a solution having a solid concentration of 6% by mass. This solution was filtered through a 0.1-μm polyethylene filter to prepare a positive resist solution. Thus prepared, the positive resist solution was evaluated according to the methods mentioned below, and the results are shown in Table 4.

TABLE 4

| | Ingredient A (g) | Ingredient B (10 g) | Basic Compound (g) | Surfactant (0.02 g) | Solvent | Sensitivity (mJ/cm$^2$) | Line Edge Roughness (nm) | Profile |
|---|---|---|---|---|---|---|---|---|
| Ex. 21 | z2 (0.6) | FII-41 | N-1 (0.03) | W-1 | SL-2/4 = 60/40 | 29 | 4.9 | rectangular |
| Ex. 22 | z3 (0.7) | FII-42 | N-2 (0.01) | W-2 | SL-1/3 = 60/40 | 28 | 5.3 | rectangular |
| Ex. 23 | z5 (0.6) | FII-43 | N-3 (0.025) | W-3 | SL-1/2 = 95/5 | 30 | 5.5 | rectangular |
| Ex. 24 | z14 (0.7) | FII-44 | N-4 (0.02) | W-4 | SL-2/4 = 80/20 | 27 | 5.5 | rectangular |
| Ex. 25 | z38 (0.35) z50 (0.35) | FII-45 | N-2 (0.01) N-3 (0.01) | W-4 | SL-1/2 = 70/30 | 29 | 5.1 | rectangular |
| Ex. 26 | z55 (0.7) | FII-46 | N-6 (0.03) | W-4 | SL-2/4 = 40/60 | 26 | 5.6 | rectangular |
| Ex. 27 | z56 (0.4) z40 (0.4) | FII-47 | N-7 (0.01) | W-1 | SL-2/4 = 60/40 | 30 | 5.2 | rectangular |
| Ex. 28 | z14 (0.7) | FII-48 | N-1 (0.02) | W-1 | SL-1/2 = 70/30 | 27 | 5.1 | rectangular |
| Ex. 29 | z44 (0.6) | FII-49 | N-2 (0.02) | W-1 | SL-2/3 = 90/10 | 29 | 5.1 | rectangular |
| Ex. 30 | z58 (0.6) | FII-50 | N-3 (0.02) | W-4 | SL-2/4 = 60/40 | 30 | 5.1 | rectangular |
| Comp. Ex. 3 | z2 (0.6) | C1 | N-1 (0.03) | W-1 | SL-2/4 = 60/40 | 34 | 9.8 | rectangular |

The structure, the weight-average molecular weight and the degree of dispersion of the fluorine atom-containing resins (FII-41) to (FII-50) and the comparative resin (C1) in formula 4 are shown below.

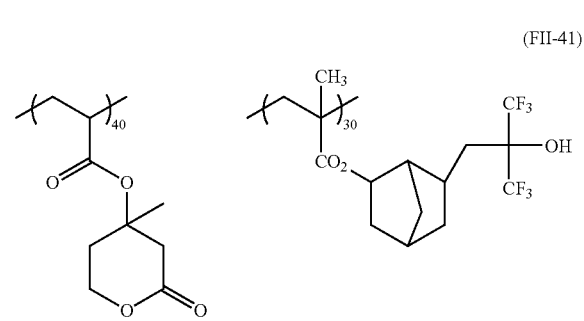

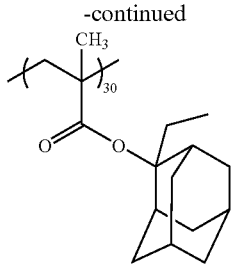
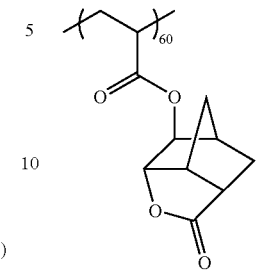
(FII-42)
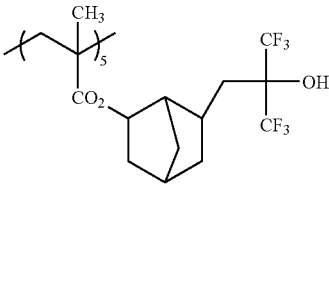
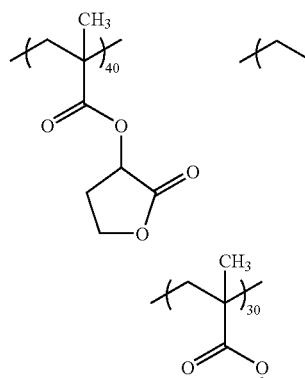
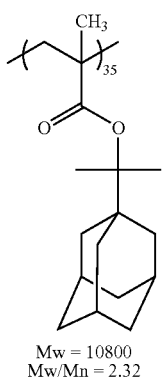
(FII-44)
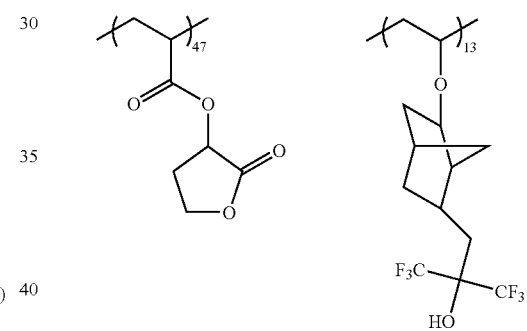
Mw = 10800
Mw/Mn = 2.32
(FII-43)
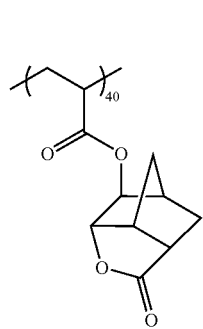
(FII-45)
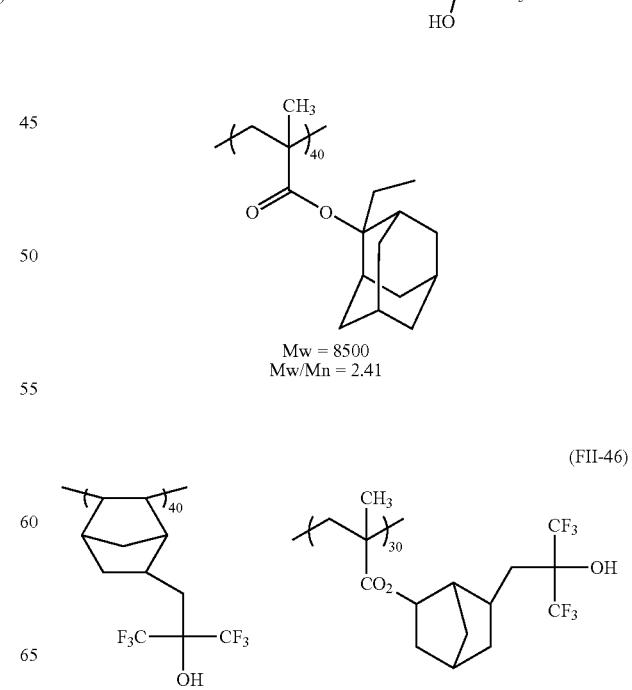
Mw = 8500
Mw/Mn = 2.41
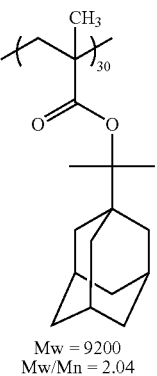
(FII-46)
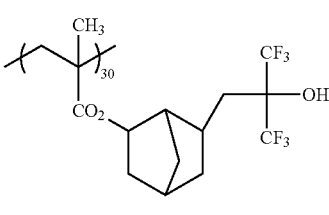

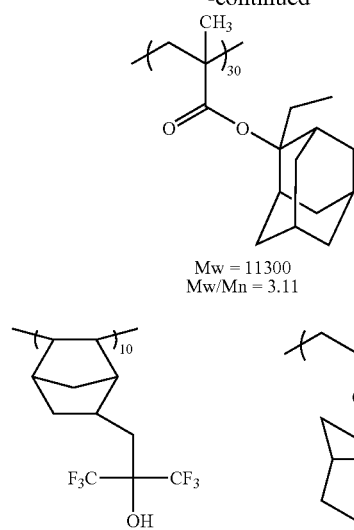
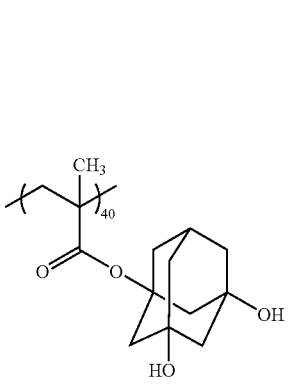
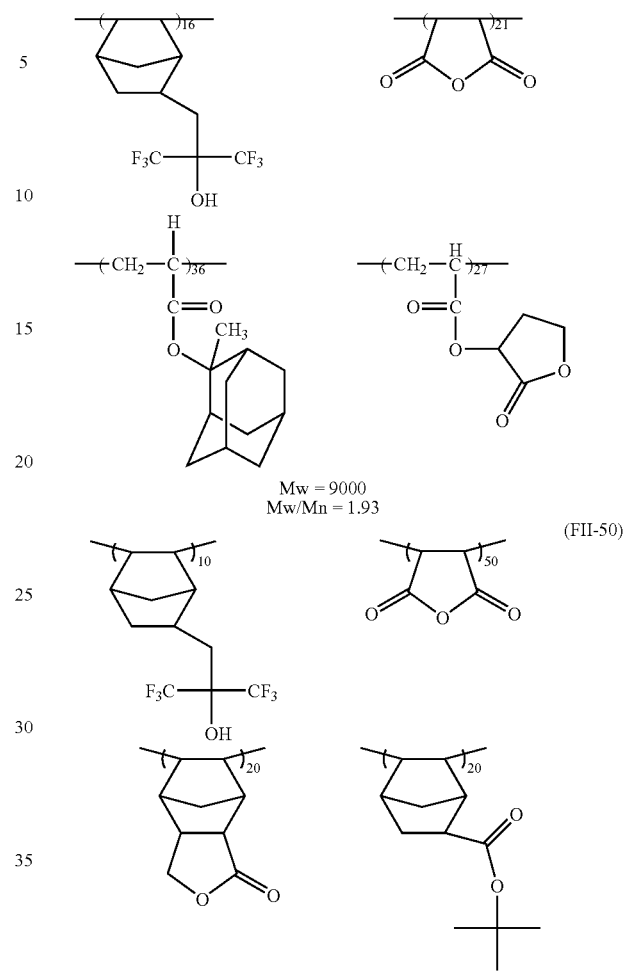
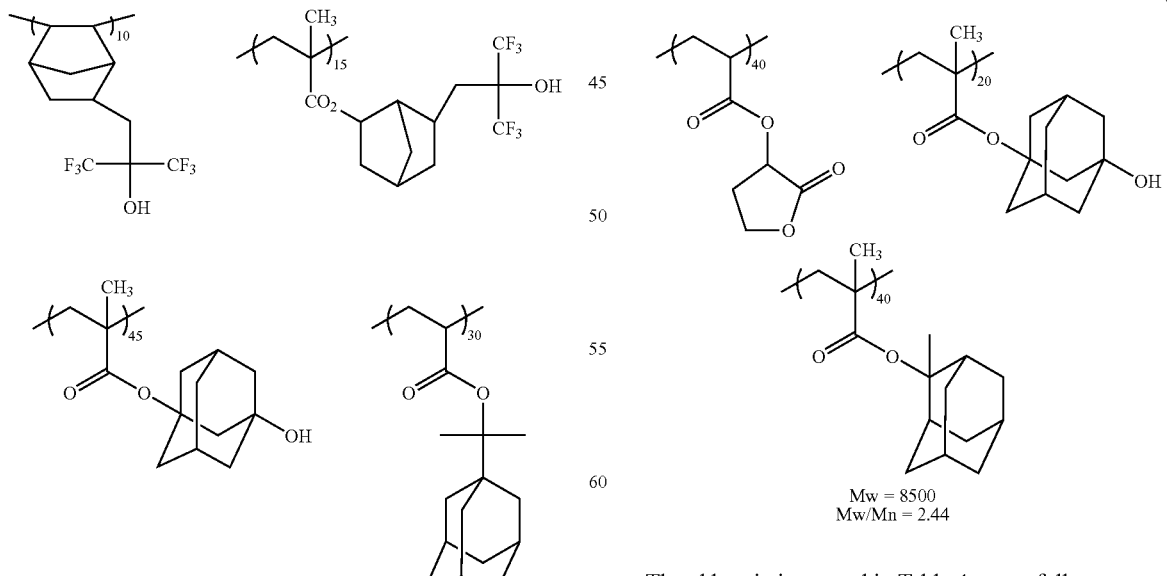
The abbreviations used in Table 4 are as follows.
N-1: N,N-dibutylaniline
N-2: N,N-dipropylaniline
N-3: N,N-dihydroxyethylaniline N-4: 2,4,5-Triphenylimidazole
N-5: 2,6-Diisopropylaniline
N-6: Hydroxyantipyrine
N-7: Tributylamine
W-1: Megafac F176 (from Dai-Nippon Ink Chemical Industry) (fluorine-containing surfactant)
W-2: Megafac R08 (from Dai-Nippon Ink Chemical Industry) (fluorine-containing silicone-based surfactant)
W-3: Polysiloxane Polymer KP-341 (from Shin-etsu Chemical Industry) (silicone-based surfactant)
W-4: Troy Sol S-366 (from Troy Chemical)
SL-1: Cyclopentanone
SL-2: Cyclohexanone
SL-3: 2-Methylcyclohexanone
SL-4: Propylene glycol monomethyl ether acetate
SL-5: Ethyl acetate
SL-6: Propylene glycol monomethyl ether
SL-7: 2-Heptanone
SL-8: γ-butyrolactone
SL-9: Propylene carbonate In Table 4, the ratio of multiple solvents is by mass.

<Resist Evaluation>

Brewer Science's ARC29A was uniformly applied with a spin coater to a silicon wafer to a thickness of 78 nm, and dried under heat at 205° C. for 60 seconds to form an antireflection layer thereon. Next, each positive resist solution was, immediately after its preparation, applied with a spin coater to the silicon wafer, and dried at 115° C. for 90 seconds (PB) to form a 170-nm resist film.

Using an ArF excimer laser stepper (by ASML, PAS5500/1100, NA=0.75 (2/3 zonal illumination), the resist film was exposed through a mask applied thereto, and immediately after the exposure, this was heated on a hot plate at 120° C. for 90 seconds (PEB). Further, this was developed with an aqueous 2.38 mas. % tetramethylammonium hydroxide solution at 23° C. for 60 seconds, rinsed with pure water for 30 seconds, and dried to obtain a resist pattern.

(Sensitivity)

The minimum energy required for reproducing an 80-nm line-and-space 1/1 mask pattern indicates the sensitivity of the sample tested.

(Line Edge Roughness)

The line edge roughness of the samples tested was determined with a length-measuring scanning electronic microscope (SEM). Concretely, in the 80-nm line-and-space 1/1 mask pattern of each sample, the machine-direction edges in an area of 5 μm were examined with a length-measuring SEM (S-8840, manufactured by Hitachi, Ltd.) to measure the distance from the standard line where each edge was to be present. This measurement was made on 50 points. A standard deviation was determined and 3σ was calculated. The smaller the value thereof, the better the performance.

(Profile)

The cross-sectional profile of the 80-nm line-and-space 1/1 mask pattern was analyzed with a scanning electronic microscope.

It is apparent from Table 4 that the positive photosensitive compositions of the invention have high sensitivity and are satisfactory in line edge roughness diminution and profile.

Immersion Exposure:

<Resist Preparation>

The ingredients of Examples 21 to 30 were dissolved in a solvent to prepare a solution having a solid concentration of 6% by mass. This solution was filtered through a 0.1-μm polyethylene filter to prepare a positive resist solution. Thus prepared, the positive resist solution was evaluated according to the method mentioned below.

<Resolution Evaluation>

An organic antireflection chemical ARC29A (from Nissan Chemical) was applied to a silicon wafer, and baked at 205° C. for 60 seconds to form thereon a 78-nm antireflection film. The positive resist composition was applied onto it, and baked at 115° C. for 60 seconds to form thereon a 150-nm resist film. Using pure water for immersion therein, the wafer was subjected to two-beam interference exposure (in wet) as shown in FIG. 1. Concretely, in the two-beam interference exposure (in wet), a laser 1, a diaphragm 2, a shutter 3, three reflective mirrors 4,5,6, and collector lens 7 were used, and the wafer 10 was exposed via a prism 8 and the immersion liquid 9 (pure water). The laser 1 has a wavelength of 193 nm, and the prism 8 forms a 65 nm, line-and-space pattern. Immediately after the exposure, the wafer was heated at 115° C. for 90 seconds, then developed with an aqueous tetramethylammonium hydroxide solution (2.38 mass %) for 60 seconds, rinsed with pure water, and spin-dried. Thus formed, the resist pattern was analyzed with a scanning electronic microscope (Hitachi's S-9260), and its resolution was on a level of 65-nm line-and-space resolution.

This confirms that the positive photosensitive compositions of the invention have good image forming ability even in immersion exposure.

According to the invention, a positive photosensitive composition having high sensitivity and satisfactory in line edge roughness diminution and profile can be provided.

The entire disclosure of each and every foreign patent application from which the benefit of foreign priority has been claimed in the present application is incorporated herein by reference, as if fully set forth.

What is claimed is:

1. A positive photosensitive composition using immersion exposure comprising:
   (A) 5 to 20 parts by weight of the total amount of at least one sulfonium salt compound that generates an acid upon irradiation with an actinic ray;
   (B) 100 parts by weight of the total amount of at least one fluorine atom-containing resin having a group that increases solubility of the resin in an alkaline developer by the action of an acid,
   wherein at least one basic compound is contained in an amount of 0.01 to 5% by weight in the positive photosensitive composition, based on the solid components of the positive photosensitive composition, and
   wherein the resin (B) has a repeating unit with no fluorine atom comprising a mixture of the following three repeating units (a), (b) and (c): (a) a monocyclic or polycyclic alicyclic hydrocarbon structure-having, acid-dissociating repeating unit; (b) a lactone structure-having repeating unit; and (c) a monocyclic or polycyclic alicyclic hydrocarbon structure and hydroxyl group-having repeating unit; and
   a fluorine-atom containing repeating unit having from 1 to 3 groups represented by formula (A-1):

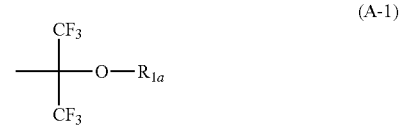

wherein $R_{1a}$ represents a hydrogen atom, an alkyl group, a cycloalkyl group, an acyl group or an alkoxycarbonyl group; and (C) a surfactant in an amount of 0.001 to 1% by weight based on the total amount of the positive photosensitive composition excluding solvent.

2. The positive photosensitive composition according to claim 1, wherein the resin (B) has a main chain to which at least one fluorine atom is bonded.

3. The positive photosensitive composition according to claim 1, wherein the compound (A) is a sulfonium salt of a fluorine-substituted aliphatic sulfonic acid having 4 to 8 carbon atoms.

4. The positive photosensitive composition according to claim 1, wherein the amount of the compound (A) per 100 parts by weight of the resin (B) is from 6 to 15 parts by weight.

5. The positive photosensitive composition according to claim 1, wherein the amount of the compound (A) per 100 parts by weight of the resin (B) is from 7 to 12 parts by weight.

6. The positive photosensitive composition according to claim 1, wherein the repeating unit with no fluorine atom of resin (B) comprises at least one repeating unit selected from the group consisting of repeating units (pA), (AI) and (AII):

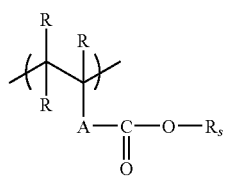
(pA)

wherein R represents a hydrogen atom, a halogen atom, or a linear or branched alkyl group having from 1 to 4 carbon atoms;

multiple Rs may be the same or different;

A represents a single bond, an alkylene group, an ether group, a thioether group, a carbonyl group, an ester group, an amido group, a sulfonamido group, a urethane group or a urea group, or a combination of two or more of them; $R_s$ represents a group of formulae (pI) to (pVI):

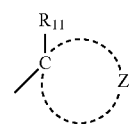
(pI)

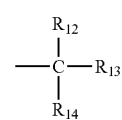
(pII)

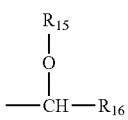
(pIII)

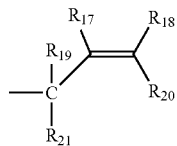
(pIV)

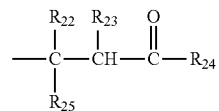
(pV)

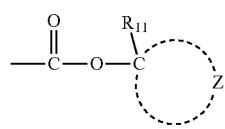
(pVI)

wherein $R_{11}$ represents a methyl group, an ethyl group, an n-propyl group, an isopropyl group, an n-butyl group, an isobutyl group, or a sec-butyl group; Z represents an atomic group necessary for forming a cycloalkyl group which may be substituted along with the carbon atom in the formula;

$R_{12}$ to $R_{16}$ each independently represents a linear or branched alkyl group having from 1 to 4 carbon atoms which may be substituted or a cycloalkyl group which may be substituted, provided that at least one of $R_{12}$ to $R_{14}$ or any of $R_{15}$ or $R_{16}$ is a cycloalkyl group which may be substituted;

$R_{17}$ to $R_{21}$ each independently represents a hydrogen atom, a linear or branched alkyl group having from 1 to 4 carbon atoms which may be substituted, or a cycloalkyl group which may be substituted, provided that at least one of $R_{17}$ to $R_{21}$ is a cycloalkyl group which may be substituted, and any of $R_{19}$ to $R_{21}$ is a linear or branched alkyl group having from 1 to 4 carbon atoms which may be substituted, or a cycloalkyl group which may be substituted;

$R_{22}$ to $R_{25}$ each independently represents a hydrogen atom, a linear or branched alkyl group having from 1 to 4 carbon atoms which may be substituted, or a cycloalkyl group which may be substituted, provided that at least one of $R_{22}$ to $R_{25}$ is a cycloalkyl group which may be substituted, and $R_{23}$ and $R_{24}$ may bond to each other to form a ring:

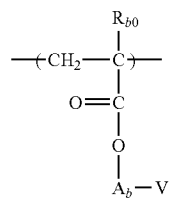
(AI)

wherein, $R_{b0}$ represents a hydrogen atom, a halogen atom, or an alkyl group having from 1 to 4 carbon atoms which may be substituted;

$A_b$, represents a single bond, or a divalent group of an ether group, an ester group, a carbonyl group, an alkylene group, or their combination;

V represents a group of formula ($L_c$) or formulae (V-1) to (V-5);

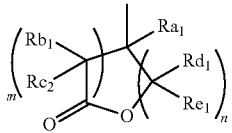
($L_c$)

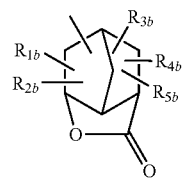
(V-1)

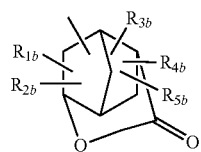
(V-2)

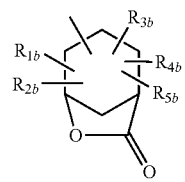
(V-3)

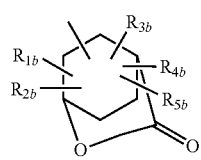
(V-4)

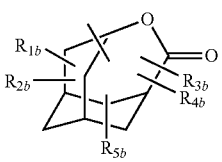
(V-5)

wherein, $R_{a1}$, $R_{b1}$, $R_{c1}$, $R_{d1}$ and $R_{e1}$ each independently represents a hydrogen atom or an alkyl group which may be substituted; m and n each independently represents an integer of from 0 to 3; and m+n is from 2 to 6;

$R_{1b}$ to $R_{5b}$ each independently represents a hydrogen atom, an alkyl group, a cycloalkyl group, an alkoxy group, an alkoxycarbonyl group, an alkylsulfonylimino group, or an alkenyl group, and two of $R_{1b}$ to $R_{5b}$ may bond to each other to form a ring, and the alkyl moiety of the alkoxy group, the alkoxycarbonyl group and the alkylsulfonylimino group for $R_{1b}$ to $R_{5b}$ may be substituted;

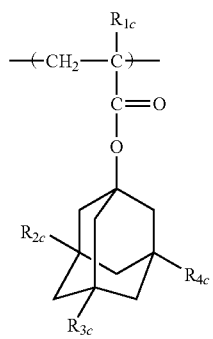
(AII)

wherein, $R_{1c}$ represents a hydrogen atom or a methyl group; $R_{2c}$ to $R_{4c}$ each independently represents a hydrogen atom or a hydroxyl group, provided that at least one of $R_{2c}$ to $R_{4c}$ is a hydroxyl group.

7. The positive photosensitive composition according to claim 1,
wherein said 5 to 20 parts by weight of the total amount of at least one sulfonium salt compound (A) comprises 5 to 20 parts by weight of a sulfonium salt compound represented by formula (ZI) or (ZI-3):

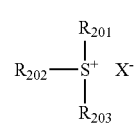
(ZI)

wherein $R_{201}$, $R_{202}$ and $R_{203}$ each independently represents an organic group, at least one of $R_{201}$, $R_{202}$ and $R_{203}$ represents an aryl group, and two of $R_{201}$ to $R_{203}$ may be bonded to each other to form a ring structure, which may contain an oxygen atom, a sulfur atom, an ester bond, an amide bond, or a carbonyl group therein; and X— represents a non-nucleophilic anion selected from the group consisting of an aliphatic sulfonic acid anion substituted with one or more fluorine atoms, an aromatic sulfonic acid anion substituted with one or more fluorine atoms or fluorinated groups, a bis(alkylsulfonyl)imide anion in which the alkyl groups are substituted with one or more fluorine atoms, and a tris(alkylsulfonyl)methyl anion in which the alkyl groups are substituted with one or more fluorine atoms;

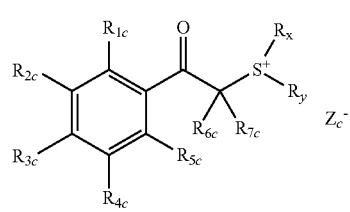
(ZI-3)

wherein $R_{1c}$ to $R_{5c}$ each independently represents a hydrogen atom, an alkyl group, a cycloalkyl group, an alkoxy group, or a halogen atom;
$R_{6c}$ and $R_{7c}$ each independently represents a hydrogen atom, an alkyl group, or a cycloalkyl group;

$R_x$ and $R_y$ each independently represents an alkyl group, a cycloalkyl group, an allyl, or a vinyl group;

two or more of $R_{1c}$ to $R_{5c}$ may be bonded to each other to form a ring structure, and $R_x$ and $R_y$ may be bonded to each other to form a ring structure; and $Zc^-$ has the same meaning as $X^-$ in formula (ZI).

8. The positive photosensitive composition according to claim 7, wherein X– represents a nonafluorobutanesulfonic acid anion.

9. The positive photosensitive composition according to claim 1, further comprising a mixed solvent of a solvent containing one or more hydroxyl groups in the structure and a solvent containing no hydroxyl group.

10. The positive photosensitive composition according to claim 1, wherein the repeating unit with no fluorine atom comprises (c) a monocyclic or polycyclic, alicyclic hydrocarbon structure and hydroxyl group-having repeating unit.

11. The positive photosensitive composition according to claim 1, further comprising a basic compound, wherein the basic compound is at least one compound selected from the group consisting of: (i) a compound having an imidazole structure, a diazabicyclo structure, an onium hydroxide structure, an onium carboxylate structure, a trialkylamine structure, an aniline structure or a pyridine structure; (ii) an alkylamine derivative having at least one of a hydroxyl group and an ether bond; and (iii) an aniline derivative having at least one of a hydroxyl group and an ether bond.

12. The positive photosensitive composition according to claim 1, wherein the fluorine atom-containing repeating unit constitutes from 10 to 30 mol % of the total polymer composition.

13. The positive photosensitive composition according to claim 1, wherein the repeating unit with no fluorine atom comprises a repeating unit represented by formula (pA):

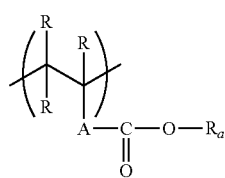

(pA)

wherein each R independently represents a hydrogen atom, a halogen atom, or a linear or branched alkyl group having from 1 to 4 carbon atoms;

A represents a single bond, an alkylene group, an ether group, a thioether group, a carbonyl group, an ester group, an amido group, a sulfonamido group, a urethane group, or a urea group, or a combination of two or more of them; and Ra represents a group represented by formulae (pII):

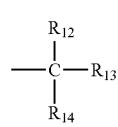

(pII)

wherein $R_{12}$ to $R_{14}$ each independently represents a linear or branched alkyl group having from 1 to 4 carbon atoms, or a cycloalkyl group, provided that at least one of $R_{12}$ to $R_{14}$ is a cycloalkyl group.

14. A positive photosensitive composition using immersion exposure comprising:

(A) 5 to 20 parts by weight of the total amount of at least one sulfonium salt compound that generates an acid upon irradiation with an actinic ray;

(B) 100 parts by weight of the total amount of at least one fluorine atom-containing resin having a group that increases solubility of the resin in an alkaline developer by the action of an acid, wherein at least one basic compound is contained in an amount of 0.01 to 5% by weight in the positive photosensitive composition, based on the solid components of the positive photosensitive composition, and wherein the resin (B) has a repeating unit with no fluorine atom selected from the group consisting of (a) a monocyclic or polycyclic alicyclic hydrocarbon structure-having, acid-dissociating repeating unit; (b) a lactone structure-having repeating unit; and (c) a monocyclic or polycyclic alicyclic hydrocarbon structure and hydroxyl group-having repeating unit; and a fluorine-atom containing repeating unit having from 1 to 3 groups represented by formula (A-1):

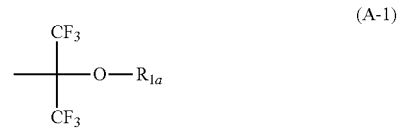

(A-1)

wherein $R_{1a}$ represents a hydrogen atom, an alkyl group, a cycloalkyl group, an acyl group or an alkoxycarbonyl group; and (C) a surfactant in an amount of 0.001 to 1% by weight based on the total amount of the positive photosensitive composition excluding solvent;

wherein the resin (B) includes repeating units (pA), (AI) and (AII):

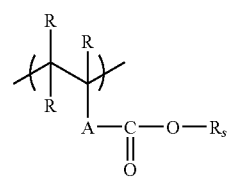

(pA)

wherein R represents a hydrogen atom, a halogen atom, or a linear or branched alkyl group having from 1 to 4 carbon atoms;

multiple Rs may be the same or different;

A represents a single bond, an alkylene group, an ether group, a thioether group, a carbonyl group, an ester group, an amido group, a sulfonamido group, an urethane group or a urea group, or a combination of two or more of them; Rs represents a group of formulae (pI) to (pVI):

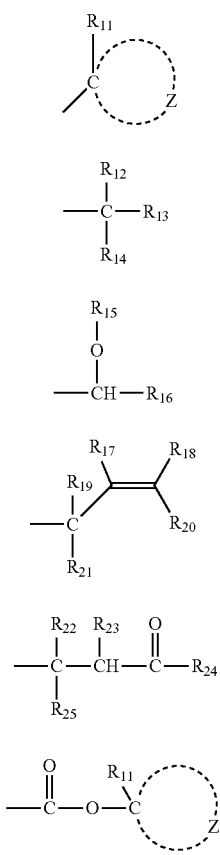

(pI)

(pII)

(pIII)

(pIV)

(pV)

(pVI)

wherein $R_{11}$ represents a methyl group, an ethyl group, an n-propyl group, an isopropyl group, an n-butyl group, an isobutyl group, or a sec-butyl group; Z represents an atomic group necessary for forming a cycloalkyl group which may be substituted along with the carbon atom in the formula;

$R_{12}$ to $R_{16}$ each independently represents a linear or branched alkyl group having from 1 to 4 carbon atoms which may be substituted or a cycloalkyl group which may be substituted, provided that at least one of $R_{12}$ to $R_{14}$ or any of $R_{15}$ or $R_{16}$ is a cycloalkyl group which may be substituted;

$R_{17}$ to $R_{21}$ each independently represents a hydrogen atom, a linear or branched alkyl group having from 1 to 4 carbon atoms which may be substituted, or a cycloalkyl group which may be substituted, provided that at least one of $R_{17}$ to $R_{21}$ is a cycloalkyl group which may be substituted, and any of $R_{19}$ to $R_{21}$ is a linear or branched alkyl group having from 1 to 4 carbon atoms which may be substituted, or a cycloalkyl group which may be substituted;

$R_{22}$ to $R_{25}$ each independently represents a hydrogen atom, a linear or branched alkyl group having from 1 to 4 carbon atoms which may be substituted, or a cycloalkyl group which may be substituted, provided that at least one of $R_{22}$ to $R_{25}$ is a cycloalkyl group which may be substituted, and $R_{23}$ and $R_{24}$ may bond to each other to form a ring:

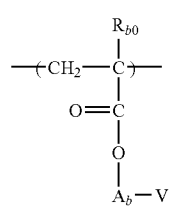

(AI)

wherein, $R_{b0}$ represents a hydrogen atom, a halogen atom, or an alkyl group having from 1 to 4 carbon atoms which may be substituted;

$A_b$ represents a single bond, or a divalent group of an ether group, an ester group, a carbonyl group, an alkylene group, or their combination;

V represents a group of formula $(L_c)$ or formulae (V-1) to (V-5);

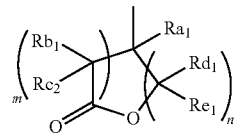

(Lc)

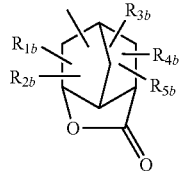

(V-1)

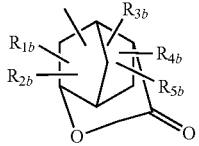

(V-2)

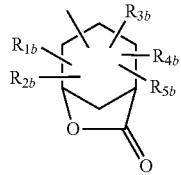

(V-3)

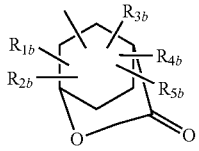

(V-4)

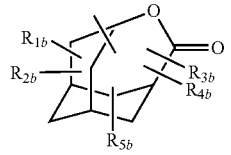

(V-5)

wherein, $R_{a1}$, $R_{b1}$, $R_{c1}$, $R_{d1}$ and $R_{e1}$ each independently represents a hydrogen atom or an alkyl group which may be substituted; m and n each independently represents an integer of from 0 to 3; and m+n is from 2 to 6;

$R_{1b}$ to $R_{5b}$ each independently represents a hydrogen atom, an alkyl group, a cycloalkyl group, an alkoxy group, an alkoxycarbonyl group, an alkylsulfonylimino group, or an alkenyl group, and two of $R_{1b}$ to $R_{5b}$ may bond to each other to form a ring, and the alkyl moiety of the alkoxy group, the alkoxycarbonyl group and the alkylsulfonylimino group for $R_{1b}$ to $R_{5b}$ may be substituted;

(AII)

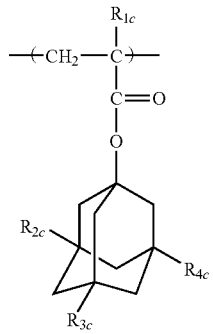

wherein, $R_{1c}$ represents a hydrogen atom or a methyl group; $R_{2c}$ to $R_{4c}$ each independently represents a hydrogen atom or a hydroxyl group, provided that at least one of $R_{2c}$ to $R_{4c}$ is a hydroxyl group.

15. The positive photosensitive composition according to claim 1, wherein said compound (A) is a compound represented by formula (Z1-3):

(Z1-3)

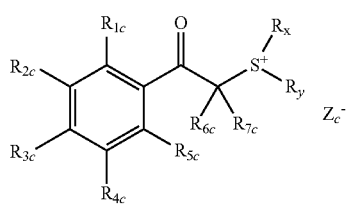

wherein $R_{1c}$ to $R_{5c}$ each independently represents a hydrogen atom, an alkyl group, a cycloalkyl group, an alkoxy group, or a halogen atom;

$R_{6c}$ and $R_{7c}$ each independently represents a hydrogen atom, an alkyl group, or a cycloalkyl group;

$R_x$ and $R_y$ each independently represents an alkyl group, a cycloalkyl group, an allyl, or a vinyl group;

two or more of $R_{1c}$ to $R_{5c}$ may be bonded to each other to form a ring structure, and Rx and Ry may be bonded to each other to form a ring structure; and $Zc^-$ represents a non-nucleophilic anion selected from the group consisting of an aliphatic sulfonic acid anion substituted with one or more fluorine atoms, an aromatic sulfonic acid anion substituted with one or more fluorine atoms or fluorinated groups, a bis(alkylsulfonyl)imide anion in which the alkyl groups are substituted with one or more fluorine atoms, and a tris(alkylsulfonyl)methyl anion in which the alkyl groups are substituted with one or more fluorine atoms.

16. The positive photosensitive composition according to claim 1, wherein the compound (A) is a sulfonium salt of an aliphatic sulfonic acid.

* * * * *